United States Patent
Yoshimura et al.

(10) Patent No.: US 9,601,695 B2
(45) Date of Patent: Mar. 21, 2017

(54) POLYMER COMPOUND

(75) Inventors: Ken Yoshimura, Tsukuba (JP); Kenichiro Ohya, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 809 days.

(21) Appl. No.: 13/640,168

(22) PCT Filed: Apr. 21, 2011

(86) PCT No.: PCT/JP2011/060336
§ 371 (c)(1),
(2), (4) Date: Oct. 9, 2012

(87) PCT Pub. No.: WO2011/136311
PCT Pub. Date: Nov. 3, 2011

(65) Prior Publication Data
US 2013/0026459 A1    Jan. 31, 2013

(30) Foreign Application Priority Data

Apr. 28, 2010 (JP) .................... 2010-104111
Oct. 29, 2010 (JP) .................... 2010-243450

(51) Int. Cl.
*H01L 51/54* (2006.01)
*C09K 11/06* (2006.01)
(Continued)

(52) U.S. Cl.
CPC ........ *H01L 51/0036* (2013.01); *C08G 61/122* (2013.01); *C08G 61/123* (2013.01); *C08G 61/126* (2013.01); *C08G 2261/124* (2013.01); *C08G 2261/1412* (2013.01); *C08G 2261/3243* (2013.01); *C08G 2261/3246* (2013.01); *C08G 2261/344* (2013.01); *C08G 2261/411* (2013.01); *C08G 2261/91* (2013.01); *H01L 51/0026* (2013.01); *H01L 51/0508* (2013.01);
(Continued)

(58) Field of Classification Search
CPC ...... C08G 61/00; C08G 61/12; C08G 61/121; C08G 61/122; C08G 61/123; C08G 61/126; C08G 61/128; C08G 2261/00; C08G 2261/10; C08G 2261/12; C08G 2261/124; C08G 2261/126; C08G 2261/141; C08G 2261/1412; C08G 2261/146; C08G 2261/32; C08G 2261/3243; C08G 2261/3246; C08G 2261/34; C08G 2261/344; C08G 2261/40; C08G 2261/41; C08G 2261/411; C08G 2261/412; C08G 2261/413; C08G 2261/91; C08G 2261/92; C08G 2261/95; Y02E 10/549; H01L 51/0026; H01L 51/0032; H01L 51/0034; H01L 51/0035; H01L 51/0036; H01L 51/0043; H01L 51/05; H01L 51/0508; H01L 51/0558; H01L 51/424; H01L 51/50; H01L 51/5012; H01L 51/5048; H01L 51/5052; H01L 51/5056; H01L 51/5072; H01L 51/5076
USPC ....... 428/690, 691, 917, 411.4, 336; 427/58, 427/66; 313/500–512; 257/40, 88–104, 257/E51.001–E51.052; 252/301.16–301.35; 528/7
See application file for complete search history.

(56) References Cited

U.S. PATENT DOCUMENTS

2008/0138651 A1    6/2008    Doi et al.
2010/0108993 A1    5/2010    Moriwaki et al.
(Continued)

FOREIGN PATENT DOCUMENTS

CN    101611070 A    12/2009
CN    102598341 A    7/2012
(Continued)

OTHER PUBLICATIONS

Liang et al. J. Am. Chem. Soc. 2009, 131, 7792-7799. Date of online publication: May 19, 2009.*
Yang et al. Marcomolecules 2005, 38, 244-253. Date of online publication: Dec. 21, 2004.*
Mak et al. Macromol. Rapid Commun. 2010, 31, 875-882. Date of on-line publication: Apr. 6, 2010.*
Xiao et al. ACS Applied Materials & Interfaces 2009, 1, 1613-1619. Date of web publication: Jun. 16, 2009.*
(Continued)

*Primary Examiner* — Andrew K Bohaty
(74) *Attorney, Agent, or Firm* — Sughrue Mion, PLLC

(57) ABSTRACT

A photoelectric conversion device that contains a polymer compound having a structural unit represented by formula (1) having high photoelectric conversion efficiency:

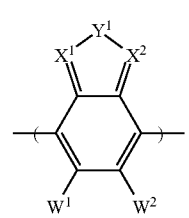

(1)

wherein, $X^1$ and $X^2$ are the same or different and represent a nitrogen atom or =CH—; $Y^1$ represents a sulfur atom, an oxygen atom, a selenium atom, —N($R^1$)— or —$CR^2$=$CR^3$—; $R^1$, $R^2$ and $R^3$ are the same or different and represent a hydrogen atom or a substituent; $W^1$ represents a cyano group, a monovalent organic group having a fluorine atom or a halogen atom; $W^2$ represents a cyano group, a monovalent organic group having a fluorine atom, a halogen atom or a hydrogen atom.

9 Claims, No Drawings

(51) Int. Cl.
*H01L 51/00* (2006.01)
*C08G 61/12* (2006.01)
*H01L 51/05* (2006.01)
*H01L 51/42* (2006.01)
*H01L 51/50* (2006.01)

(52) U.S. Cl.
CPC ........ *H01L 51/0558* (2013.01); *H01L 51/424* (2013.01); *H01L 51/5012* (2013.01); *Y02E 10/549* (2013.01)

(56) References Cited

U.S. PATENT DOCUMENTS

| | | |
|---|---|---|
| 2011/0023964 A1 | 2/2011 | Kitazawa et al. |
| 2012/0205644 A1 | 8/2012 | Yoshimura et al. |

FOREIGN PATENT DOCUMENTS

| | | |
|---|---|---|
| EP | 2 110 400 A1 | 10/2009 |
| JP | 2009-158921 A | 7/2009 |
| WO | 2007/011739 A2 | 1/2007 |
| WO | 2008/016085 A1 | 7/2008 |
| WO | 2008/093822 A1 | 8/2008 |
| WO | 2009/125647 A1 | 10/2009 |
| WO | 2009/151144 A1 | 12/2009 |
| WO | 2010/026972 A1 | 11/2010 |
| WO | 2011/052711 A1 | 5/2011 |
| WO | 2011/060526 A1 | 5/2011 |

OTHER PUBLICATIONS

Usta et al. J. Am. Chem. Soc. 2006, 128, 9034-9035. Date of on-line publication: Jun. 23, 2006.*
Office Action dated Mar. 21, 2014 issued in counterpart Chinese Patent Application No. 201180021244.2.
Second Office Action issued Jul. 17, 2014 in counterpart Chinese Patent Application No. 201180021244.2 with English translation.
Samuel C. Price et al., "Fluorine Substituted Conjugated Polymer of Medium Band Gap Yields 7% Efficiency in Polymer-Fullerene Solar Cells", Journal of the American Chemistry Society, 2011, pp. 4625-4631.
Huaxing Zhou et al., "Development of Fluorinated Benzothiadiazole as a Structural Unit for a Polymer Solar Cell of 7% Efficiency", Angew. Chem. Int. Ed., 2011, pp. 2995-2998, vol. 50.
Zhao Li et al., "Synthesis and applications of difluorobenzothiadiazole based conjugated polymers for organic photovoltaics", J. Mater. Chem., 2011, pp. 3226-3233, vol. 21.
Notification of Reason for Refusal issued Sep. 2, 2014 in counterpart Japanese Patent Application No. 2011-094772 with English translation.
Jong-Beom Baek & L.-C. Chien, Synthesis and Photoluminescence of Linear and Hyperbranched Polyethers Containing Phenylquinoxaline Units and Flexible Aliphatic Spacers, Journal of Polymer Science, Part A Polymer Chemistry, 2004, vol. 42, No. 14, pp. 3587-3603.
Third Office Action issued Oct. 24, 2014 in corresponding Chinese Patent Application No. 201180021244.2 with English translation.

* cited by examiner

POLYMER COMPOUND

CROSS REFERENCE TO RELATED APPLICATIONS

This application is a National Stage of International Application No. PCT/JP2011/060336 filed Apr. 21, 2011, claiming priority based on Japanese Patent Application Nos. 2010-104111 filed Apr. 28, 2010 and 2010-243450 filed Oct. 29, 2010, the contents of all of which are incorporated herein by reference in their entirety.

TECHNICAL FIELD

The present invention relates to a polymer compound having a specific structure.

BACKGROUND ART

In recent years, for the purpose of preventing global warming, it is demanded to reduce $CO_2$ released into the atmosphere. For example, switching into a solar system that uses a pn junction type silicon solar cell on the roof of house is proposed, however, the monocrystalline, polycrystalline and amorphous silicon used in the silicon solar cell faces the problem that high temperature and high vacuum condition is required in the manufacturing process thereof.

On the other hand, an organic thin film solar cell which is one aspect of a photoelectric conversion device can omit the high temperature and high vacuum process used in the manufacturing process of a silicon solar cell, and can be produced with a low cost only by a coating process, and hence recently attracts attention. As a polymer compound used in the organic thin film solar cell, a polymer compound containing repeating unit (A) and repeating unit (B):

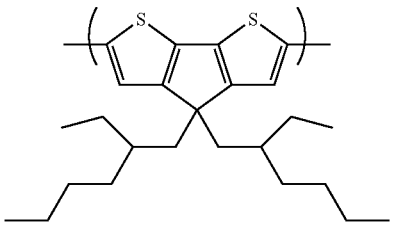

Repeating unit (A)

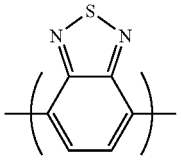

Repeating unit (B)

is described in WO 2007/011739.

However, in a photoelectric conversion device having an organic layer containing the aforementioned polymer compound, the photoelectric conversion efficiency is not necessarily sufficient.

SUMMARY OF THE INVENTION

It is an object of the present invention to provide a polymer compound realizing high photoelectric conversion efficiency of a photoelectric conversion device when it is used in an organic layer contained in the photoelectric conversion device.

That is, a first aspect of the present invention provides a polymer compound having a structural unit represented by formula (1):

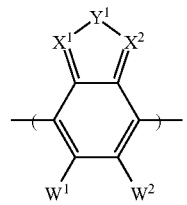

(1)

[wherein, $X^1$ and $X^2$ are the same or different and represent a nitrogen atom or =CH—. $Y^1$ represents a sulfur atom, an oxygen atom, a selenium atom, —N($R^1$)— or —$CR^2$=$CR^3$—. $R^1$, $R^2$ and $R^3$ are the same or different and represent a hydrogen atom or a substituent. $W^1$ represents a cyano group, a monovalent organic group having a fluorine atom or a halogen atom. $W^2$ represents a cyano group, a monovalent organic group having a fluorine atom, a halogen atom or a hydrogen atom.]

A second aspect of the present invention provides a compound represented by formula (3a):

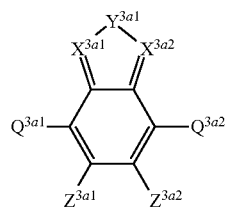

(3a)

[wherein, $X^{3a1}$ and $X^{3a2}$ are the same or different and represent a nitrogen atom or =CH—. $Y^{3a1}$ represents a sulfur atom. $Z^{3a1}$ and $Z^{3a2}$ are the same or different and represent a monovalent organic group having a fluorine atom or a fluorine atom. $Q^{3a1}$ and $Q^{3a2}$ are the same or different and represent a hydrogen atom, a dihydroxyboryl group [—B(OH)$_2$] or a monovalent organic group.]

A third aspect of the present invention provides a compound represented by formula (3b):

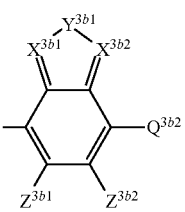

(3b)

[wherein, $X^{3b1}$ and $X^{3b2}$ are the same or different and represent a nitrogen atom or =CH—. $Y^{3b1}$ represents an oxygen atom, a selenium atom, —N($R^1$)— or —$CR^2$=$CR^3$—. $R^1$, $R^2$ and $R^3$ are the same or different and represent a hydrogen atom or a substituent. $Z^{3b1}$ and $Z^{3b2}$ are the same or different and represent a monovalent organic group having a fluorine atom or a fluorine atom. $Q^{3b1}$ represents a chlorine atom, a bromine atom, an iodine atom, a dihydroxyboryl group [—B(OH)$_2$] or a monovalent organic group. $Q^{3b1}$ represents a halogen atom, a dihydroxyboryl group [—B(OH)$_2$] or a monovalent organic group.].

A fourth aspect of the present invention provides a photoelectric conversion device having a first electrode and a second electrode, and an active layer between the first electrode and the second electrode, and containing the polymer compound or the compound in the active layer.

A fifth aspect of the present invention provides an organic thin film transistor having a gate electrode, a source electrode, a drain electrode, and an active layer, and containing the polymer compound or the compound in the active layer.

A sixth aspect of the present invention provides an organic electroluminescence device having a first electrode and a second electrode and a light emitting layer between the first electrode and the second electrode, and containing the polymer compound or the compound in the light emitting layer.

MODE FOR CARRYING OUT THE INVENTION

The present invention will be described in detail below.

The polymer compound of the present invention is featured by having a structural unit represented by the aforementioned formula (1).

As a substituent represented by $R^1$, $R^2$ and $R^3$, a halogen atom, an alkyl group, an optionally substituted alkoxy group, an optionally substituted alkylthio group, an optionally substituted aryl group, an optionally substituted aryloxy group, an optionally substituted arylthio group, an optionally substituted arylalkyl group, an optionally substituted arylalkoxy group, an optionally substituted arylalkylthio group, an acyl group, an acyloxy group, an amido group, an imido group, an amino group, a substituted amino group, a substituted silyl group, a substituted silyloxy group, a substituted silylthio group, a substituted silylamino group, a heterocyclic group, a heterocyclyloxy group, a heterocyclylthio group, an arylalkenyl group, an arylalkynyl group, a carboxyl group or a cyano group is recited.

Wherein, an alkyl group may be linear, branched or cyclic. The number of carbons in an alkyl group is typically 1 to 30. Specific examples of alkyl group include cyclic alkyl groups such as a methyl group, an ethyl group, a propyl group, an isopropyl group, a butyl group, an isobutyl group, a sec-butyl group, a tert-butyl group, a pentyl group, an isopentyl group, a 2-methylbutyl group, a 1-methylbutyl group, a hexyl group, an isohexyl group, a 3-methylpentyl group, a 2-methylpentyl group, a 1-methylpentyl group, a heptyl group, an octyl group, an isooctyl group, a 2-ethylhexyl group, a 3,7-dimethyloctyl group, a nonyl group, a decyl group, an undecyl group, a dodecyl group, a tetradecyl group, a hexadecyl group, an octadecyl group and an eicosyl group, and cyclic alkyl groups such as a cyclopentyl group, a cyclohexyl group, and an adamantyl group.

An alkyl moiety of an alkoxy group may be linear, branched or cyclic. An alkoxy group may have a substituent(s). The number of carbons in an alkoxy group is typically 1 to 20, and as a substituent, a halogen atom and an alkoxy group (for example, having 1 to 20 carbon atoms) are recited. Specific examples of alkoxy group which may have a substituent(s) include a methoxy group, an ethoxy group, a propoxy group, an isopropoxy group, a butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyloxy group, a perfluorooctyloxy group, a methoxymethoxy group and a 2-methoxyethoxy group.

An alkyl moiety of an alkylthio group may be linear, branched or cyclic. An alkylthio group may have a substituent(s). The number of carbons in an alkylthio group is typically 1 to 20, and as a substituent, a halogen atom is recited. Specific examples of alkylthio group which may have a substituent(s) include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group and a trifluoromethylthio group.

An aryl group means a group that one hydrogen atom on an aromatic ring is removed from aromatic hydrocarbon, and the number of carbons therein is typically 6 to 60. An aryl group may have a substituent(s), and as a substituent, a halogen atom and an alkoxy group (for example, having 1 to 20 carbon atoms) are recited. Specific examples of aryl group which may have a substituent include a phenyl group, a C1 to C12 alkoxyphenyl group, a C1 to C12 alkylphenyl group, a 1-naphthyl group, a 2-naphthyl group and a pentafluorophenyl group. A preferred aspect of C1 to C12 alkoxyphenyl group is a C1 to C8 alkoxyphenyl group, and a more preferred aspect is a C1 to C6 alkoxyphenyl group. Specific examples of C1 to C8 alkoxy and C1 to C6 alkoxy include C1 to C8 and C1 to C6 alkoxy in alkoxy exemplified for the aforementioned alkoxy group.

The number of carbons in an aryloxy group is typically 6 to 60, and an aryl moiety may have a substituent(s). As a substituent, a halogen atom and an alkoxy group (for example, having 1 to 20 carbon atoms) are recited. Specific examples of aryloxy group which may have a substituent (s) include a phenoxy group, a C1 to C12 alkoxyphenoxy group, a C1 to C12 alkylphenoxy group, a 1-naphthyloxy group, a 2-naphthyloxy group and a pentafluorophenoxy group.

The number of carbons in an arylthio group is typically 6 to 60, and an aryl moiety may have a substituent(s). Specific examples of arylthio group which may have a substituent(s) include a phenylthio group, a C1 to C12 alkoxyphenylthio group, a C1 to C12 alkylphenylthio group, a 1-naphthylthio group, a 2-naphthylthio group and a pentafluorophenylthio group.

The number of carbons in an arylalkyl group is typically 7 to 60, and an aryl moiety may have a substituent(s). As a substituent, a halogen atom and an alkoxy group (for example, having 1 to 20 carbon atoms) are recited. Specific examples of arylalkyl group which may have a substituent(s) include a phenyl-C1 to C12 alkyl group, a C1 to C12 alkoxyphenyl-C1 to C12 alkyl group, a C1 to C12 alkylphenyl-C1 to C12 alkyl group, a 1-naphthyl-C1 to C12 alkyl group and a 2-naphthyl-C1 to C12 alkyl group.

The number of carbons in an arylalkoxy group is typically 7 to 60, and an aryl moiety may have a substituent(s). As a substituent, a halogen atom and an alkoxy group (for example, having 1 to 20 carbon atoms) are recited. Specific examples of arylalkoxy group which may have a substituent(s) include a phenyl-C1 to C12 alkoxy group, a C1 to C12 alkoxyphenyl-C1 to C12 alkoxy group, a C1 to C12 alkylphenyl-C1 to C12 alkoxy group, a 1-naphthyl-C1 to C12 alkoxy group and a 2-naphthyl-C1 to C12 alkoxy group.

The number of carbons in an arylalkylthio group is typically 7 to 60, and an aryl moiety may have a substituent (s). As a substituent, a halogen atom and an alkoxy group (for example, having 1 to 20 carbon atoms) are recited. Specific examples of arylalkylthio group which may have a substituent (s) include a phenyl-C1 to C12 alkylthio group, a C1 to C12 alkoxyphenyl-C1 to C12 alkylthio group, a C1 to C12 alkylphenyl-C1 to C12 alkylthio group, a 1-naphthyl-C1 to C12 alkylthio group and a 2-naphthyl-C1 to C12 alkylthio group.

An acyl group means a group that a hydroxyl group in carboxylic acid (—COOH) is removed, and the number of carbons therein is typically 2 to 20. Specific examples of acyl group include alkylcarbonyl groups having 2 to 20 carbon atoms which may be substituted by halogen such as an acetyl group, a propionyl group, a butyryl group, an isobutyryl group, a pivaloyl group and a trifluoroacetyl group, and phenylcarbonyl groups having 2 to 20 carbon atoms which may be substituted by halogen such as a benzoyl group and a pentafluorobenzoyl group.

An acyloxy group is a group that a hydrogen atom in carboxylic acid (—COOH) is removed, and the number of carbons therein is typically 2 to 20. Specific examples of acyloxy group include an acetoxy group, a propionyloxy group, a butyryloxy group, an isobutyryloxy group, a pivaloyloxy group, a benzoyloxy group, a trifluoroacetyloxy group and a pentafluorobenzoyloxy group.

An amido group means a group that one hydrogen atom bound to a nitrogen atom is removed from amide, and the number of carbons therein is typically 2 to 20. Specific examples of amide group include a formamido group, an acetamido group, a propionamido group, a butyramido group, a benzamido group, trifluoroacetamido group, a pentafluorobenzamido group, a diformamido group, a diacetamido group, a dipropionamido group, a dibutyramido group, a dibenzamido group, a ditrifluoroacetamido group and a dipentafluorobenzamido group.

An imido group means a group that one hydrogen atom bound to a nitrogen atom is removed from imide (—CO—NH—CO—), and specific examples include a succinimido group and a phthalimido group.

A substituted amino group is a group that 1 or 2 hydrogen atom(s) in an amino group is/are substituted, and a substituent is, for example, an alkyl group and an optionally substituted aryl group. Specific examples of alkyl group and optionally substituted aryl group are as same as the specific examples of alkyl group represented by $R^1$ and optionally substituted aryl group. The number of carbons in a substituted amino group is typically 1 to 40. Specific examples of substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a C1 to C12 alkoxyloxyphenylamino group, a di(C1 to C12 alkyloxyphenyl)amino group, a di(C1 to C12 alkylphenyl)amino group, a 1-naphthylamino group, a 2-naphthylamino group, a pentafluorophenylamino group, a pyridylamino group, a pyridazinylamino group, a pyrimidinylamino group, a pyrazylamino group, a triazylamino group, a phenyl-C1 to C12 alkylamino group, a C1 to C12 alkyloxyphenyl-C1 to C12 alkylamino group, a C1 to C12 alkylphenyl-C1 to C12 alkylamino group, a di(C1 to C12 alkyloxyphenyl-C1 to C12 alkylamino group, a di(C1 to C12 alkylphenyl-C1 to C12 alkyl)amino group, a 1-naphthyl-C1 to C12 alkylamino group and a 2-naphthyl-C1 to C12 alkylamino group.

A substituted silyl group is a group that 1, 2 or 3 hydrogen atom(s) in a silyl group is/are substituted, and generally a group that all 3 hydrogen atoms in a silyl group are substituted, and a substituent is, for example, an alkyl group and an optionally substituted aryl group. Specific examples of alkyl group and optionally substituted aryl group are as same as the specific examples of alkyl group represented by $R^1$ and optionally substituted aryl group. Specific examples of substituted silyl group include a trimethylsilyl group, a triethylsilyl group, a tripropylsilyl group, a triisopropylsilyl group, a tert-butyldimethylsilyl group, a triphenylsilyl group, a tri-p-xylylsilyl group, a tribenzylsilyl group, a diphenylmethylsilyl group, a tert-butyldiphenylsilyl group and a dimethylphenylsilyl group.

A substituted silyloxy group is a group that an oxygen atom is bound to the aforementioned substituted silyl group. Specific examples of substituted silyloxy group include a trimethylsilyloxy group, a triethylsilyloxy group, a tripropylsilyloxy group, a triisopropylsilyloxy group, a tert-butyldimethylsilyloxy group, a triphenylsilyloxy group, a tri-p-xylylsilyloxy group, a tribenzylsilyloxy group, a diphenylmethylsilyloxy group, a tert-butyldiphenylsilyloxy group and a dimethylphenylsilyloxy group.

A substituted silylthio group is a group that a sulfur atom is bound to the aforementioned substituted silyl group. Specific examples of substituted silylthio group include a trimethylsilylthio group, a triethylsilylthio group, a tripropylsilylthio group, a triisopropylsilylthio group, a tert-butyldimethylsilylthio group, a triphenylsilylthio group, a tri-p-xylylsilylthio group, a tribenzylsilylthio group, a diphenylmethylsilylthio group, a tert-butyldiphenylsilylthio group and a dimethylphenylsilylthio group.

A substituted silylamino group is a group that 1 or 2 hydrogen atom(s) in an amino group is/are substituted by a substituted silyl group, and the substituted silyl group is as mentioned above. Specific examples of substituted silylamino group include a trimethylsilylamino group, a triethylsilylamino group, a tripropylsilylamino group, a triisopropylsilylamino group, a tert-butyldimethylsilylamino group, a triphenylsilylamino group, a tri-p-xylylsilylamino group, a tribenzylsilylamino group, a diphenylmethylsilylamino group, a tert-butyldiphenylsilylamino group, a dimethylphenylsilylamino group, a bis(trimethylsilyl)amino group, a bis(triethylsilyl)amino group, a bis(tripropylsilyl)amino group, a bis(triisopropylsilyl)amino group, a bis(tert-butyldimethylsilyl)amino group, a bis(triphenylsilyl)amino group, a bis(tri-p-xylylsilyl)amino group, a bis(tribenzylsilyl)amino group, a bis(diphenylmethylsilyl)amino group, a bis(tert-butyldiphenylsilyl)amino group and a bis(dimethylphenylsilyl)amino group.

As a heterocyclic group, a group that one hydrogen atom is removed from a heterocyclic compound such as furan, thiofuran, thiophene, pyrrole, pyrroline, pyrrolidine, oxazole, isooxazole, triazole, isothiazole, imidazole, imidazoline, imidazolidine, pyrazole, pyrazoline, pyrazolidine, furazan, triazole, thiadiazole, oxadiazole, tetrazole, pyran, pyridine, piperidine, thiopyran, pyridazine, pyrimidine, pyrazine, piperazine, morpholine, triadine, benzofuran, isobenzofuran, benzothiophene, indole, isoindole, indolidine, indoline, isoindoline, chromene, chromane, isochromane, benzopyran, quinoline, isoquinoline, quinolidine, benzoimidazole, benzothiazole, indazole, naphthyridine, quinoxaline, quinazoline, quinazolidine, cinnoline, phthalazine, purine, pteridine, carbazole, xanthene, phenanthridine, acridine, β-carboline, perimidine, phenanthrine, thianthrene, phenoxathin, phenoxadine, phenothiadine, or phenadine which may have a substituent(s) is recited. An aromatic heterocyclic group is preferred.

A heterocyclyloxy group is a group that an oxygen atom is bound to the aforementioned heterocyclic group, and a group represented by formula (11) is recited. A heterocyclylthio group is a group that a sulfur atom is bound to the aforementioned heterocyclic group, and a group represented by formula (12) is recited.

                    (11)

                    (12)

[In formula (11) and formula (12), $Ar^7$ represents a heterocyclic group.]

A heterocyclyloxy group typically has 4 to 60 carbon atoms. Specific examples of heterocyclyloxy group include a thienyloxy group, a C1 to C12 alkylthienyloxy group, a pyrrolyloxy group, a furyloxy group, a pyridyloxy group, a C1 to C12 alkylpyridyloxy group, an imidazolyloxy group, a pyrazolyloxy group, a triazolyloxy group, an oxazolyloxy group, a thiazoleoxy group and a thiadiazoleoxy group.

A heterocyclylthio group typically has 4 to 60 carbon atoms. Specific examples of heterocyclylthio group include a thienylmercapto group, a C1 to C12 alkylthienylmercapto group, a pyrrolylmercapto group, a furylmercapto group, a pyridylmercapto group, a C1 to C12 alkylpyridylmercapto group, an imidazolylmercapto group, a pyrazolylmercapto group, a triazolylmercapto group, an oxazolylmercapto group, a thiazolemercapto group and a thiadiazolemercapto group.

An arylalkenyl group typically has 8 to 20 carbon atoms, and as a specific example of arylalkenyl group, a styryl group is recited.

An arylalkynyl group typically has 8 to 20 carbon atoms, and as a specific example of arylalkynyl group, a phenylacetylenyl group is recited.

As a halogen atom, a fluorine atom, a chlorine atom, a bromine atom and an iodine atom are recited.

As $Y^1$, a sulfur atom, an oxygen atom and a selenium atom are preferred, and a sulfur atom and an oxygen atom are more preferred, and a sulfur atom is particularly preferred.

$W^1$ represents a cyano group, a monovalent organic group having a fluorine atom or a halogen atom. As a halogen atom, a fluorine atom, a chlorine atom, a bromine atom and an iodine atom are recited.

As a monovalent organic group having a fluorine atom, a fluoroalkyl group, a fluoroalkoxy group, a fluoroalkylthio group, a fluoroaryl group, a fluoroaryloxy group, a fluoroarylthio group and so on are recited.

A fluoroalkyl group is generally a group that one or more hydrogen atom(s) in an alkyl group having 1 to 30 carbon atoms is (are) substituted by a fluorine atom, and specific examples of alkyl group are as same as the specific examples of alkyl group represented by $R^1$. Specific examples of fluoroalkyl group include a fluoromethyl group, a difluoromethyl group, a trifluoromethyl group, a difluoroethyl group, a pentafluoromethyl group, a heptafluoropropyl group, a nonafluorobutyl group and a tridecafluorohexyl group.

A fluoroalkoxy group is generally a group that one or more hydrogen atom(s) in an alkoxyl group having 1 to 20 carbon atoms is (are) substituted by a fluorine atom, and specific examples of alkoxy group are as same as the specific examples of alkoxy group represented by $R^1$. Specific examples of fluoroalkoxy group include a fluoromethoxy group, a difluoromethoxy group, a trifluoromethoxy group, a difluoroethoxy group, a pentafluoromethoxy group, a heptafluoropropoxy group, a nonafluorobutoxy group and a tridecafluorohexyloxy group.

A fluoroalkylthio group is generally a group that one or more hydrogen atom(s) in an alkylthio group having 1 to 20 carbon atoms is(are) substituted by a fluorine atom, and specific examples of alkylthio group are as same as the specific examples of alkylthio group represented by $R^1$. Specific examples of fluoroalkylthio group include a fluoromethylthio group, a difluoromethylthio group, a trifluoromethylthio group, a difluoroethylthio group, a pentafluoromethylthio group, a heptafluoropropylthio group, a nonafluorobutylthio group and a tridecafluorohexylthio group.

A fluoroaryl group is generally a group that one or more hydrogen atom(s) in a phenyl group or a naphthyl group is(are) substituted by a fluorine atom, and specific examples of fluoroaryl group include a fluorophenyl group, a difluorophenyl group, a trifluorophenyl group, a pentafluorophenyl group, a fluorobiphenyl group, a nonafluorobiphenyl group, a fluoronaphthyl group and a heptafluoronaphthyl group.

A fluoroaryloxy group is a group that an oxygen atom is bound to the aforementioned fluoroaryl group. Specific examples of fluoroaryloxy group include a fluorophenoxy group, a difluorophenoxy group, a trifluorophenoxy group, a pentafluorophenoxy group, a fluorobiphenyloxy group, a nonafluorobiphenyloxy group, a fluoronaphthyloxy group, and a heptafluoronaphthyloxy group.

A fluoroarylthio group is a group that a sulfur atom is bound to the aforementioned fluoroaryl group. Specific examples of fluoroarylthio group include a fluorophenylthio group, a difluorophenylthio group, a trifluorophenylthio group, a pentafluorophenylthio group, a fluorobiphenylthio group, a nonafluorobiphenylthio group, a fluoronaphthylthio group and a heptafluoronaphthylthio group.

$W^1$ is preferably a halogen atom, more preferably a fluorine atom or a chlorine atom, and particularly preferably a fluorine atom.

$W^2$ represents a cyano group, a monovalent organic group having a fluorine atom, a halogen atom or a hydrogen atom. Definition and specific examples of a monovalent organic group having a fluorine atom are as same as those of monovalent organic group having a fluorine atom represented by $W^1$.

$W^2$ is preferably a halogen atom, more preferably a fluorine atom or a chlorine atom, and particularly preferably a fluorine atom.

$X^1$ and $X^2$ are the same or different and represent a nitrogen atom or =CH—. Preferably, at least one of $X^1$ and $X^2$ is a nitrogen atom, and more preferably, $X^1$ and $X^2$ represent a nitrogen atom.

As a structural unit represented by formula (1), structural units represented by formula (1001) to formula (1240) are recited.

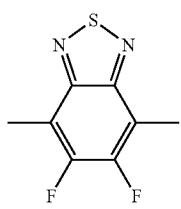 (1001)
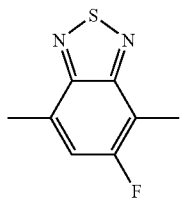 (1002)
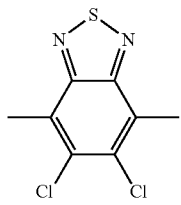 (1003)
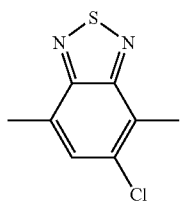 (1004)
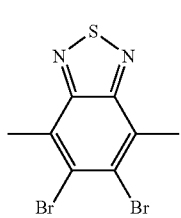 (1005)
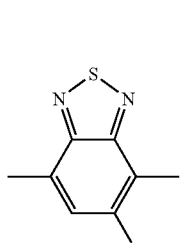 (1006)
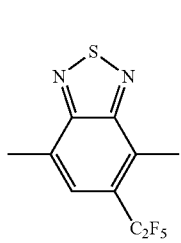 (1007)
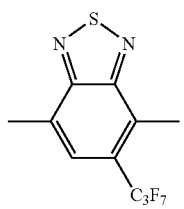 (1008)
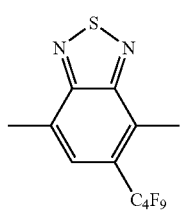 (1009)
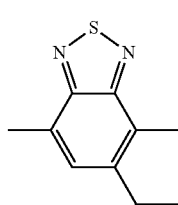 (1010)
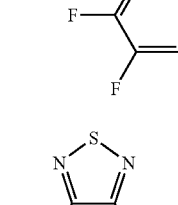 (1011)
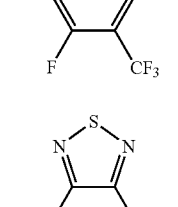 (1012)
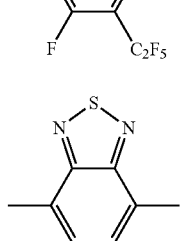 (1013)
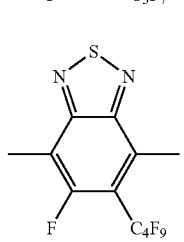 (1014)

(1015) 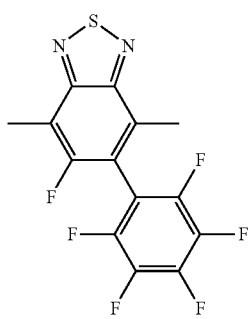
(1016) 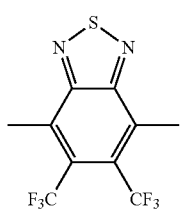
(1017) 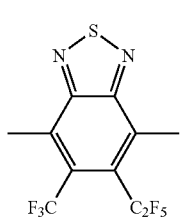
(1018) 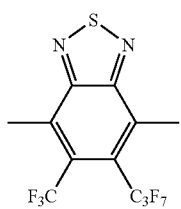
(1019) 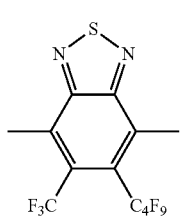
(1020) 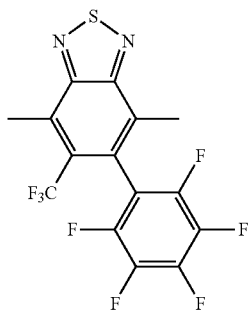
(1021) 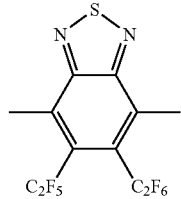
(1022) 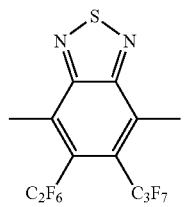
(1023) 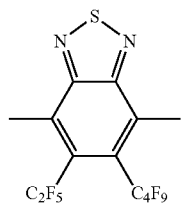
(1024) 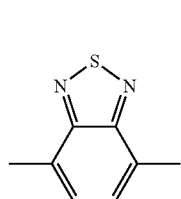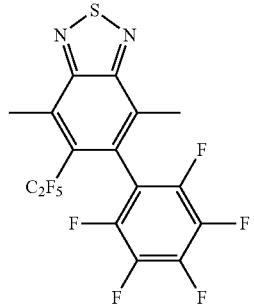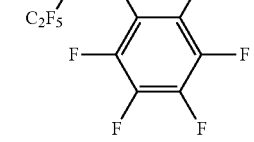
(1025) 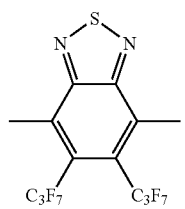
(1026) 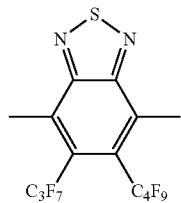

(1027) 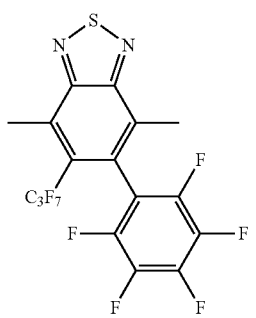
(1028) 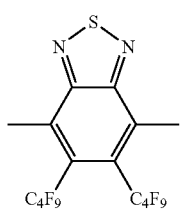
(1029) 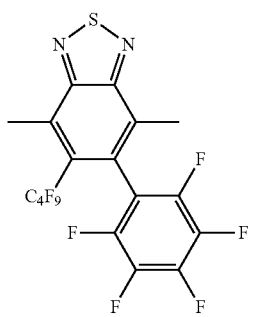
(1030) 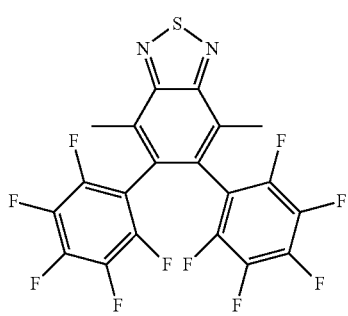
(1031) 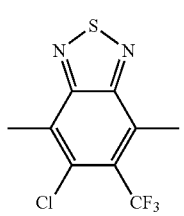
(1032) 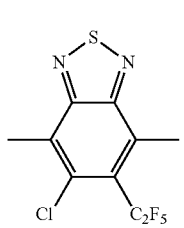
(1033) 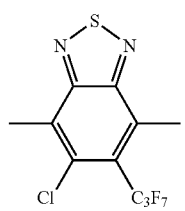
(1034) 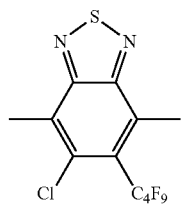
(1035) 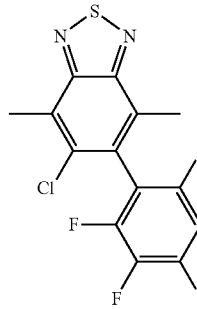
(1036) 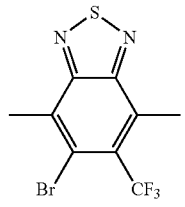
(1037) 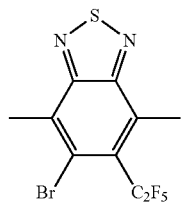
(1038) 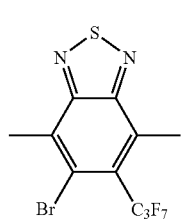
(1039) 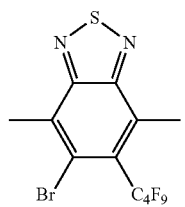

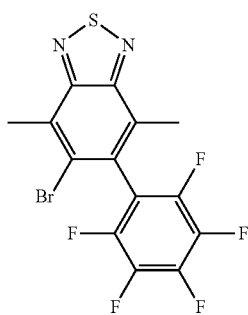
(1040)
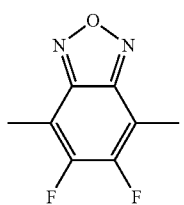
(1041)
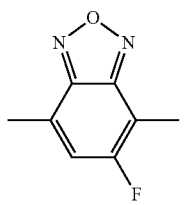
(1042)
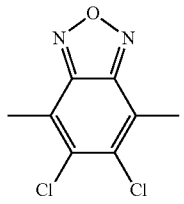
(1043)
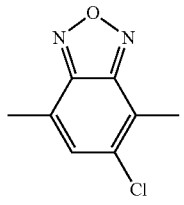
(1044)
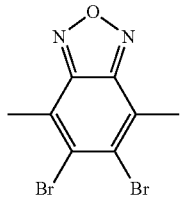
(1045)
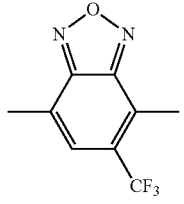
(1046)
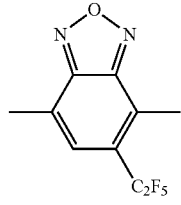
(1047)
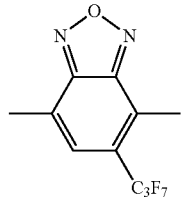
(1048)
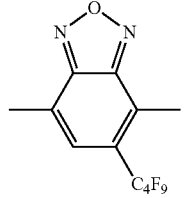
(1049)
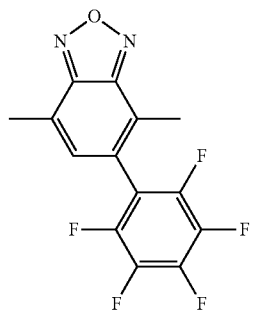
(1050)
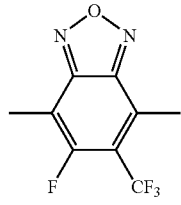
(1051)
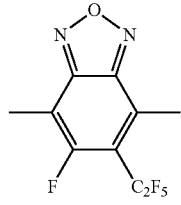
(1052)
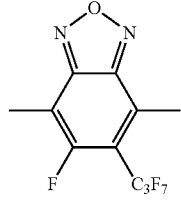
(1053)

(1054) 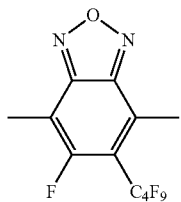
(1055) 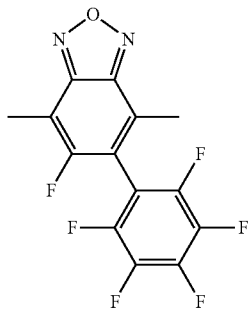
(1056) 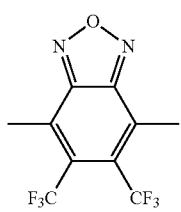
(1057) 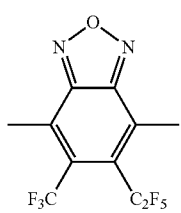
(1058) 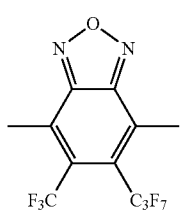
(1059) 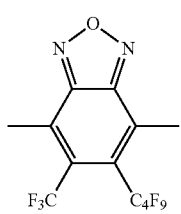
(1060) 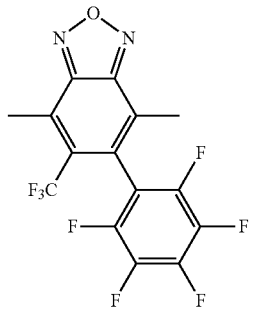
(1061) 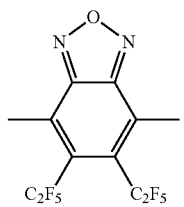
(1062) 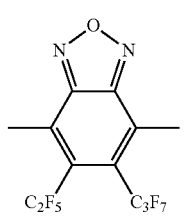
(1063) 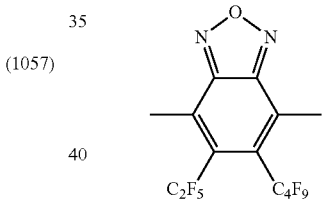
(1064) 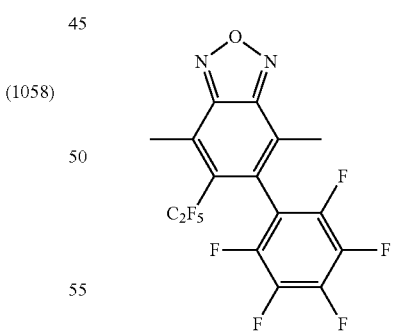
(1065) 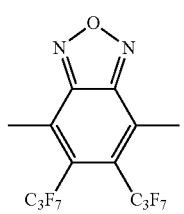

(1066) 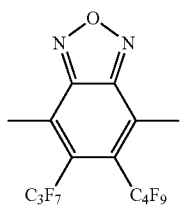
(1067) 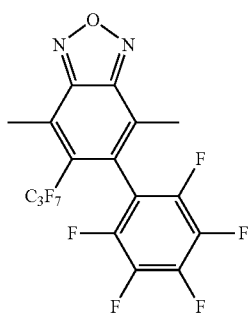
(1068) 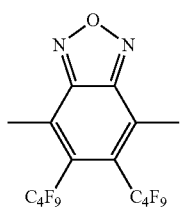
(1069) 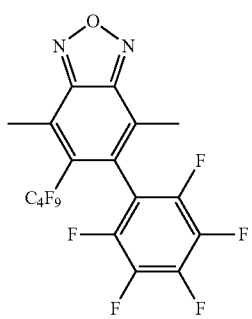
(1070) 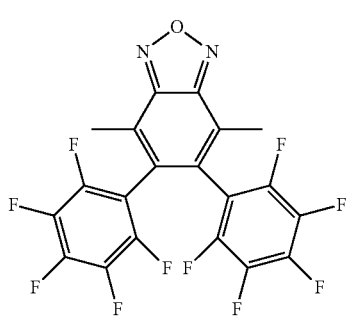
(1071) 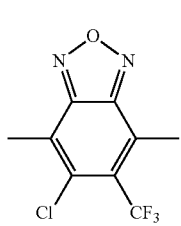
(1072) 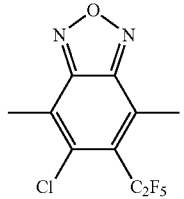
(1073) 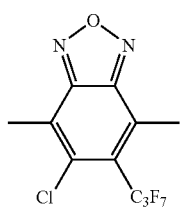
(1074) 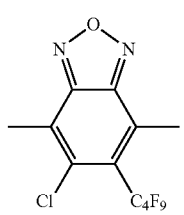
(1075) 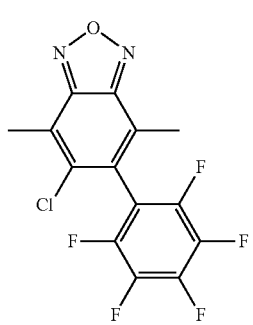
(1076) 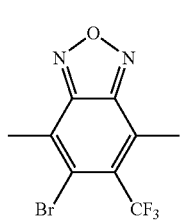
(1077) 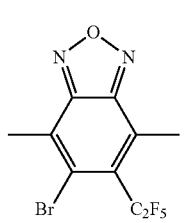
(1078) 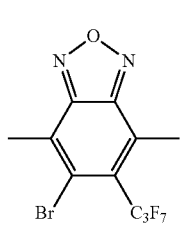

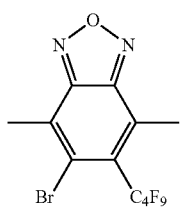
(1079)
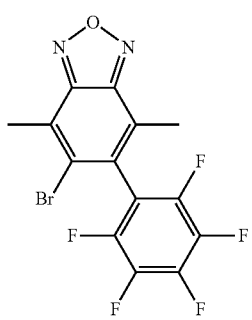
(1080)
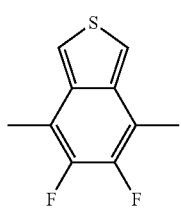
(1081)
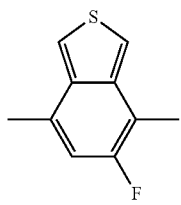
(1082)
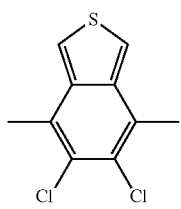
(1083)
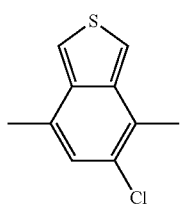
(1084)
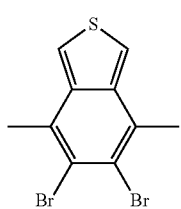
(1085)
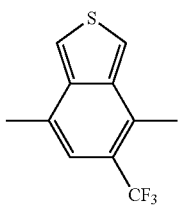
(1086)
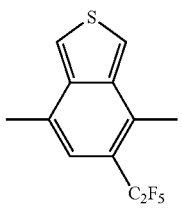
(1087)
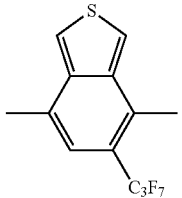
(1088)
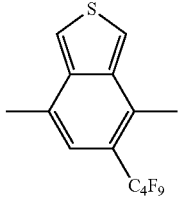
(1089)
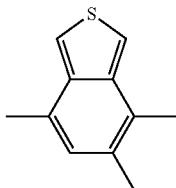
(1090)
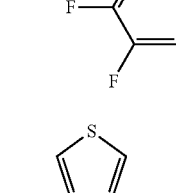
(1091)
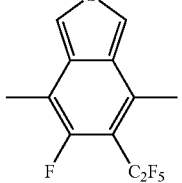
(1092)

(1093) 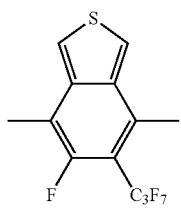
(1094) 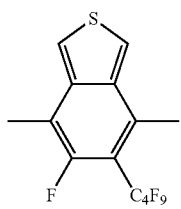
(1095) 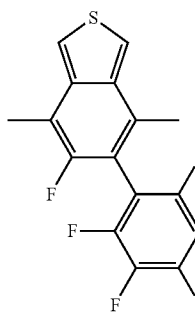
(1096) 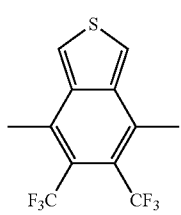
(1097) 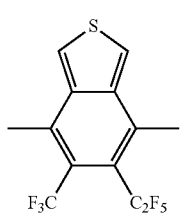
(1098) 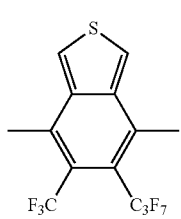
(1099) 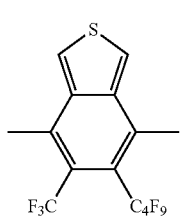
(1100) 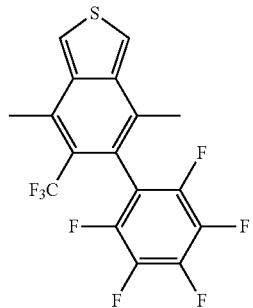
(1101) 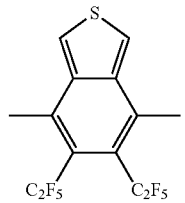
(1102) 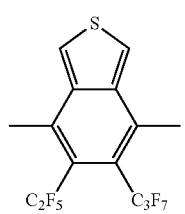
(1103) 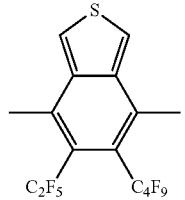
(1104) 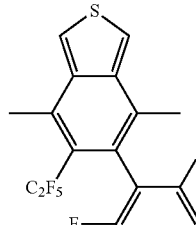
(1105) 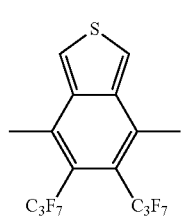

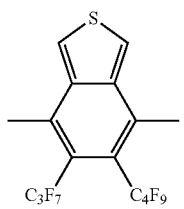 (1106)
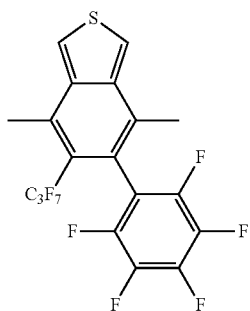 (1107)
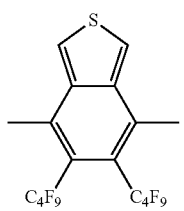 (1108)
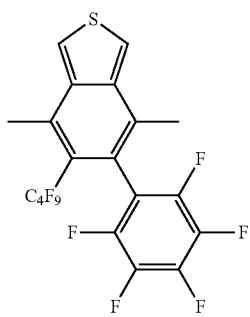 (1109)
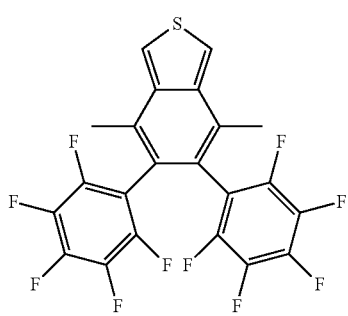 (1110)
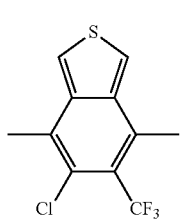 (1111)
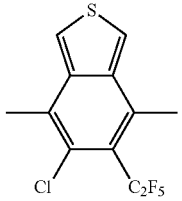 (1112)
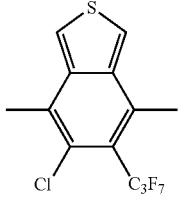 (1113)
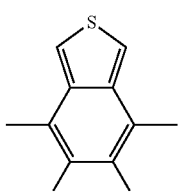 (1114)
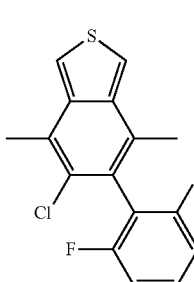 (1115)
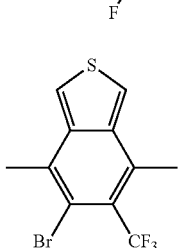 (1116)
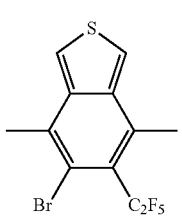 (1117)
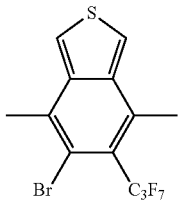 (1118)

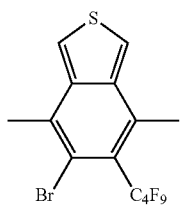
(1119)
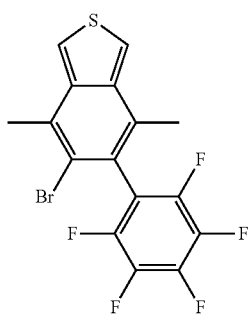
(1120)
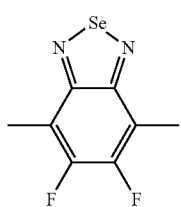
(1121)
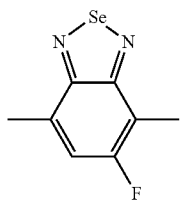
(1122)
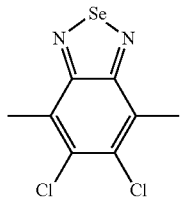
(1123)
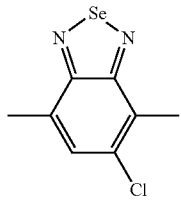
(1124)
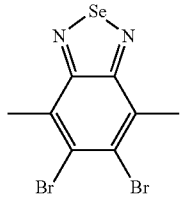
(1125)
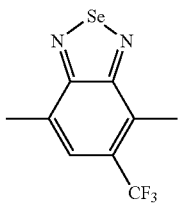
(1126)
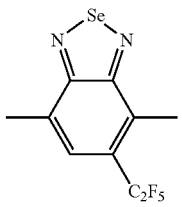
(1127)
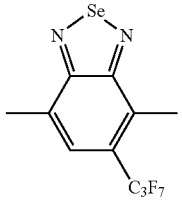
(1128)
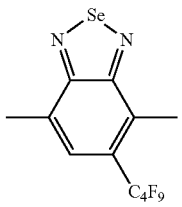
(1129)
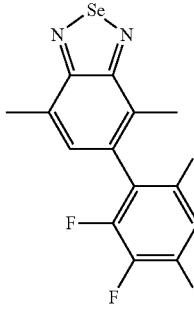
(1130)
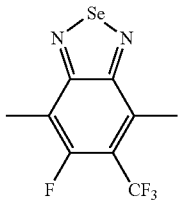
(1131)
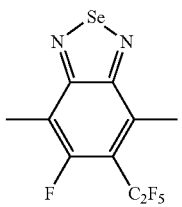
(1132)

(1133) 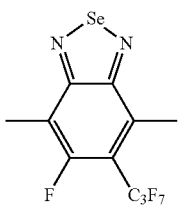
(1134) 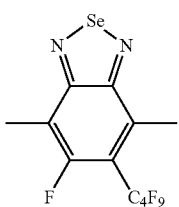
(1135) 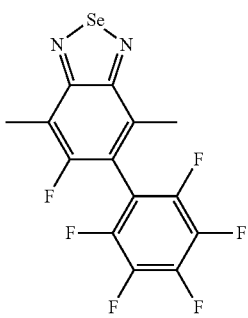
(1136) 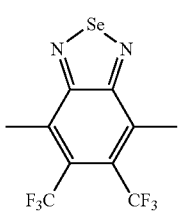
(1137) 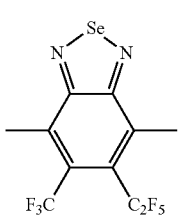
(1138) 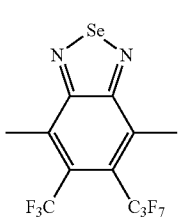
(1139) 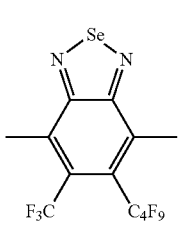
(1140) 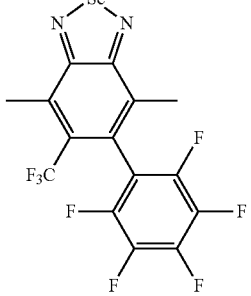
(1141) 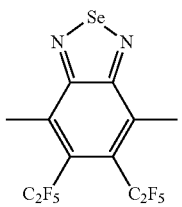
(1142) 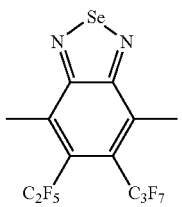
(1143) 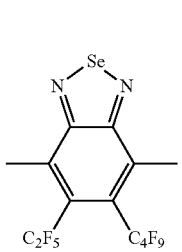
(1144) 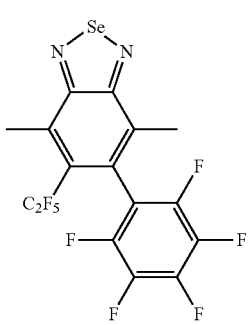
(1145) 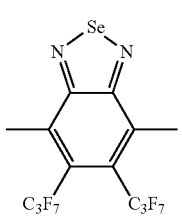

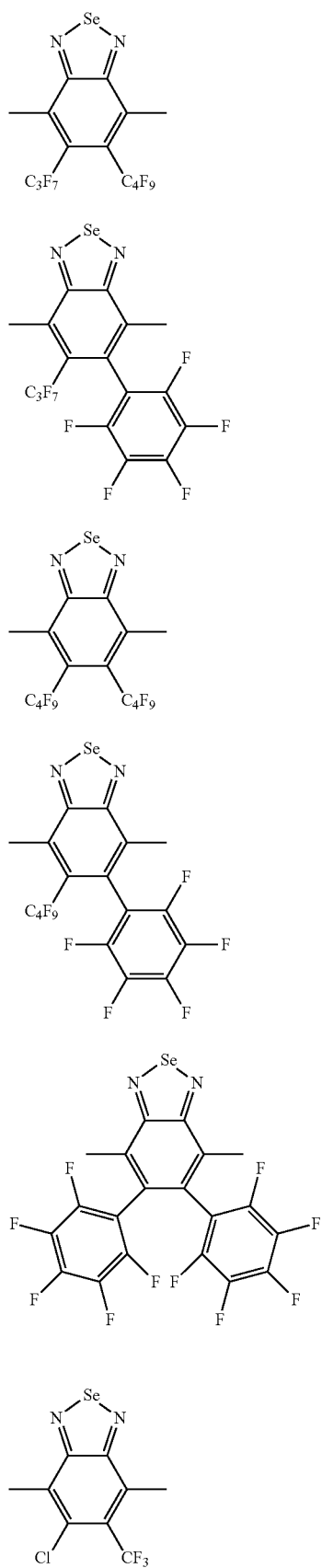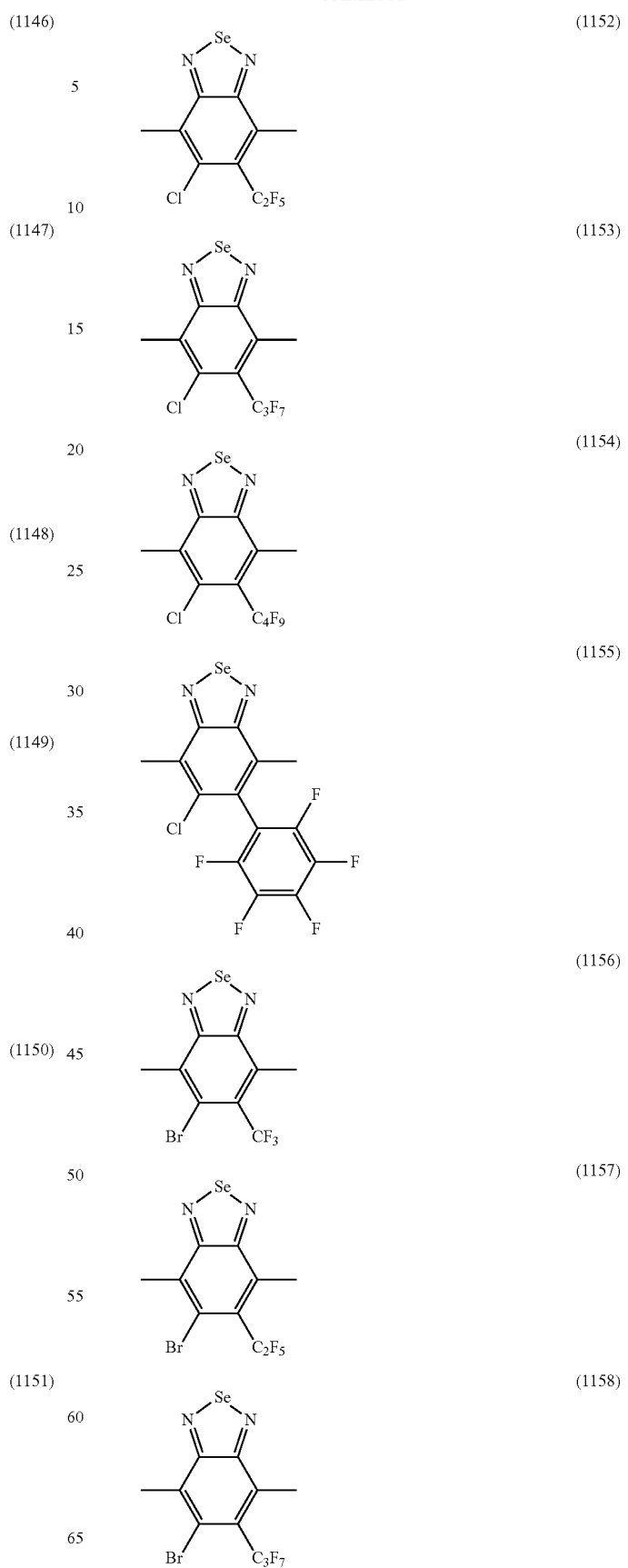

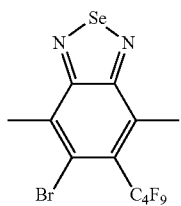 (1159)
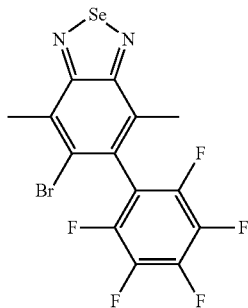 (1160)
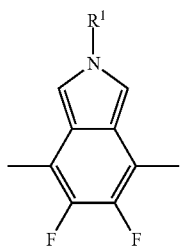 (1161)
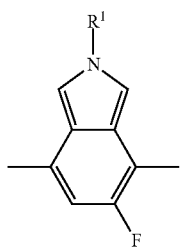 (1162)
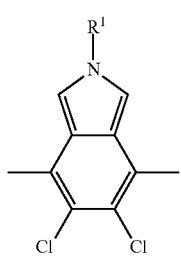 (1163)
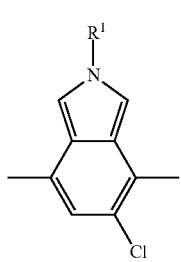 (1164)
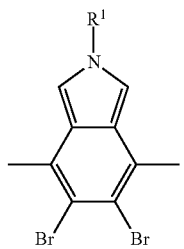 (1165)
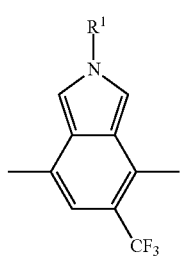 (1166)
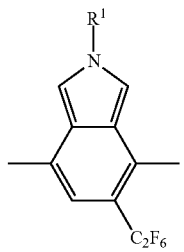 (1167)
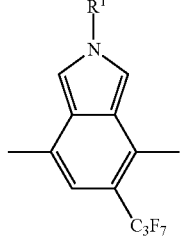 (1168)
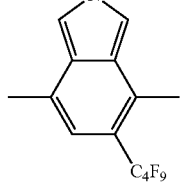 (1169)
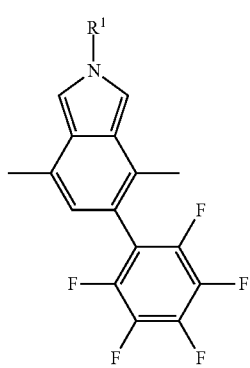 (1170)

(1171) 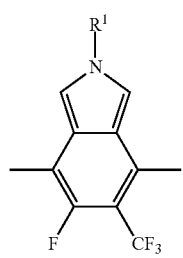
(1172) 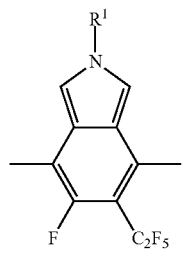
(1173) 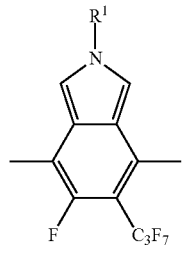
(1174) 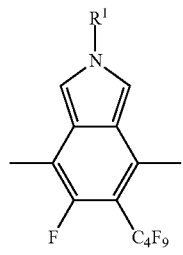
(1175) 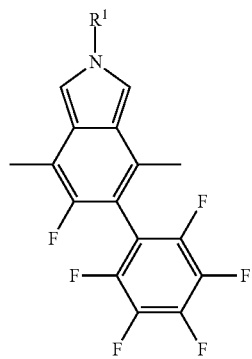
(1176) 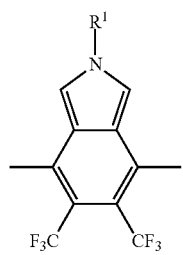
(1177) 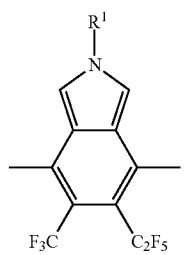
(1178) 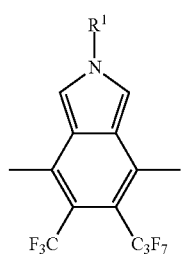
(1179) 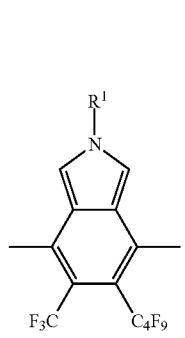
(1180) 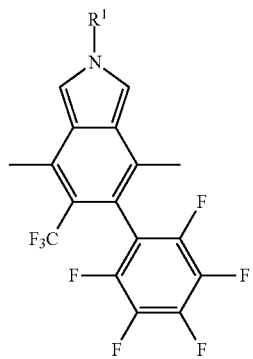
(1181) 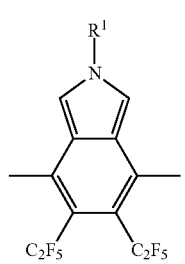

(1182) 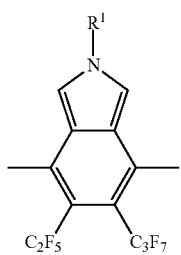
(1183) 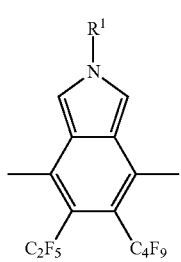
(1184) 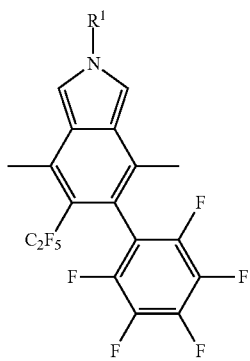
(1185) 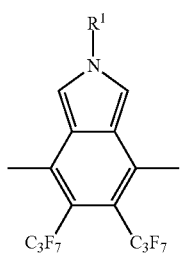
(1186) 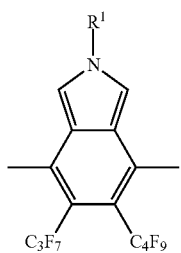
(1187) 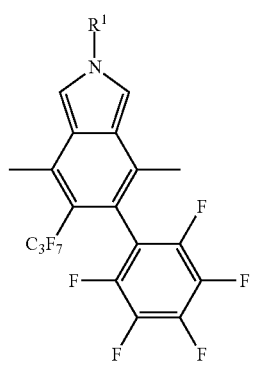
(1188) 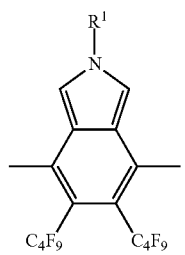
(1189) 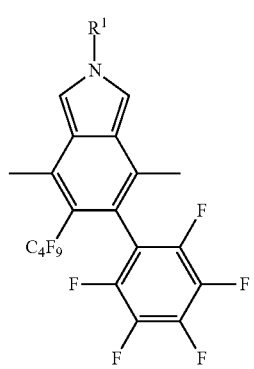
(1190) 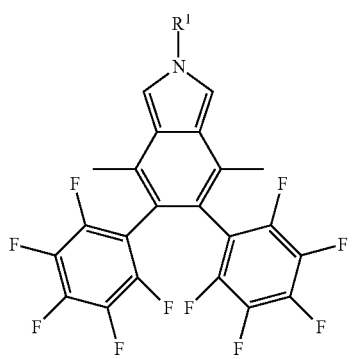
(1191) 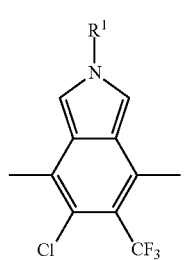

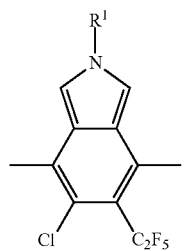 (1192)
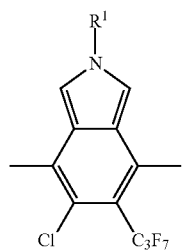 (1193)
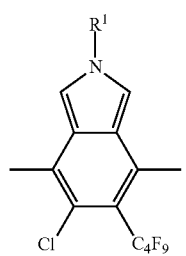 (1194)
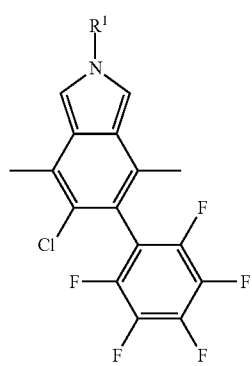 (1195)
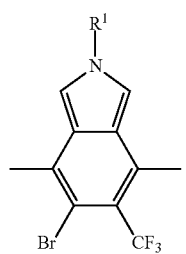 (1196)
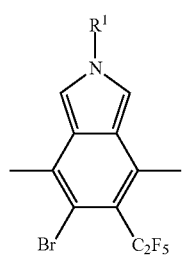 (1197)
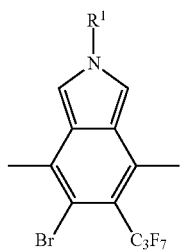 (1198)
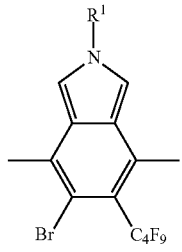 (1199)
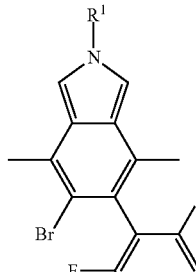 (1200)
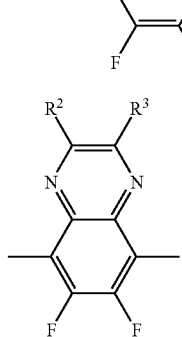 (1201)
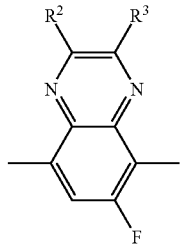 (1202)
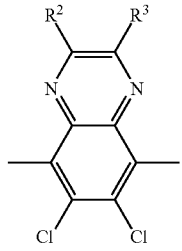 (1203)

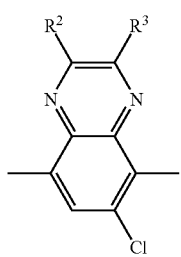 (1204)
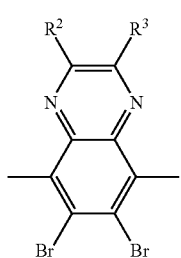 (1205)
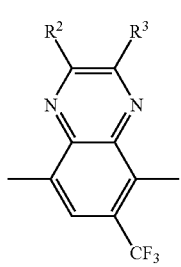 (1206)
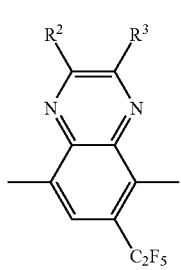 (1207)
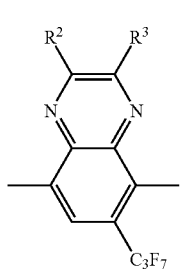 (1208)
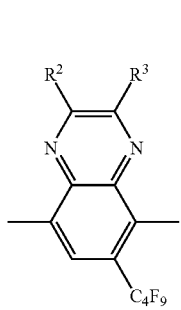 (1209)
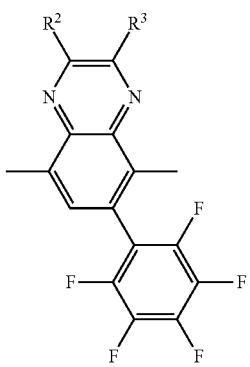 (1210)
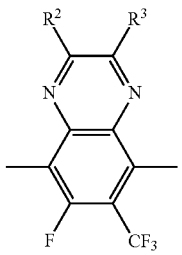 (1211)
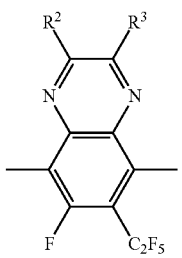 (1212)
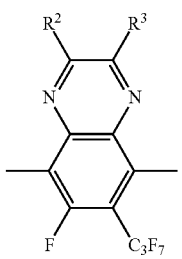 (1213)
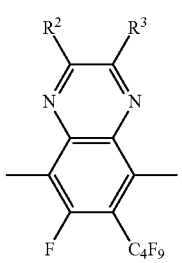 (1214)

(1215) 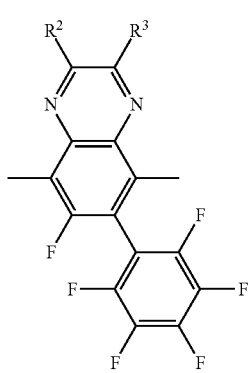
(1216) 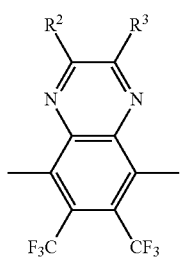
(1217) 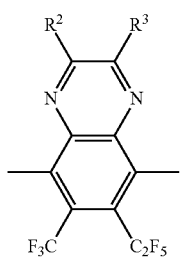
(1218) 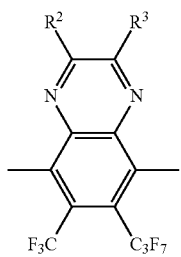
(1219) 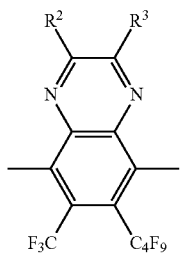
(1220) 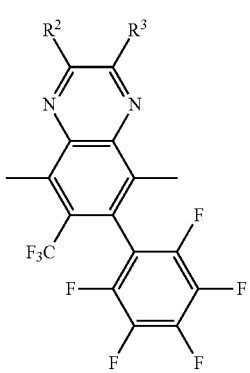
(1221) 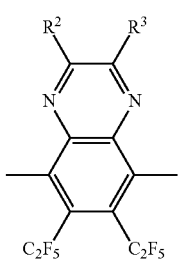
(1222) 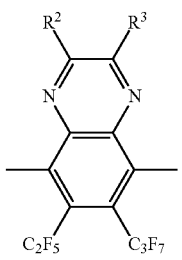
(1223) 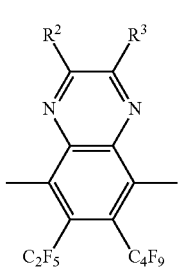
(1224) 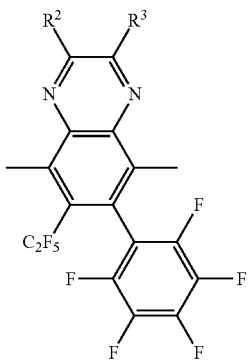

(1225) 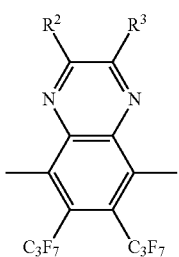
(1226) 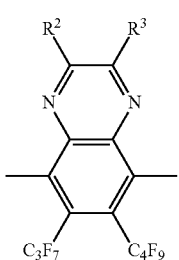
(1227) 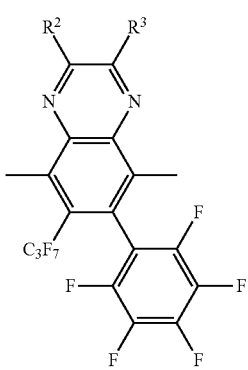
(1228) 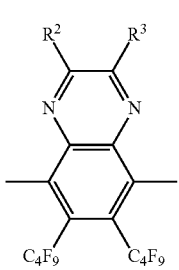
(1229) 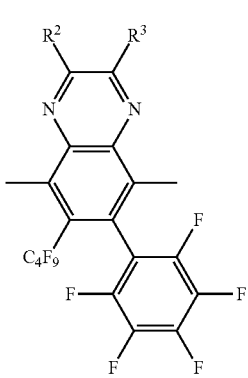
(1230) 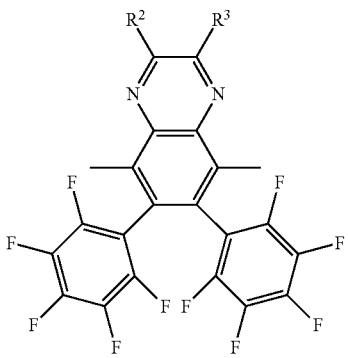
(1231) 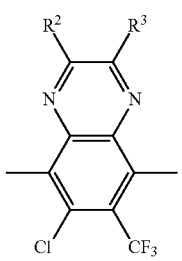
(1232) 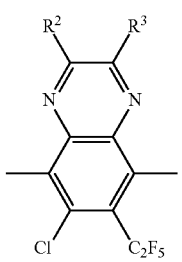
(1233) 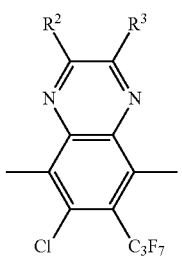
(1234) 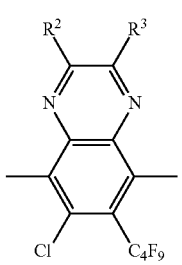

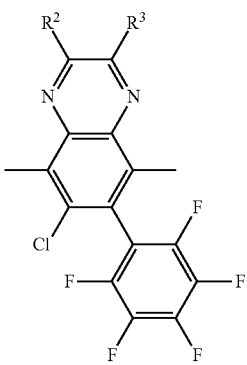

(1235)

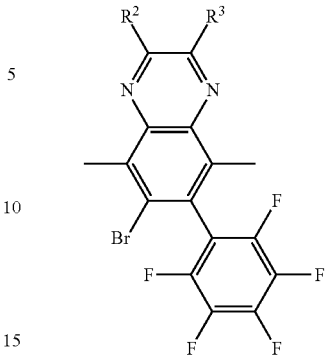

(1240)

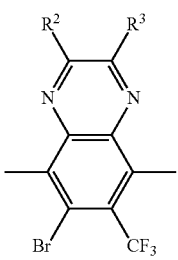

(1236)

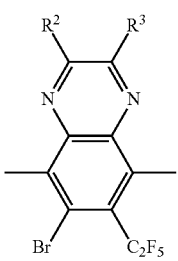

(1237)

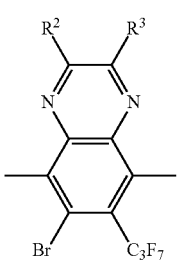

(1238)

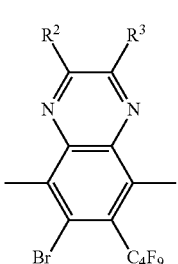

(1239)

In formula (1001) to formula (1240), $R^1$, $R^2$ and $R^3$ represent the same meanings as described above. Among the structural units represented by formula (1001) to formula (1240), from the view point of improving the photoelectric conversion efficiency, the structural units represented by formula (1001), formula (1002), formula (1041), formula (1042), formula (1081), formula (1082), formula (1121), formula (1122), formula (1161), formula (1162), formula (1201) and formula (1202) are preferred, the structural units represented by formula (1001), formula (1002), formula (1041), formula (1042), formula (1201) and formula (1202) are more preferred, the structural units represented by formula (1001), formula (1002), formula (1041) and formula (1042) are further preferred, the structural units represented by formula (1001) and formula (1041) are still further preferred, and the structural unit represented by formula (1001) is particularly preferred.

The polymer compound of the present invention may further has a structural unit represented by formula (2):

 (2)

[wherein, $Ar^1$ represents a bivalent aromatic group.]

A bivalent aromatic group refers to a bivalent aromatic carbocyclic group or a bivalent aromatic heterocyclic group. A bivalent aromatic carbocyclic group is an atomic group that two hydrogen atoms are removed from optionally substituted aromatic hydrocarbon, and the number of carbons constituting the ring is typically about 6 to 60, and preferably 6 to 20. As aromatic hydrocarbon, the one having a benzene ring, the one having a condensed ring, the one in which two or more independent benzene ring or condensed ring are directly bound or bound via a group such as vinylene are included.

A bivalent aromatic heterocyclic group is an atomic group that two hydrogen atoms are removed from an aromatic heterocyclic compound, and the number of carbons constituting the ring is typically 2 to 60, and preferably 3 to 20. An aromatic heterocyclic compound is an organic compound having aromatic cyclic structure containing, as an element constituting the ring, a hetero atom such as oxygen, sulfur, nitrogen, phosphorus, boron, arsenic, silicon or the like besides a carbon atom.

In the polymer compound of the present invention, two or more structural units represented by formula (2) may exist sequentially, or the structural unit represented by formula (1) may exist on both sides of the structural unit represented by formula (2). When two or more structural units exist sequentially, the sequentially existing structural units represented by formula (2) may be the same or different from each other.

As a structural unit represented by formula (2), for example, a structural unit represented by formula (D-1), and a structural unit represented by formula (D-2) are recited.

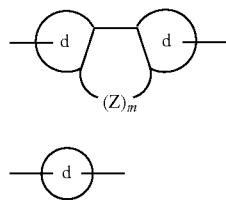

[wherein, ring d represents an aromatic ring. m represents an integer of 1 or more. Z represents a group represented by formula (z-1) to formula (z-8). When there are a plurality of rings d, they may be the same or different. When there are a plurality of Zs, they may be the same or different.

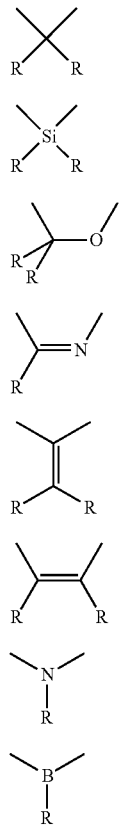

(In formula (z-1) to formula (z-8), R represents a hydrogen atom or a substituent. When there are a plurality of Rs, they may be the same or different. Rs may bind to each other to aspect cyclic structure.)]

An aromatic ring represented by ring d may be an aromatic carbocyclic ring or an aromatic heterocyclic ring.

As an aromatic carbocyclic ring, a benzene ring, a naphthalene ring, an anthracene ring and so on are recited.

As an aromatic heterocyclic ring, a furan ring, a thiophene ring, a pyrrole ring, a silole ring, a bolol ring, a phosphol ring, an imidazole ring, a triazole ring, a triazole ring, an oxazole ring, an isooxazole ring, a pyrazole ring, an isothiazole ring, a pyridine ring, a pyrazine ring, a pyrimidine ring, a quinoline ring, an isoquinoline ring, an indole ring, a benzofuran ring, an isobenzofuran ring, a benzoimidazole ring, a benzothiophene ring, a benzothiazole ring, and a benzooxazole ring and so on are recited.

m represents an integer of 1 or more. It is preferably 1 to 3, more preferably 1 to 2, and particularly preferably 1.

Examples of a substituent represented by R include an alkyl group which may be substituted by a fluorine atom, an alkoxy group which may be substituted by a fluorine atom, an alkylthio group which may be substituted by a fluorine atom, an aryl group which may be substituted by a fluorine atom, an aryloxy group which may be substituted by a fluorine atom, an arylthio group which may be substituted by a fluorine atom, an arylalkyl group which may be substituted by a fluorine atom, an arylalkoxy group which may be substituted by a fluorine atom, an arylalkylthio group which may be substituted by a fluorine atom, an arylalkenyl group which may be substituted by a fluorine atom, an arylalkynyl group which may be substituted by a fluorine atom, an amino group, a substituted amino group, a silyl group, a substituted silyl group, a halogen atom, an acyl group, an acyloxy group, an amido group, a heterocyclic group, a carboxyl group, an alkoxycarbonyl group, a nitro group and a cyano group.

Definitions and specific examples of alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, amido group and heterocyclic group represented by R are as same as the aforementioned definitions and the specific examples of an alkyl group, alkyloxy group, alkylthio group, aryl group, aryloxy group, arylthio group, arylalkyl group, arylalkyloxy group, arylalkylthio group, arylalkenyl group, arylalkynyl group, substituted amino group, substituted silyl group, halogen atom, acyl group, acyloxy group, amido group and heterocyclic group represented by $R^1$.

An alkoxycarbonyl group typically has 2 to 20 carbon atoms including carbonyl carbon, and specific examples include a methoxycarbonyl group, an ethoxycarbonyl group and a butoxycarbonyl group.

A substituent represented by R is preferably an alkyl group, an alkoxy group, an aryl group, and an aryloxy group, and more preferably an alkyl group, an alkoxy group, an aryl group, and an aryloxy group having 9 to 18 carbon atoms, and particularly preferably an alkyl group having 9 to 18 carbon atoms.

Ring d may have a substituent(s), and when ring d has two or more substituents, the substituents may be bound to each other to aspect cyclic structure. As a substituent that ring d may possess, the groups equivalent to the aforementioned substituents represented by $R^1$ are recited.

As a structural unit represented by formula (D-2), a structural unit represented by formula (D-3), a structural unit represented by formula (D-4), and a structural unit represented by formula (D-5) are recited.

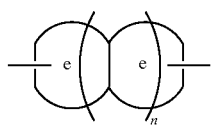

(D-4)

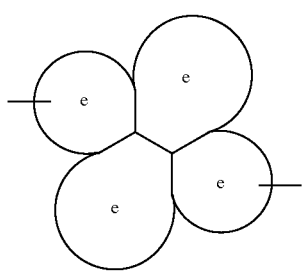

(D-5)

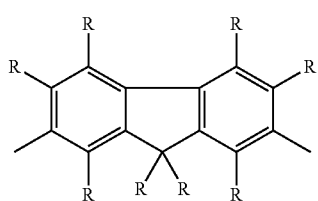

[wherein, ring e represents an aromatic ring. n represents an integer of 1 or more. p represents an integer of 0 to 5. When there are a plurality of rings e, they may be the same or different.]

n represents an integer of 1 or more. It is preferably 1 to 4, more preferably 1 to 3, and particularly preferably 1 to 2.

p represents an integer of 0 to 5. It is preferably 0 to 4, more preferably 0 to 3, and further preferably 0 to 2.

An aromatic ring represented by ring e may be an aromatic carbocyclic ring or an aromatic heterocyclic ring.

Ring e may have a substituent(s), and as the substituent, the groups equivalent to the substituents that ring d may possess are recited.

When the polymer compound of the present invention is used in a photoelectric conversion device, from the view point of improving the photoelectric conversion efficiency, among the structural units represented by formula (D-1) to formula (D-5), the structural unit represented by formula (D-1), and structural unit represented by formula (D-5) are preferred, and the structural unit represented by formula (D-1) is more preferred.

When the polymer compound of the present invention is used in an organic thin film transistor, from the view point of improving the hole mobility, among the structural units represented by formula (D-1) to formula (D-5), the structural unit represented by formula (D-1), and structural unit represented by formula (D-4) are preferred, and the structural unit represented by formula (D-1) is more preferred.

As the structural unit represented by formula (D-1), groups represented by formula 1 to formula 152 are recited.

1

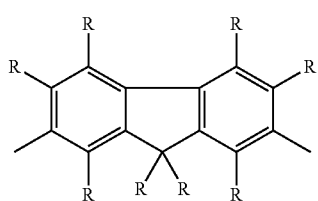

2

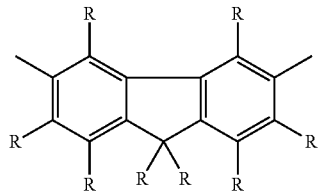

3

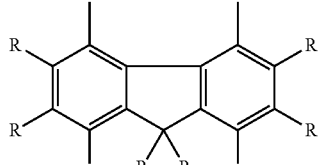

4

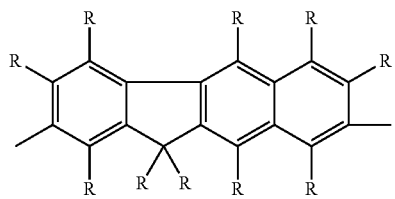

5

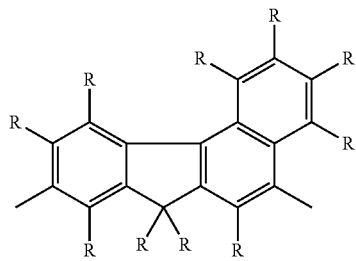

6

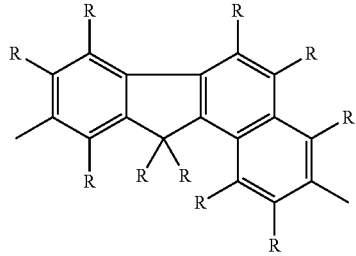

7

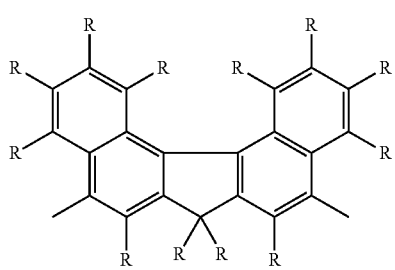

8

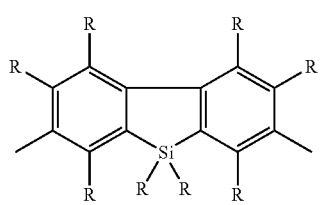

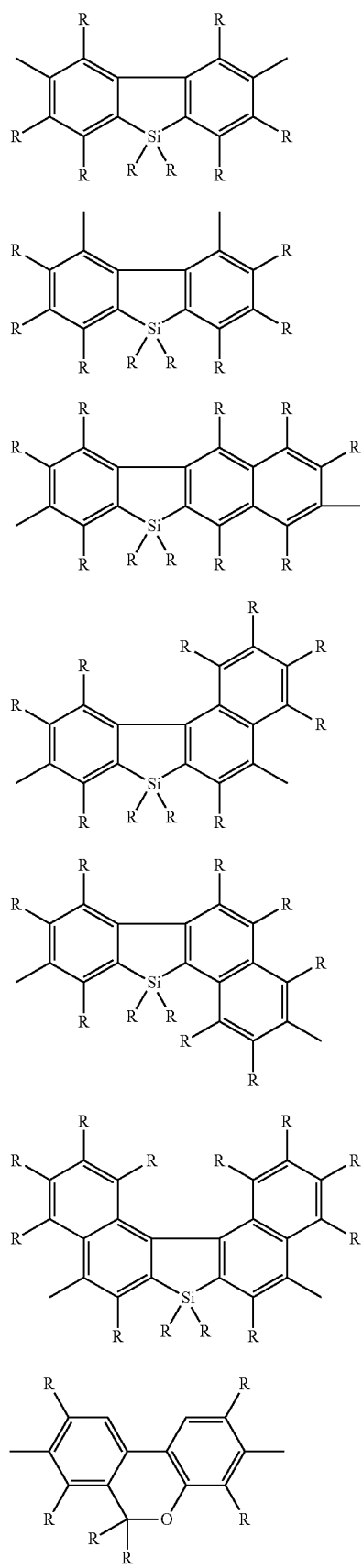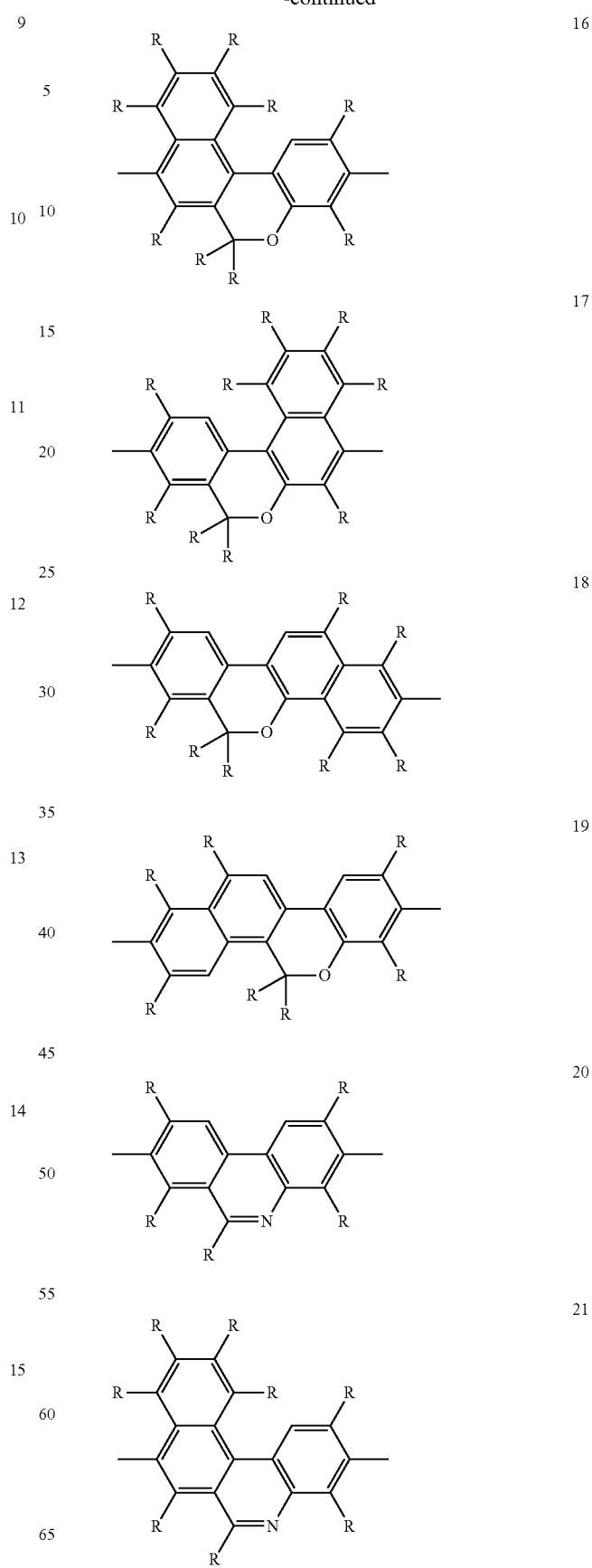

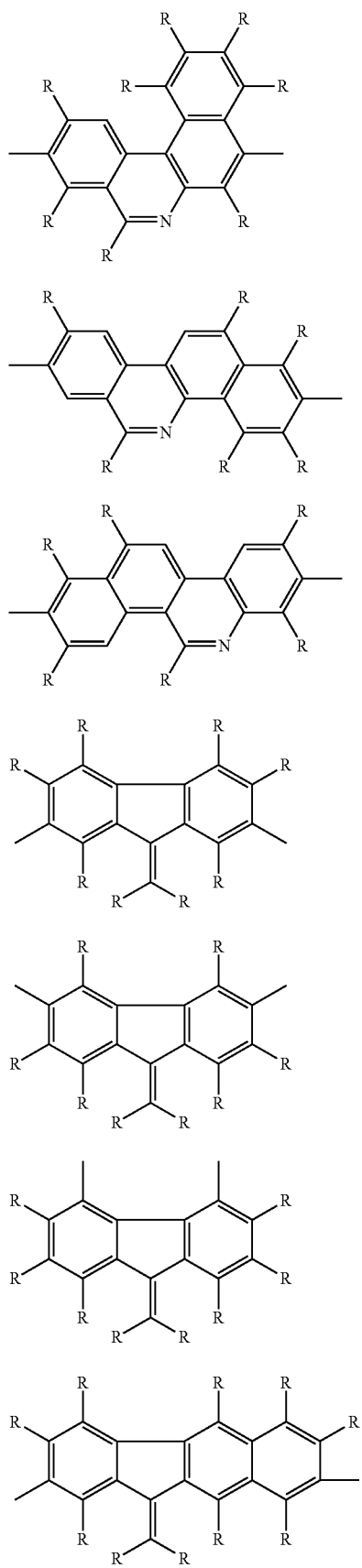
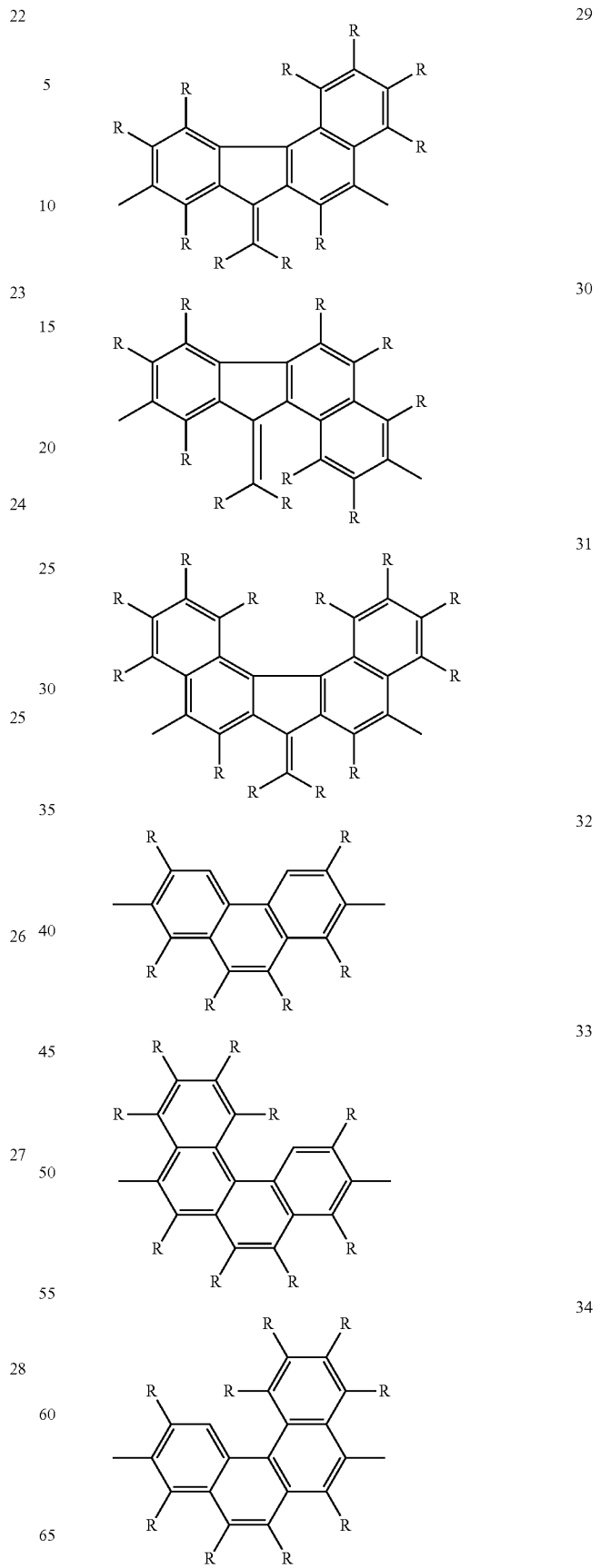

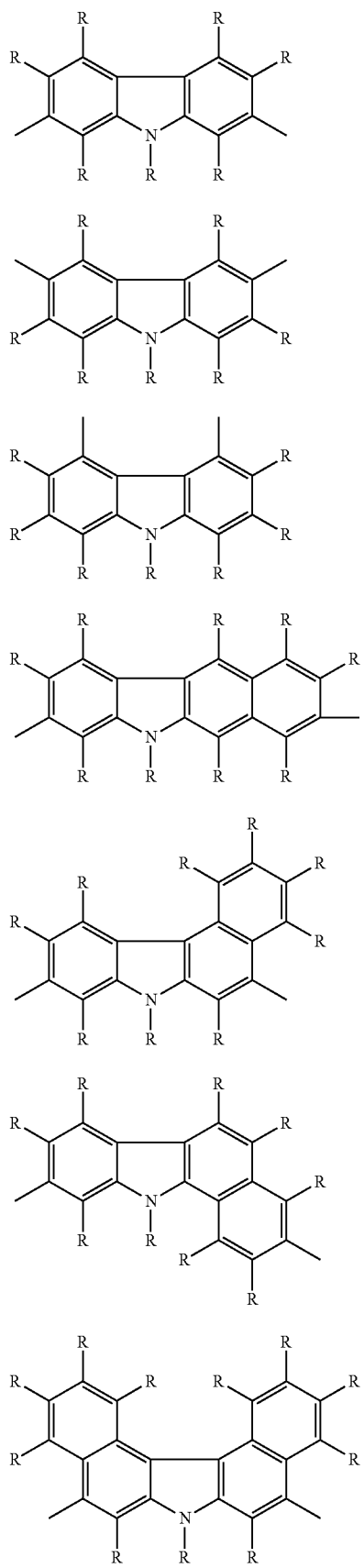
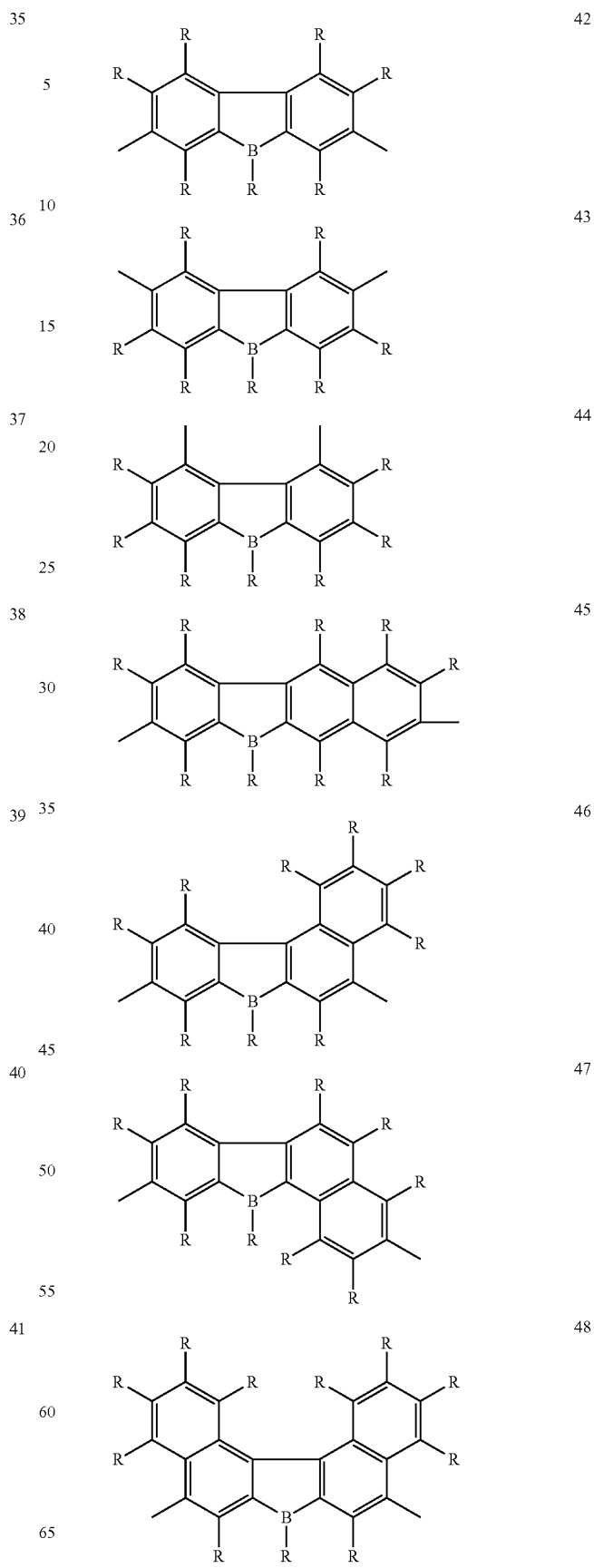

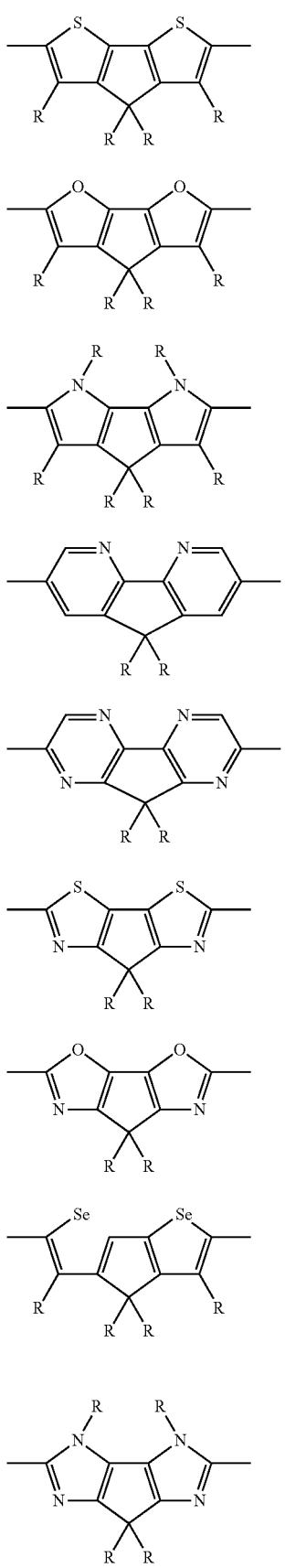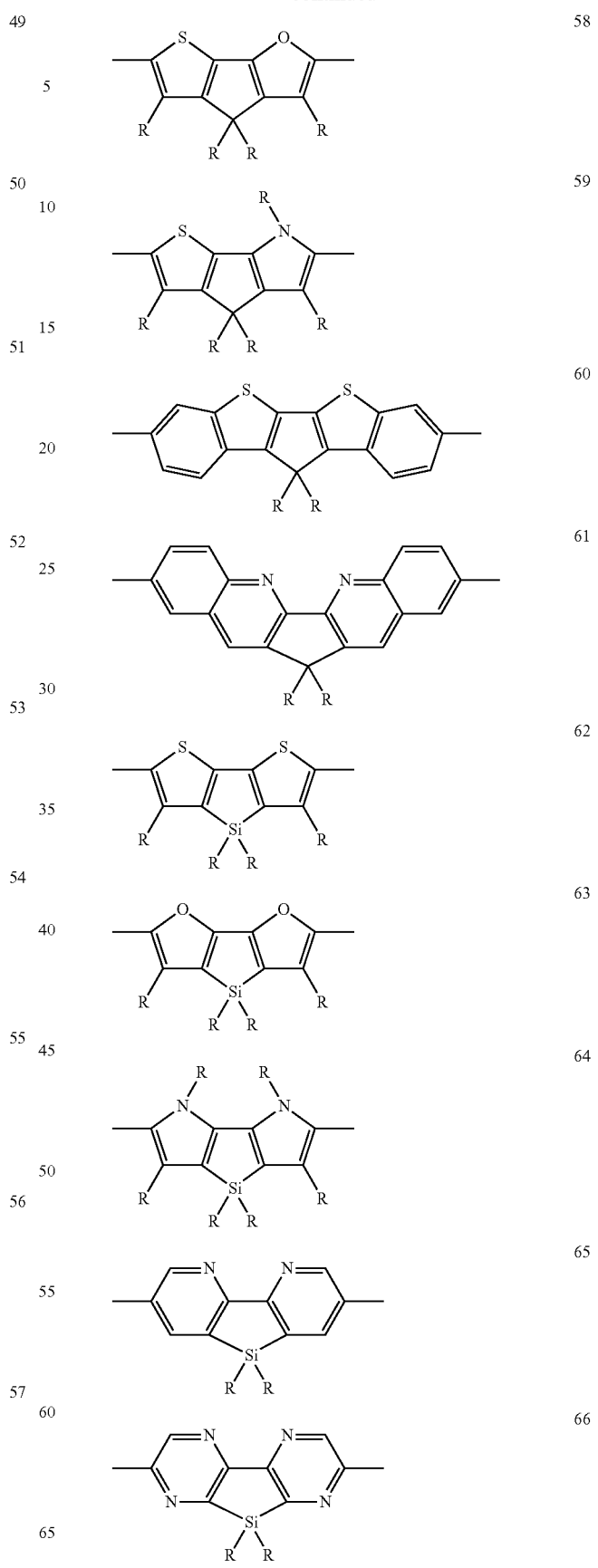

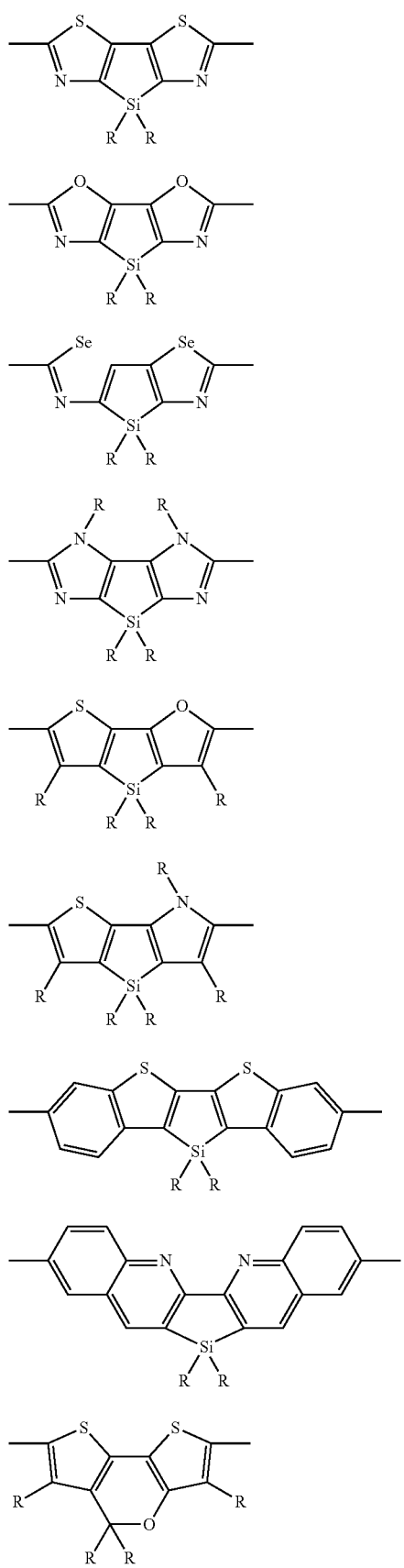
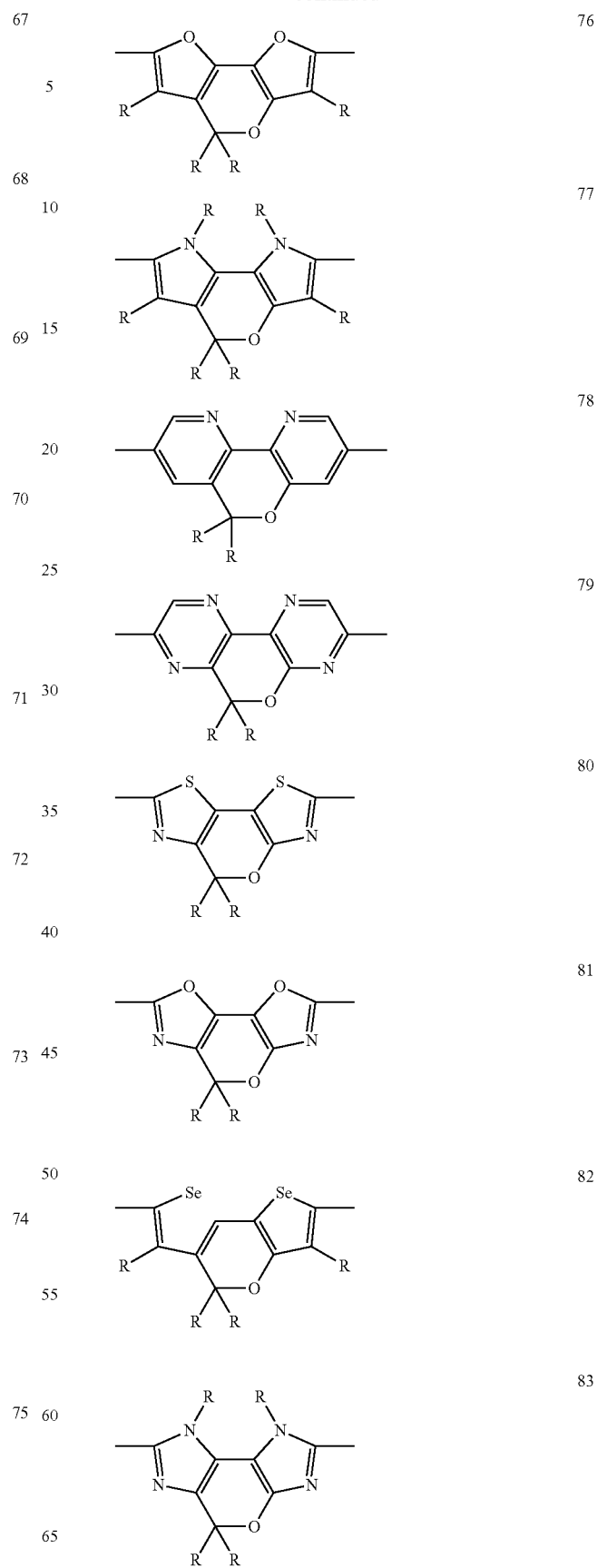

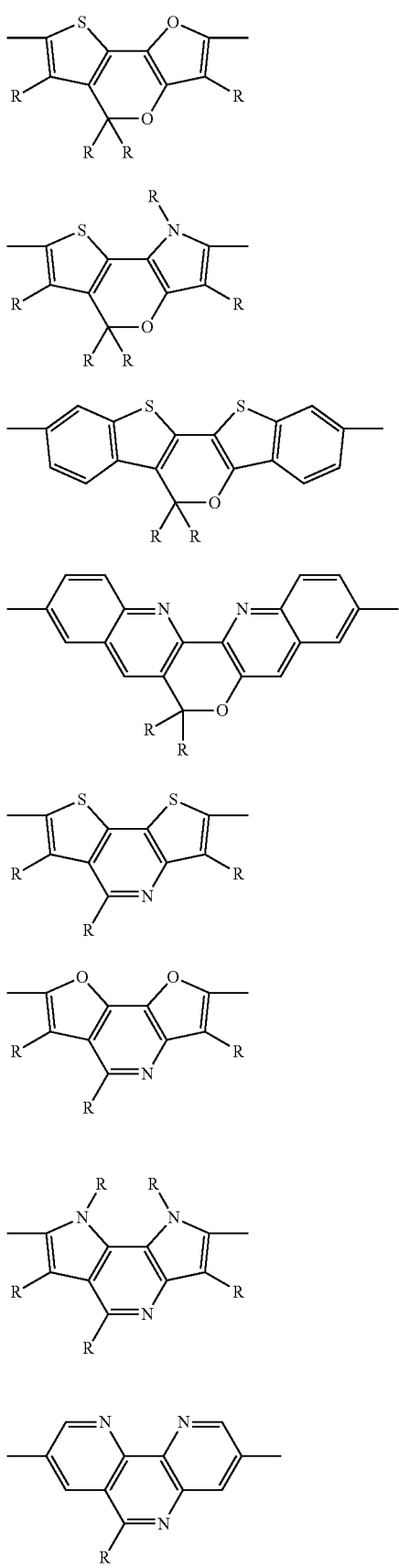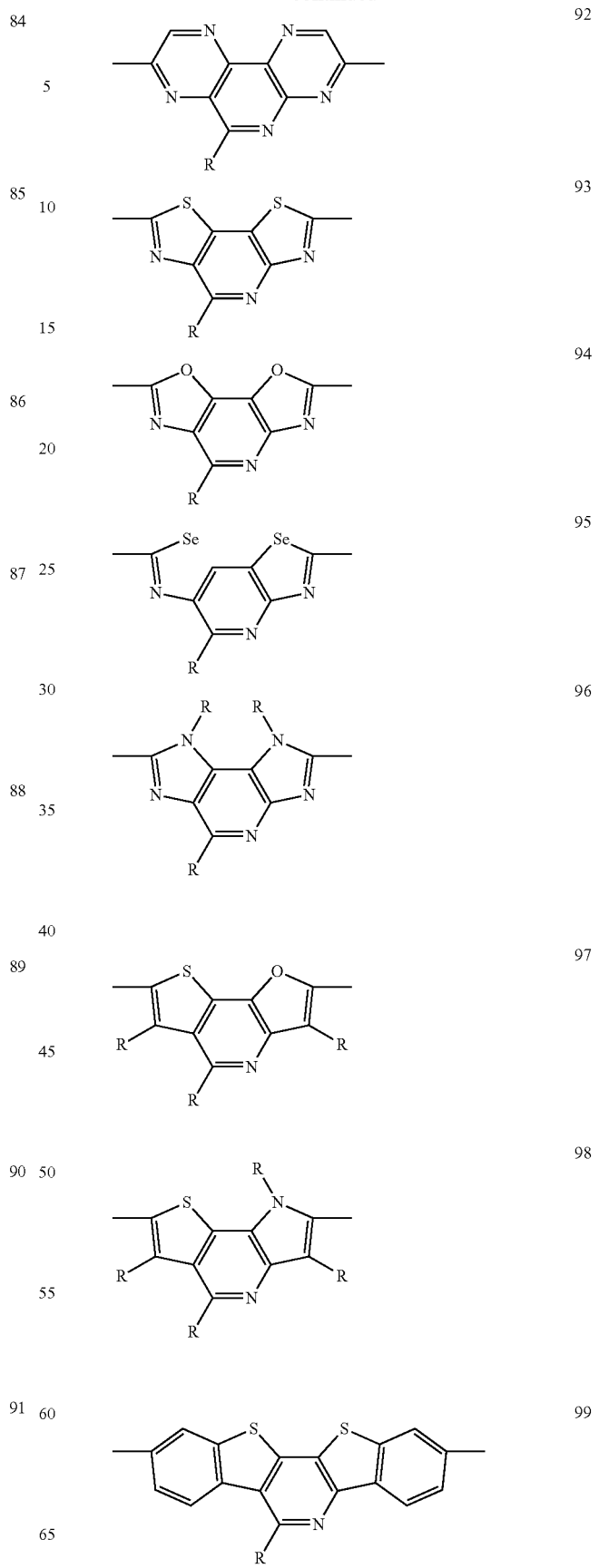

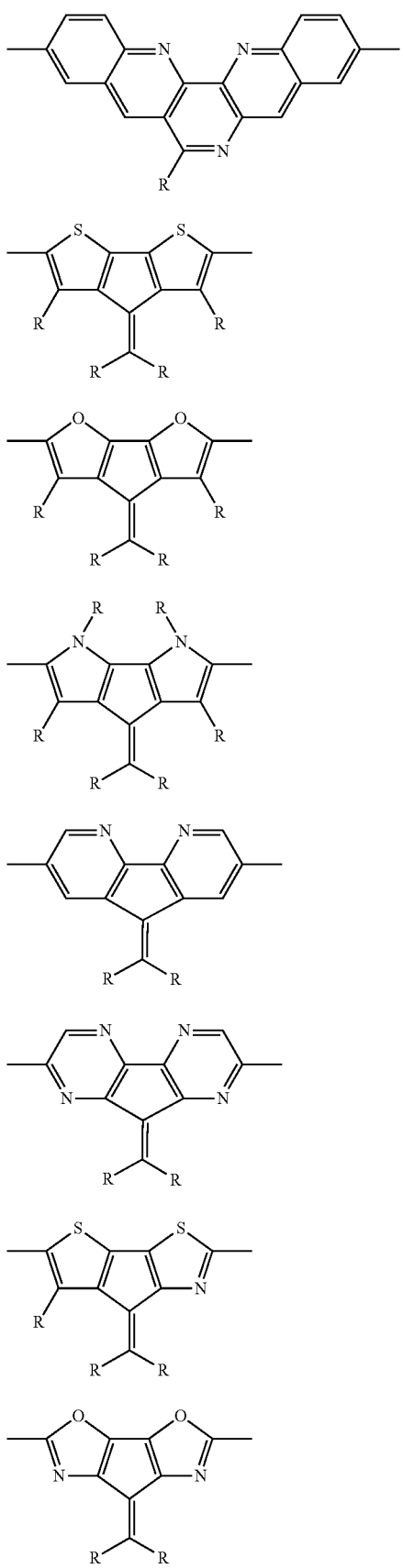
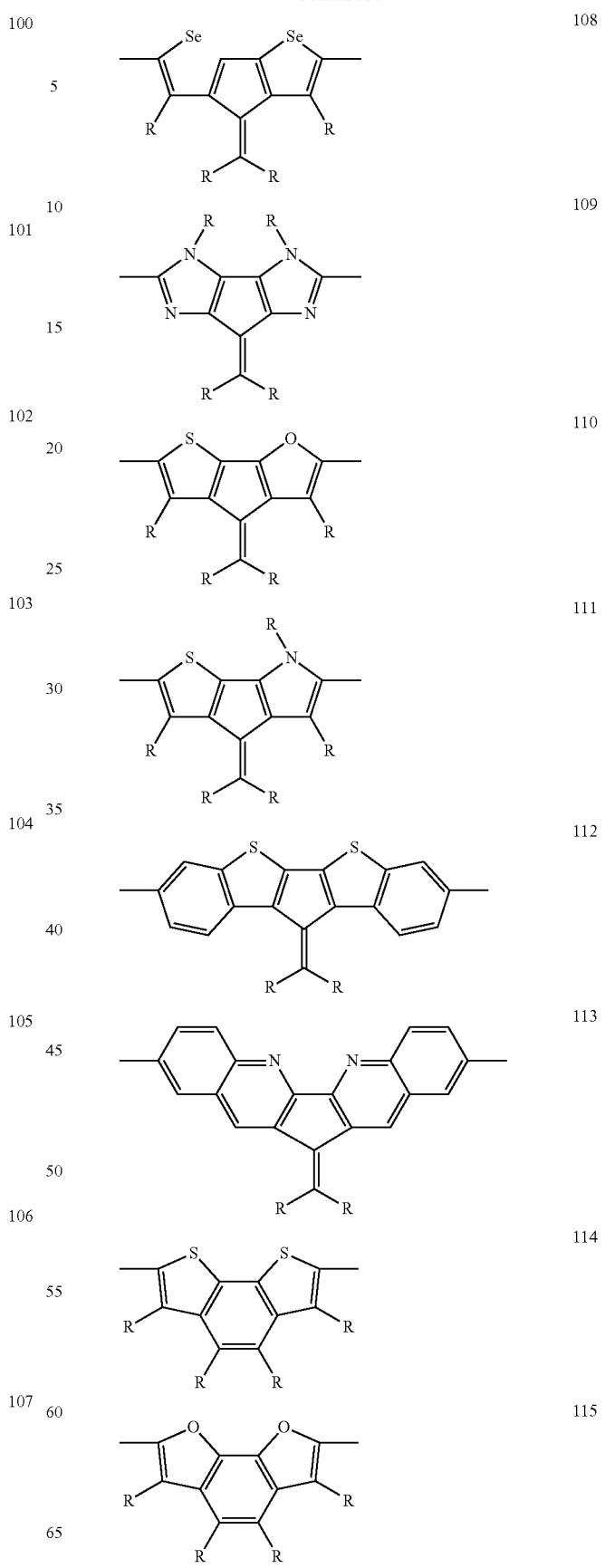

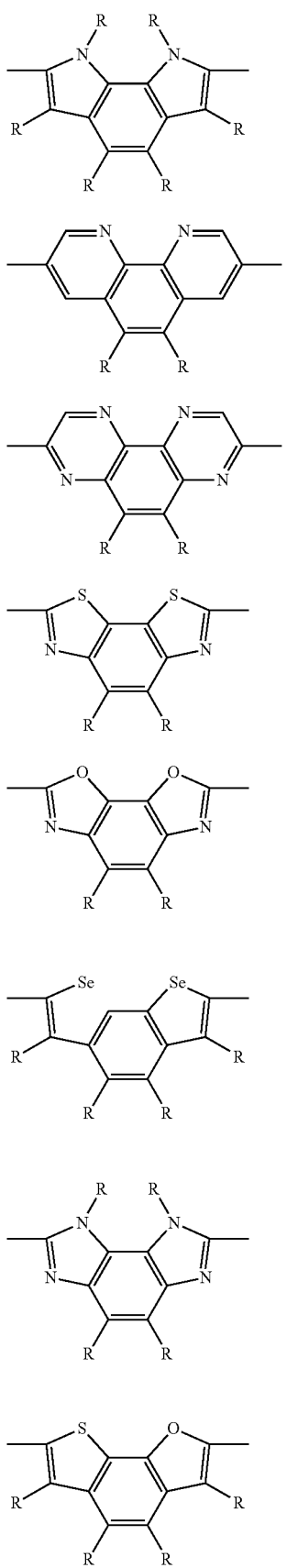
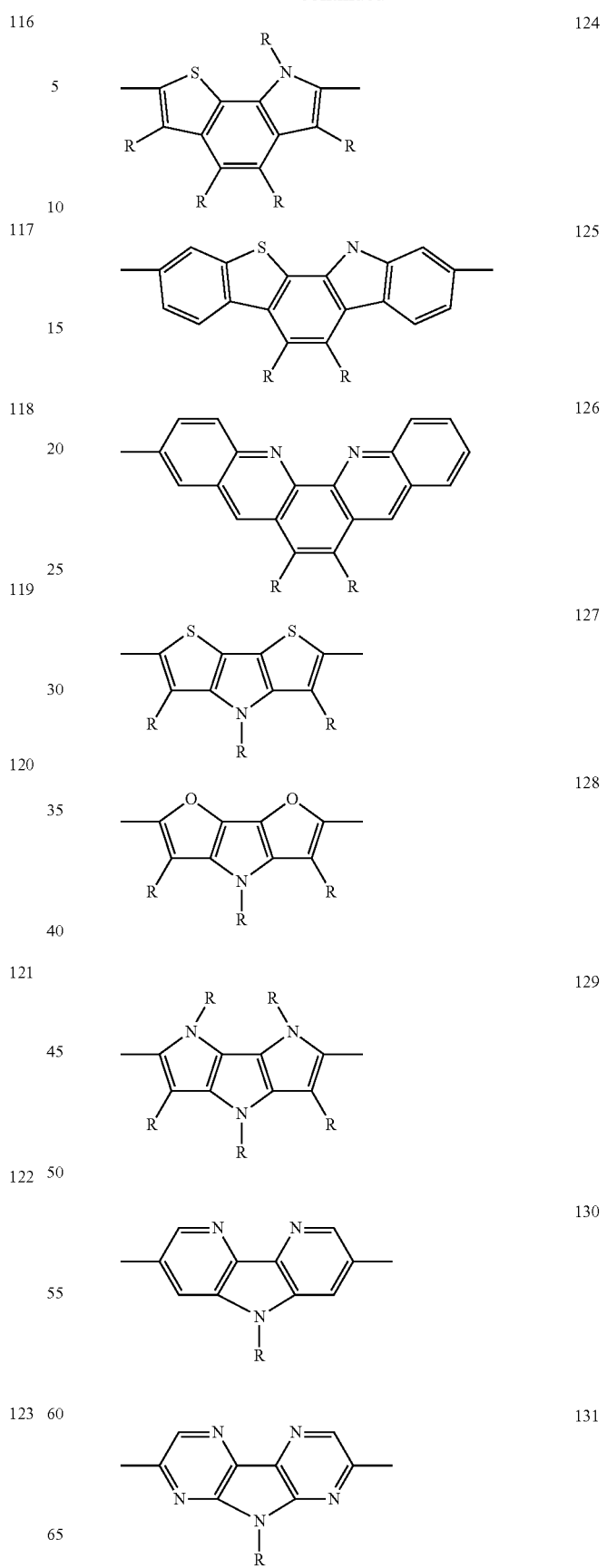

132 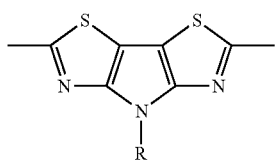
133 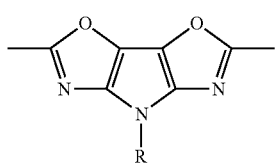
134 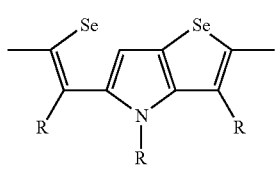
135 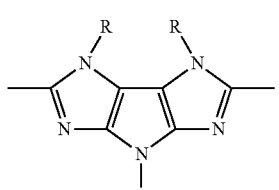
136 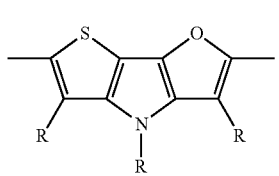
137 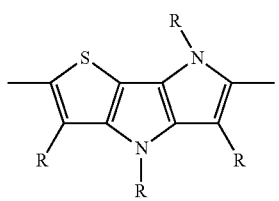
138 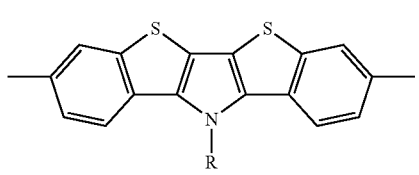
139 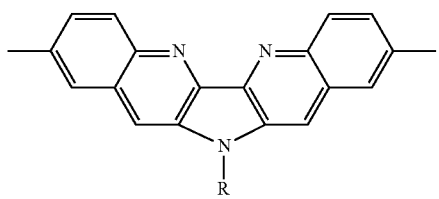
140 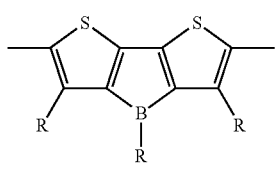
141 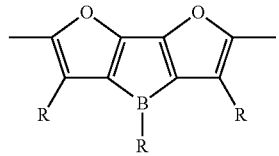
142 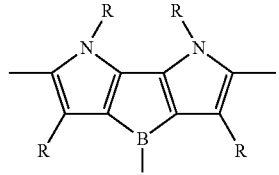
143 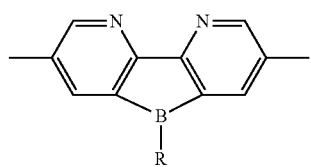
144 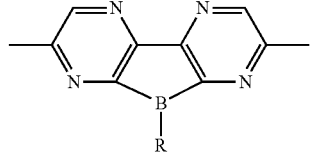
145 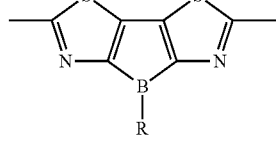
146 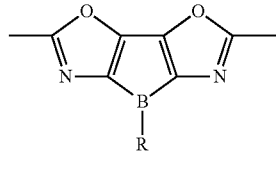
147 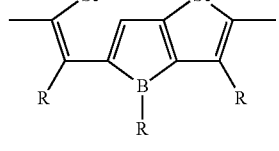
148 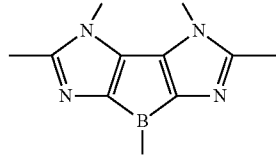
149 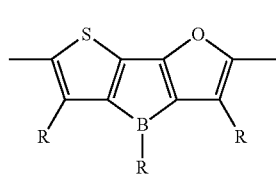

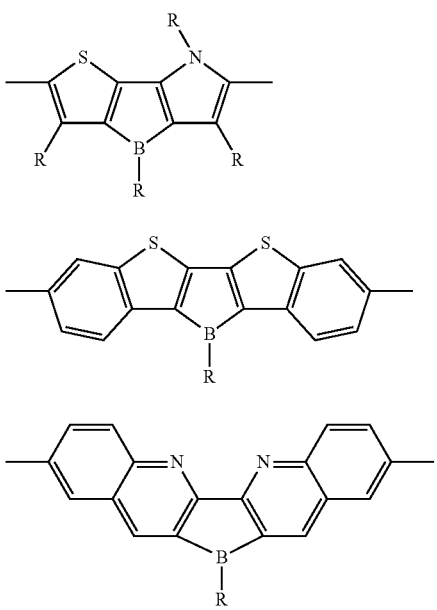
150
151
152
In formula 1 to formula 152, R represents the same meaning as described above.
As the structural unit represented by formula (D-3), groups represented by formula 201 to formula 234 are recited.
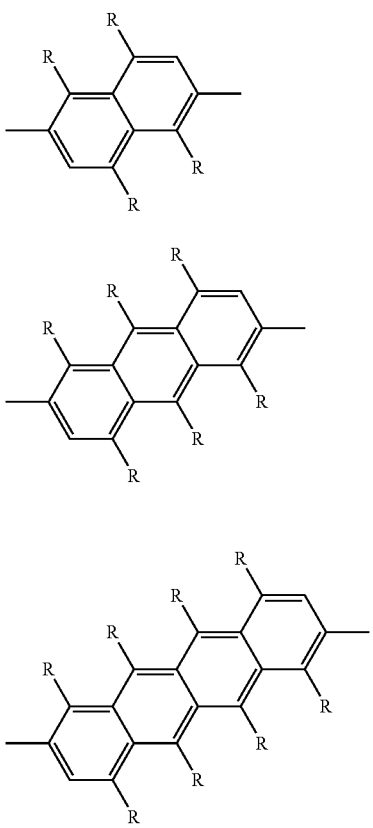
201
202
203
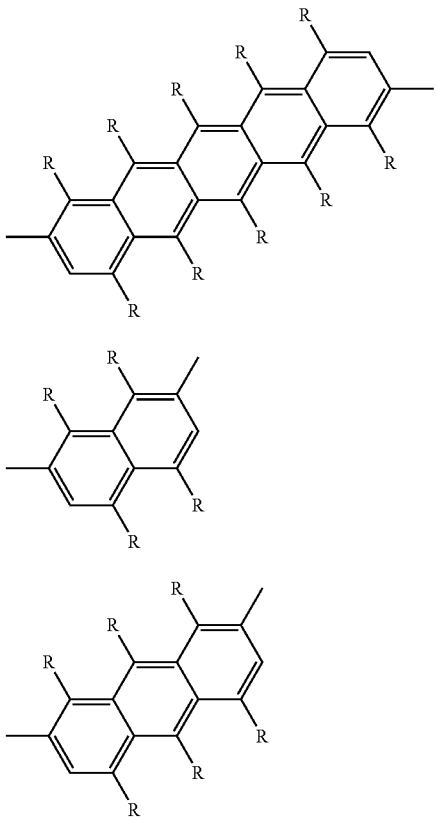
204
205
206
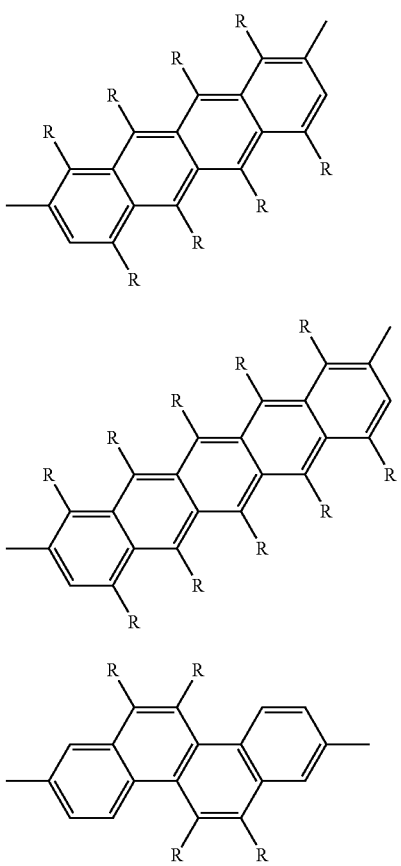
207
208
209

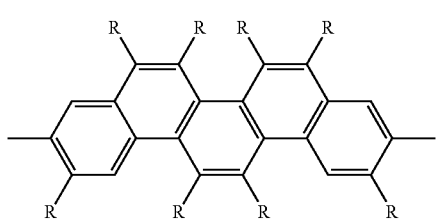
210
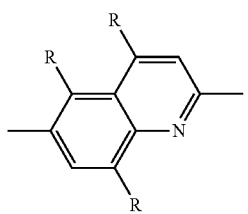
211
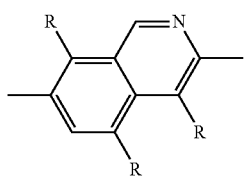
212
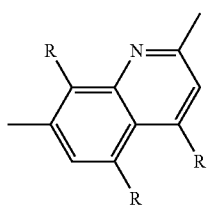
213
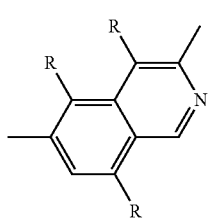
214
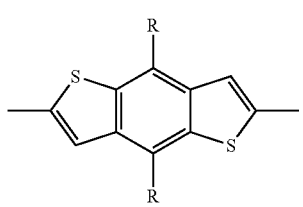
215
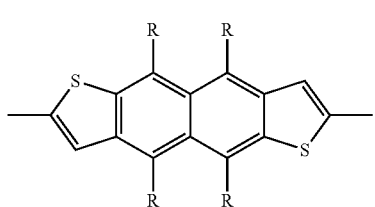
216
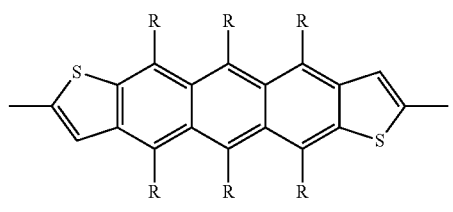
217
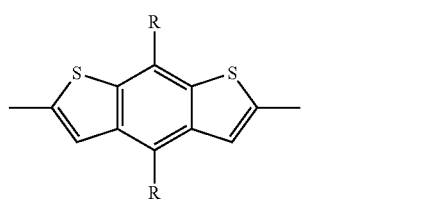
218
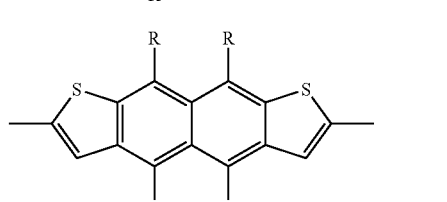
219
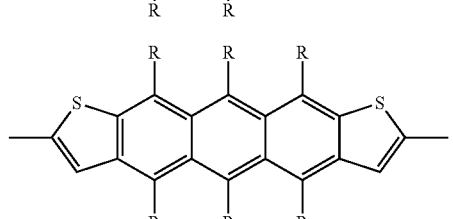
220
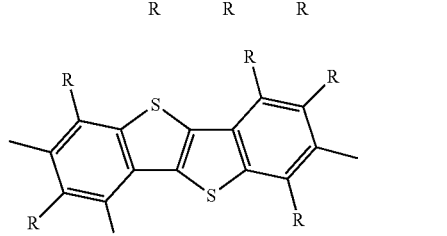
221
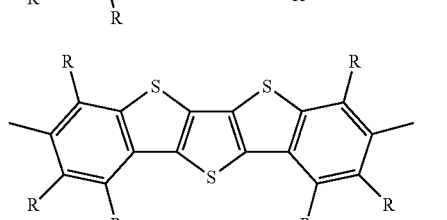
222
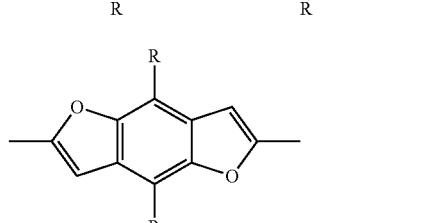
223
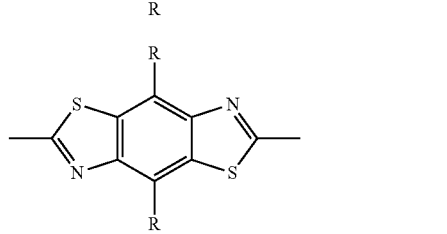
224

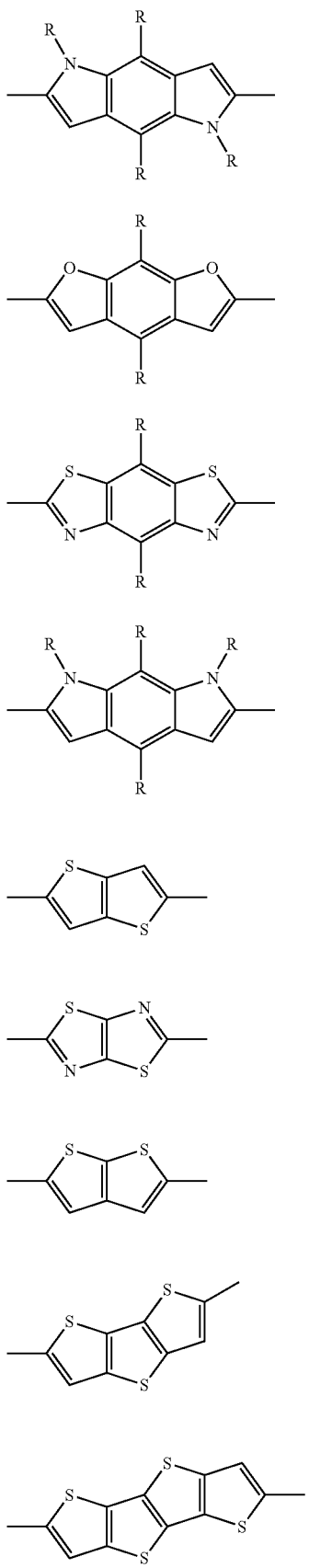
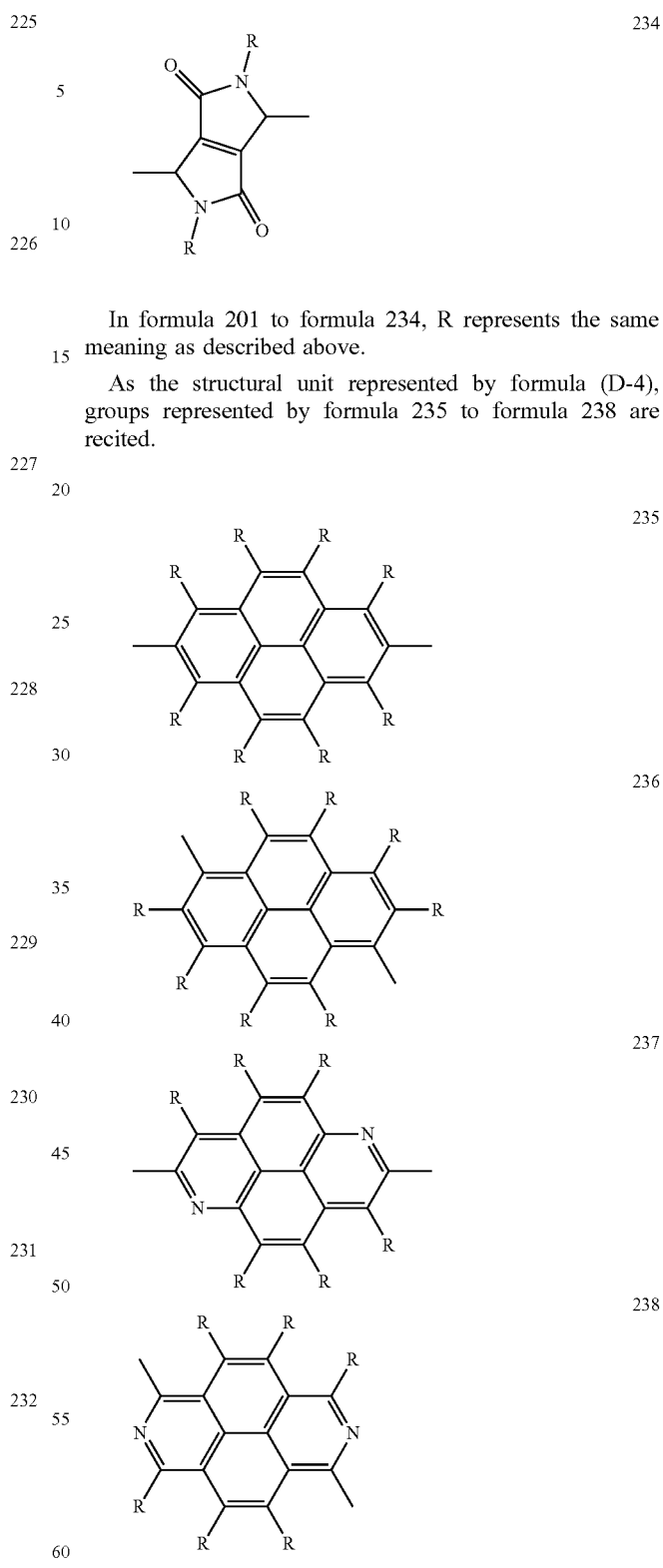
In formula 201 to formula 234, R represents the same meaning as described above.
As the structural unit represented by formula (D-4), groups represented by formula 235 to formula 238 are recited.
In formula 235 to formula 238, R represents the same meaning as described above.
As the structural unit represented by formula (D-5), groups represented by formula 301 to formula 323 are recited.

-continued
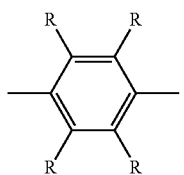
301
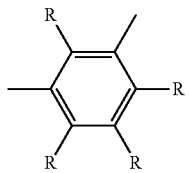
302
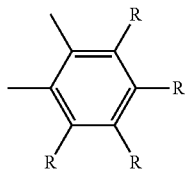
303
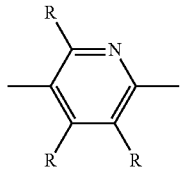
304
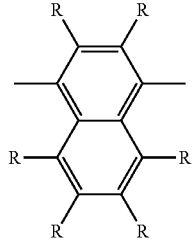
305
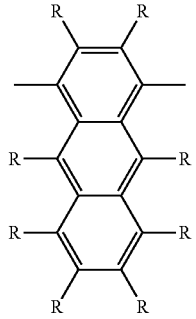
306
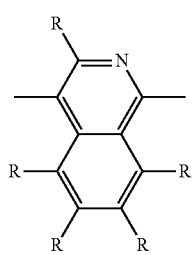
307
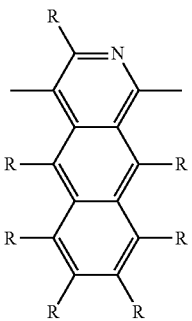
308
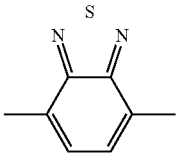
309
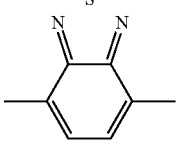
310
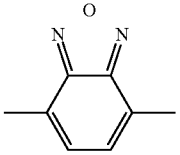
311
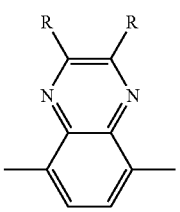
312
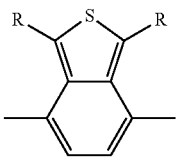
313
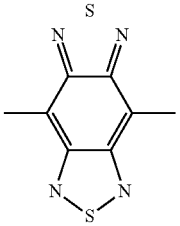
314
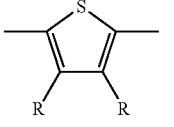
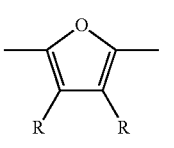
315

-continued

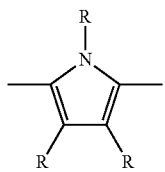
316

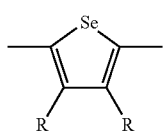
317

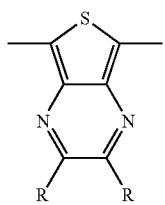
318

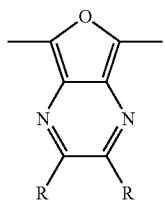
319

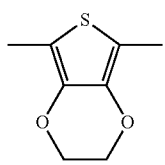
320

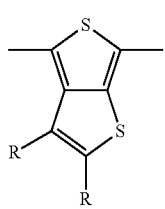
321

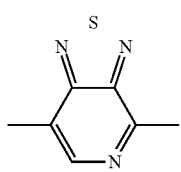
322

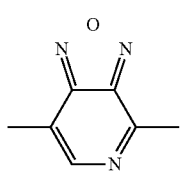
323

In formula 301 to formula 323, R represents the same meaning as described above.

When the polymer compound of the present invention is used as a material for a photoelectric conversion device, from the view point of improving the photoelectric conversion efficiency, among formula 1 to formula 152, formula 201 to formula 238, and formula 301 to formula 323, the groups represented by formula 1, formula 5, formula 7, formula 8, formula 12, formula 14, formula 15, formula 25, formula 35, formula 39, formula 41, formula 49, formula 50, formula 54, formula 60, formula 62, formula 63, formula 67, formula 73, formula 75, formula 76, formula 80, formula 86, formula 101, formula 106, formula 112, formula 114, formula 119, formula 125, formula 127, formula 132, formula 138, formula 140, formula 145, formula 151, formula 215, formula 218, formula 229, formula 230, formula 234, formula 309, formula 310, formula 311, formula 312, formula 313, formula 314, formula 318, formula 321, formula 322 and formula 323 are preferred, and the groups represented by formula 1, formula 8, formula 15, formula 25, formula 35, formula 49, formula 62, formula 75, formula 101, formula 114, formula 127, formula 140, formula 215, formula 234, formula 309, formula 310, formula 311, formula 314, formula 321, formula 322 and formula 323 are more preferred, and the groups represented by formula 75, formula 309, formula 314, formula 322 and formula 323 are further preferred, and the group represented by formula 75 is particularly preferred.

When the polymer compound of the present invention is used in an organic thin film transistor, from the view point of improving the hole mobility, among the groups represented by formula 1 to formula 152, formula 201 to formula 238 and formula 301 to formula 323, the groups represented by formula 1, formula 8, formula 25, formula 35, formula 49, formula 54, formula 62, formula 67, formula 75, formula 80, formula 101, formula 114, formula 201, formula 202, formula 203, formula 204, formula 205, formula 206, formula 207, formula 208, formula 209, formula 210, formula 215, formula 216, formula 217, formula 218, formula 219, formula 220, formula 221, formula 222, formula 229, formula 230, formula 231, formula 232, formula 233, formula 235, formula 236, formula 237, formula 238, formula 309, formula 310, formula 311, formula 312, formula 313, formula 314, formula 318, formula 319, formula 322 and formula 323 are preferred, and the groups represented by formula 25, formula 75, formula 80, formula 114, formula 203, formula 204, formula 207, formula 208, formula 215, formula 216, formula 217, formula 218, formula 219, formula 220, formula 232, formula 233, formula 235, formula 236, formula 309, formula 314 and formula 322 are more preferred, and the groups represented by formula 75, formula 114, formula 204, formula 208, formula 215, formula 216, formula 217, formula 232, formula 236, formula 309 and formula 314 are further preferred, and the group represented by formula 75 is particularly preferred.

The polymer compound of the present invention may have a group that two or more types of structural units represented by formula (D-1) to formula (D-5) are bound. As the group, for example, groups represented formula 401 to formula 414 are recited.

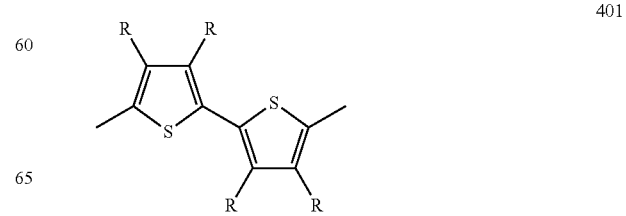
401

-continued

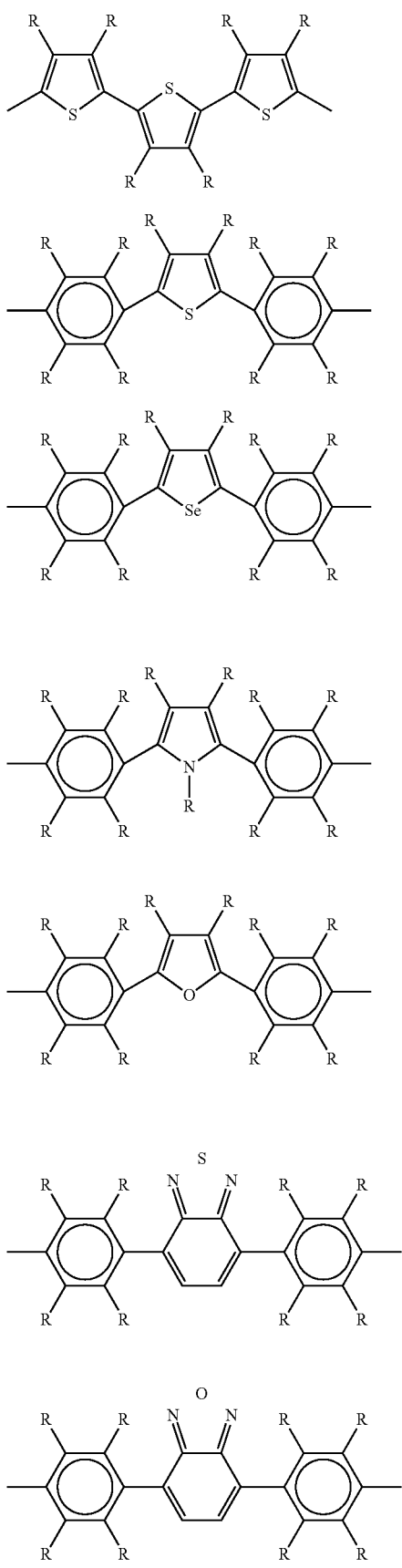

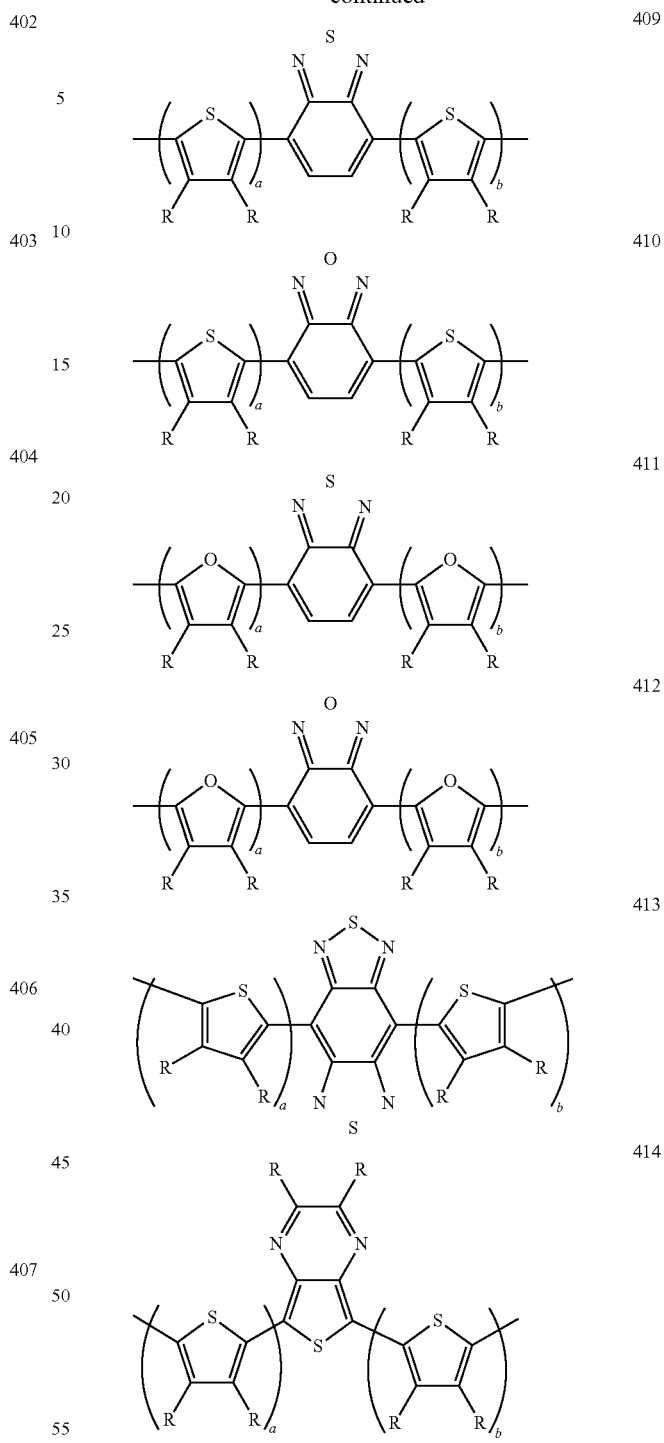

In formula 401 to formula 414, a and b are the same or different and represent an integer of 1 to 5. They are preferably 1 to 3, and particularly preferably 1. In formula 401 to formula 414, R represents the same meaning as described above.

When the polymer of the present invention is used as a material for a photoelectric conversion device, from the view point of improving the photoelectric conversion efficiency, among the groups represented by formula 401 to formula 414, the groups represented by formula 401, formula 402, formula 409, formula 410, formula 411, formula 412, formula 413 and formula 414 are preferred, and the groups represented by formula 401, formula 409, formula 413 and formula 414 are more preferred, and the groups represented by formula 401 and formula 409 are particularly preferred.

One preferred aspect of $Ar^1$ is an aromatic heterocyclic group having a thiophene ring.

When the polymer compound of the present invention has the structural unit represented by formula (2), from the view point of improving the solubility of the polymer compound of the present invention in a solvent, a ratio between the number of structural units represented by formula (1) and the number structural units represented by formula (2) in the polymer compound of the present invention is preferably 0.10 to 0.80, more preferably 0.15 to 0.60, and particularly preferably 0.20 to 0.50 by a numerical value of S represented by the following formula.

$S$=(Number of structural units represented by formula (1))/{(Number of structural units represented by formula (1))+(Number of structural units represented by formula (2))}

The polymer compound in the present invention refers to a compound having a number average molecular weight in terms of polystyrene measured by gel permeation chromatography (hereinafter, also referred to as GPC) of 2000 or more. A number average molecular weight in terms of polystyrene of the polymer compound of the present invention is preferably 2000 to 1000000, more preferably 2500 to 1000000, and particularly preferably 3000 to 100000.

The number of structural unit represented by formula (1) contained in the polymer compound of the present invention should be at least one. Preferably two on average, and more preferably three on average structural units represented by formula (1) per one polymer chain are contained in the polymer compound.

When the polymer compound of the present invention is used in a device, higher solubility in a solvent is desired from the view point of easiness of production of the device. Specifically, the polymer compound of the present invention preferably has such a solubility that allows production of a solution containing 0.01 weight (wt) % or more of the polymer compound, more preferably has such a solubility that allows production of a solution containing 0.1 wt % or more, and further preferably has such a solubility that allows production of a solution containing 0.4 wt % or more.

The polymer compound of the present invention is preferably a π conjugated polymer compound. A π conjugated polymer compound refers to a polymer compound including multiple bonds intervened by one single bond in a main chain.

A production method of the polymer compound of the present invention is not particularly limited, however, from easiness of synthesis of the polymer compound, a method using Suzuki coupling reaction or Stille coupling reaction is preferred.

As a method using Suzuki coupling reaction, for example, a production method including the step of reacting one or more types of compound represented by formula (100):

$$Q^{\phi}\text{-}E^1\text{-}Q^{200} \qquad (100)$$

[wherein, $E^1$ represents a bivalent group containing an aromatic ring. $Q^{100}$ and $Q^{200}$ are the same or different and represent a dihydroxyboryl group or a boric acid ester residue.] with one or more types of compound represented by formula (200):

$$T^1\text{-}E^2\text{-}T^2 \qquad (200)$$

[wherein, $E^2$ represents a structural unit represented by formula (1). $T^1$ and $T^2$ are the same or different and represent a halogen atom, or a sulfonic acid residue.] in the present of a palladium catalyst and a base is recited. As $E^1$, an arylene group and a heteroarylene group are preferred, and the aforementioned groups represented by formula 1 to formula 255 are more preferred.

In this case, it is preferred that the total molar number of one or more types of compounds represented by formula (200) used in the reaction is excessive to the total molar number of one or more types of compounds represented by formula (100). When the total molar number of one or more types of compounds represented by formula (200) used in the reaction is taken as 1 mol, the total molar number of one or more types of compounds represented by formula (100) is preferably 0.6 to 0.99 mol, and more preferably 0.7 to 0.95 mol.

A boric acid ester residue means a group excluding a hydroxyl group from boric acid diester, and a dialkyl ester residue, a diaryl ester residue, a di(arylalkyl) ester residue and so on are recited. Specific examples of boric acid ester residue include the groups represented by the following formulas:

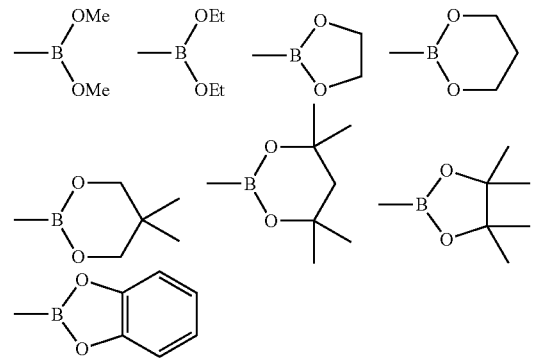

(wherein, Me represents a methyl group, and Et represents an ethyl group.).

As a halogen atom represented by $T^1$ and $T^2$ in formula (200), a fluorine atom, a chlorine atom, a bromine atom and an iodine atom are recited. From the easiness of synthesis of the polymer compound, a bromine atom or an iodine atom are preferred, and a bromine atom is more preferred.

A sulfonic acid residue represented by $T^1$ and $T^2$ in formula (200) means an atomic group that acidic hydrogen is removed from sulfonic acid ($-SO_3H$), and specific examples include an alkyl sulfonate group (for example, a methanesulfonate group, an ethanesulfonate group), an aryl sulfonate group (for example, a benzene sulfonate group, an p-toluene sulfonate group), an arylalkylsulfonate group (for example, a benzyl sulfonate group) and a trifluoromethanesulfonate group.

As a specific method for conducting Suzuki coupling reaction, a method of reacting in an arbitrary solvent in the presence of a base using a palladium catalyst as a catalyst is recited.

As a palladium catalyst used in Suzuki coupling reaction, for example, Pd (0) catalysts and Pd (II) catalysts are recited, and specific examples include palladium[tetrakis(triphenylphosphine)], palladium acetates, dichlorobis(triphenylphosphine)palladium, palladium acetate, tris(dibenzylideneacetone)dipalladium and bis(didibenzylideneacetone) palladium, and from the view points of easiness of reaction (polymerization) operation and reaction (polymerization) rate, dichlorobis(triphenylphosphine)palladium, palladium acetate and tris(dibenzylideneacetone)dipalladium are preferred.

An adding amount of palladium catalyst is not particularly limited, and may be an effective amount as a catalyst, and is typically 0.0001 mol to 0.5 mol, and preferably 0.0003 mol to 0.1 mol based on 1 mol of the compound represented by formula (100).

When palladium acetates is used as a palladium catalyst used in Suzuki coupling reaction, for example, a phosphorus compound such as triphenylphosphine, tri(o-tolyl)phosphine or tri(o-methoxyphenyl)phosphine may be added as a ligand. In this case, the adding amount of the ligand is typically 0.5 mol to 100 mol, and preferably 0.9 mol to 20 mol, and more preferably 1 mol to 10 mol based on 1 mol of the palladium catalyst.

As a base used in Suzuki coupling reaction, inorganic bases such as potassium carbonate, sodium carbonate, barium hydroxide and cesium fluoride, and organic bases such as triethylamine and tributylamine can be recited.

An adding amount of base is typically 0.5 mol to 100 mol, preferably 0.9 mol to 20 mol, and more preferably 1 mol to 10 mol based on 1 mol of the compound represented by formula (100).

Suzuki coupling reaction is typically conducted in a solvent. The solvent is exemplified by N,N-dimethylformamide, toluene, dimethoxyethane and tetrahydrofuran. From the view point of solubility of the polymer compound used in the present invention, toluene and tetrahydrofuran are preferred. The base may be added in the form of an aqueous solution, and the reaction may be conducted in a two-phase system. When an inorganic salt is used as the base, it is typically added in the form of an aqueous solution and allowed to react from the view point of solubility of the inorganic salt.

When the base is added in the form of an aqueous solution, and the reaction is conducted in a two-phase system, a phase transfer catalyst such as a quaternary ammonium salt may be added as is necessary.

Temperature at which Suzuki coupling reaction is conducted is typically about 50 to 160° C., and preferably 60 to 120° C. from the view point of increasing the molecular weight of the polymer compound although it depends on the aforementioned solvent. Also the temperature may be raised to near the boiling point of the solvent and refluxed. As to reaction time, the point of time when an intended degree of polymerization is achieved may be a terminal point, and it is typically about 0.1 hour to 200 hours. About 1 hour to 30 hours is efficient and preferable.

Suzuki coupling reaction is conducted in a reaction system that will not deactivate Pd (0) catalyst in an inert atmosphere of argon gas, nitrogen gas or the like. For example, it is conducted in a system that is sufficiently deaerated with argon gas, nitrogen gas or the like. Specifically, after deaerating the interior of a polymerization vessel (reaction system) by sufficiently substituting with nitrogen gas, the polymerization vessel is charged with the compound represented by formula (100), the compound represented by formula (200) and dichlorobis(triphenylphosphine)palladium (II), and after further deaerating the polymerization vessel by sufficiently substituting with nitrogen gas, a solvent such as toluene that is preliminarily deaerated by bubbling with nitrogen gas, is added, and then the resultant solution is added dropwise with a base such as a sodium carbonate aqueous solution that is preliminarily deaerated by bubbling with nitrogen gas, and then the temperature was raised by heating, and allowed to polymerize while the inert atmosphere is retained for 8 hours, for example, at a reflux temperature.

As a method using Stille coupling reaction, for example, a production method including the step of letting one or more types of compound represented by formula (300):

$$Q^{300}\text{-}E^3\text{-}Q^{400} \qquad (300)$$

[wherein, $E^3$ represents a bivalent group containing an aromatic ring. $Q^{300}$ and $Q^{400}$ are the same or different and represent a substituted stannyl group.], and at least one type of compound represented by formula (200) as described above react in the presence of a palladium catalyst is recited. As $E^3$, a bivalent aromatic group is preferred, and the aforementioned groups represented by formula 1 to formula 255 are further preferred.

A substituted titanyl group is a group represented by —$SnR^{100}{}_3$. Here, $R^{100}$ represents a monovalent organic group. As a monovalent organic group, an alkyl group, an aryl group and the like are recited.

The number of carbons in the alkyl group is typically 1 to 30, and specific examples include cyclic alkyl groups such as a methyl group, an ethyl group, a propyl group, an isopropyl group, a butyl group, an isobutyl group, a sec-butyl group, a tert-butyl group, a pentyl group, an isopentyl group, a 2-methylbutyl group, a 1-methylbutyl group, a hexyl group, an isohexyl group, a 3-methylpentyl group, a 2-methylpentyl group, a 1-methylpentyl group, a heptyl group, an octyl group, an isooctyl group, a 2-ethylhexyl group, a nonyl group, a decyl group, an undecyl group, a dodecyl group, a tetradecyl group, a hexadecyl group, an octadecyl group and an eicosyl group, and cyclic alkyl groups such as a cyclopentyl group, a cyclohexyl group and an adamantyl group. As an aryl group, a phenyl group, a naphthyl group and the like are recited. Preferred examples of substituted titanyl group include —$SnMe_3$, —$SnEt_3$, —$SnBu_3$ and —$SnPh_3$, and more preferred examples are —$SnMe_3$, —$SnEt_3$ and —$SnBu_3$. Here, Me represents a methyl group, Et represents an ethyl group, Bu represents a butyl group and Ph represents a phenyl group.

As a specific method for conducting Stille coupling reaction, a method of reacting in an arbitrary solvent under a palladium catalyst is recited.

As a palladium catalyst used in Stille coupling reaction, for example, Pd (0) catalysts and Pd (II) catalysts are recited, and specific examples include palladium palladium[tetrakis(triphenylphosphine)], palladium acetates, dichlorobis(triphenylphosphine)palladium, palladium acetate, tris(dibenzylideneacetone)dipalladium and bis(didibenzylideneacetone) palladium, and from the viewpoints of easiness of polymerization reaction operation and polymerization reaction rate, palladium[tetrakis(triphenylphosphine)] and tris(dibenzylideneacetone)dipalladium are preferred.

An adding amount of palladium catalyst used in Stille coupling reaction is not particularly limited, and may be an effective amount as a catalyst, and is typically 0.0001 mol to 0.5 mol, and preferably 0.0003 mol to 0.1 mol based on 1 mol of the compound represented by formula (100).

In Stille coupling reaction, a ligand and a promoter may be used as is necessary. As a ligand, for example, phosphorus compounds such as triphenylphosphine, tri(o-tolyl)phosphine, tri(o-methoxyphenyl)phosphine and tris(2-furyl)

phosphine, and arsenic compounds such as triphenylarsine and triphenoxyarsine are recited. As a promoter, copper iodide, copper bromide, copper chloride and Copper (I) 2-thenoate and the like are recited.

When a ligand or a promoter is used, an adding amount of the ligand or the promoter is typically 0.5 mol to 100 mol, preferably 0.9 mol to 20 mol, and more preferably 1 mol to 10 mol based on 1 mol of the palladium catalyst.

Stille coupling reaction is typically conducted in a solvent. As the solvent, N,N-dimethylformamide, N, N-dimethylacetamide, toluene, dimethoxyethane, tetrahydrofuran and the like are recited. From the view point of solubility of the polymer compound used in the present invention, toluene and tetrahydrofuran are preferred.

Temperature at which Stille coupling reaction is conducted is typically about 50 to 160° C., and preferably 60 to 120° C. from the view point of increasing the molecular weight of the polymer compound although it depends on the aforementioned solvent. Also the temperature may be raised to near the boiling point of the solvent and refluxed.

As to reaction time, the point of time when an intended degree of polymerization is achieved may be a terminal point, and it is typically about 0.1 hour to 200 hours. About 1 hour to 30 hours is efficient and preferable.

Stille coupling reaction is conducted in a reaction system that will not deactivate Pd (0) catalyst in an inert atmosphere of argon gas, nitrogen gas or the like. For example, it is conducted in a system that is sufficiently deaerated with argon gas, nitrogen gas or the like. Specifically, after deaerating the interior of a polymerization vessel (reaction system) by sufficiently substituting with nitrogen gas, the polymerization vessel is charged with the compound represented by formula (300), the compound represented by formula (200) and a palladium catalyst, and after further deaerating the polymerization vessel by sufficiently substituting with nitrogen gas, a solvent such as toluene that is preliminarily deaerated by bubbling with nitrogen gas, is added, and then a ligand or a promoter is as is necessary, and then the temperature was raised by heating, and allowed to polymerize while the inert atmosphere is retained for 8 hours, for example, at a reflux temperature.

A terminal group of the polymer compound of the present invention is preferably protected with a stable group because when a group that is active in polymerization reaction as represented by $Q^{100}$ to $Q^{400}$, $T^1$, $T^2$ remains, the characteristics and the service life can be deteriorated when used in production of a device. As such a stable group, a group having a conjugated bond continuous to a conjugated structure of a main chain is preferred. The stable group may have a structure bound to an aromatic ring via a vinylene group. As such a stable group, a phenyl group, a naphthyl group, a methyl group, an ethyl group, a propyl group, a butyl group, a trifluoromethyl group, a pentafluoroethyl group and the like are recited.

As to an amount of metal element contained in the polymer compound of the present invention, the smaller amount is preferred because photoelectric conversion efficiency and hole mobility are improved. Among others, it is preferred that an amount of transition metal element contained in the polymer compound of the present invention is small. As a transition metal element, palladium, iron, tin, nickel and copper are recited. Among these, it is preferred that the amounts of palladium, iron and tin are small. An amount of impurity contained in the polymer compound of the present invention is measured by an elementary analysis, and a total amount of palladium, iron and tin is preferably 1000 ppm or less, more preferably 500 ppm or less, further preferably 100 ppm or less, and particularly preferably 30 ppm or less.

As a method of elementary analysis, atomic absorption spectroscopy, light emission spectral analysis, plasma light emission analysis, fluorescent X-ray analysis, plasma mass spectrometry, glow discharge mass spectrometry, and ion chromatograph analysis and so on are recited.

While the polymer compound of the present invention is featured by having a structural unit represented by formula (1), the polymer compound can be synthesized, for example, by using a compound represented by formula (3):

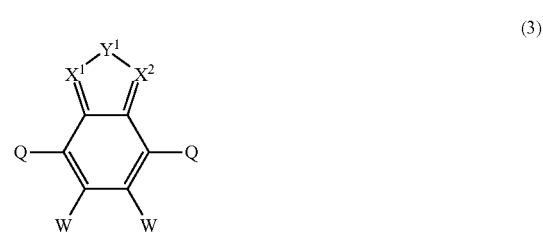

[wherein, $X^1$ and $X^2$ are the same or different and represent a nitrogen atom or =CH—. $Y^1$ represents a sulfur atom, an oxygen atom, a selenium atom, —N($R^1$)— or —$CR^2$=$CR^3$—. $R^1$, $R^2$ and $R^3$ are the same or different and represent a hydrogen atom or a substituent. W represents a hydrogen atom, a cyano group, a monovalent organic group having a fluorine atom or a fluorine atom. Two Ws may be the same or different. However, at least one W is a cyano group, a monovalent organic group having a fluorine atom or a fluorine atom. Q represents a hydrogen atom, a halogen atom, a dihydroxyboryl group or a monovalent organic group. There are two Qs which may be the same or different.] as one starting material.

In formula (3), it is preferred that at least one of $X^1$ and $X^2$ is a nitrogen atom, and it is more preferred that both $X^1$ and $X^2$ are a nitrogen atom.

In formula (3), $Y^1$ is preferably a sulfur atom, an oxygen atom, —N($R^1$)— or —$CR^2$=$CR^3$—, more preferably a sulfur atom, an oxygen atom or —$CR^2$=$CR^3$—, and further preferably a sulfur atom or —$CR^2$=$CR^3$—.

As a monovalent organic group represented by Q, an alkyl group, an alkoxy group, an alkylthio group, an aryl group, an aryloxy group, an arylthio group, an arylalkyl group, an arylalkoxy group, an arylalkylthio group, an acyl group, an acyloxy group, an amido group, an imido group, an amino group, a substituted amino group, a substituted silyl group, a substituted silyloxy group, a substituted silylthio group, a substituted silylamino group, a heterocyclic group, a heterocyclyloxy group, a heterocyclylthio group, an arylalkenyl group, an arylalkynyl group, an boric acid ester residue and a substituted stannyl group are recited.

Definitions and specific examples of alkyl group, alkoxy group, alkylthio group, aryl group, aryloxy group, arylthio group, arylalkyl group, arylalkoxy group, arylalkylthio group, acyl group, acyloxy group, amido group, imido group, amino group, substituted amino group, substituted silyl group, substituted silyloxy group, substituted silylthio group, substituted silylamino group, heterocyclic group, heterocyclyloxy group, heterocyclylthio group, arylalkenyl group and arylalkynyl group are as same as the definitions and specific examples described for the aforementioned $R^1$. Definitions and specific examples of a boric acid ester residue and a substituted stannyl group are as same as the definitions and specific examples described in the aforementioned $Q^{100}$.

As a halogen atom represented by Q, a fluorine atom, a chlorine atom, a bromine atom and an iodine atom are recited.

Q is preferably a bromine atom, a dihydroxyboryl group, a boric acid ester residue, a substituted stannyl group and a substituted silyl group are preferred, a bromine atom, a dihydroxyboryl group and a boric acid ester residue are more preferred, and a bromine atom is particularly preferred.

In formula (3), specific examples of monovalent organic group having a fluorine atom represented by W are as same as specific examples of monovalent organic group having a fluorine atom represented by $W^1$.

As the compound represented by formula (3), compounds represented by formula 501 to formula 652 are recited.

501

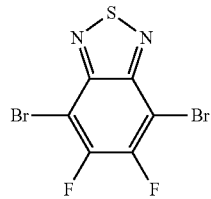

502

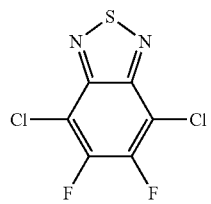

503

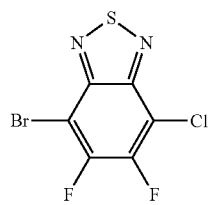

504

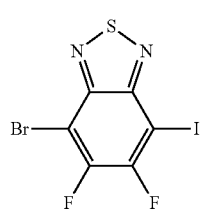

505

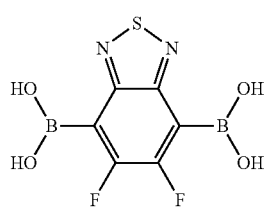

506

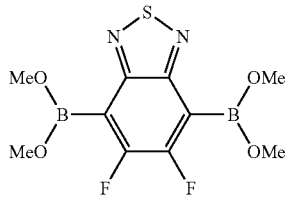

507

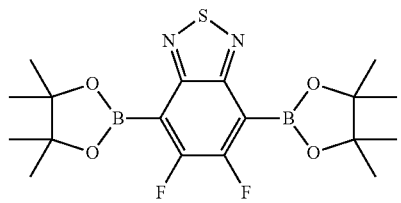

508

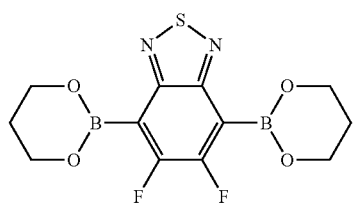

509

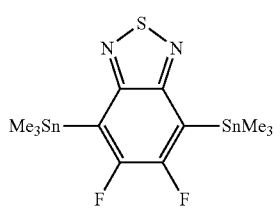

510

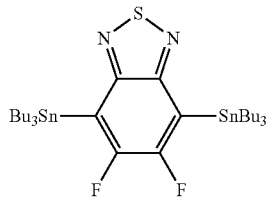

511

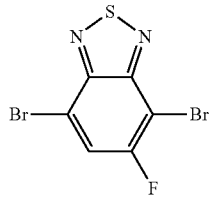

512

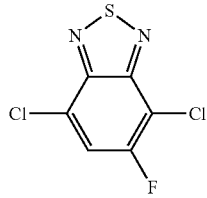

| 513 | 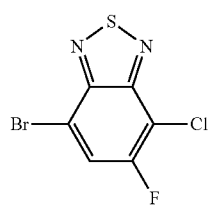 | 520 | 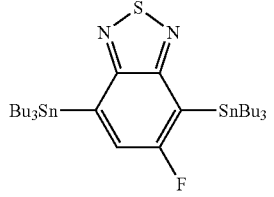 |
| 514 | 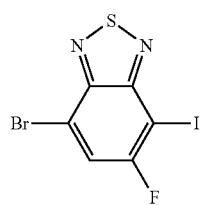 | 521 | 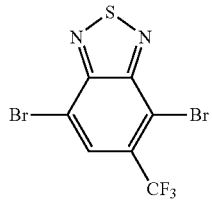 |
| 515 | 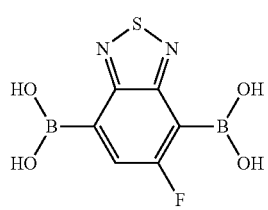 | 522 | 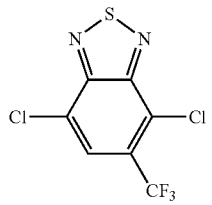 |
| 516 | 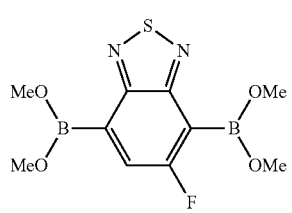 | 523 | 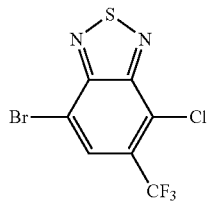 |
| 517 | 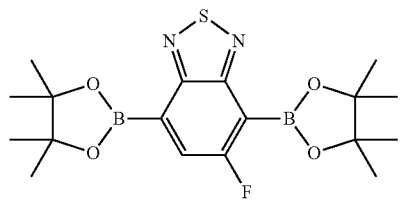 | 524 | 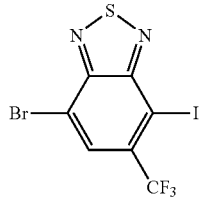 |
| 518 | 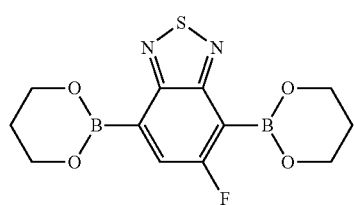 | 525 | 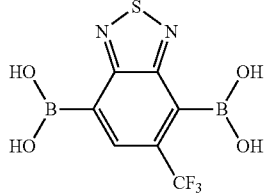 |
| 519 | 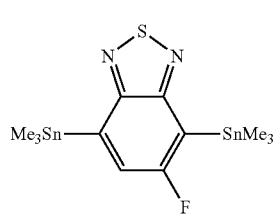 | 526 | 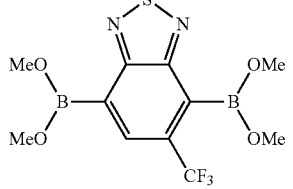 |

527 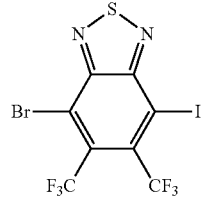
528 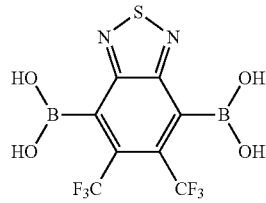
529 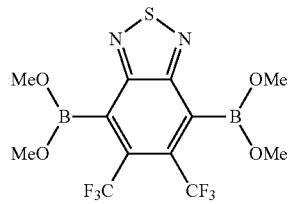
530 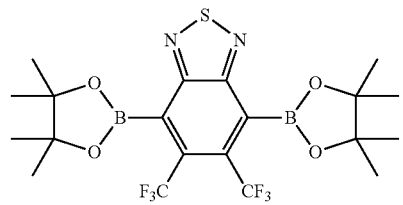
531 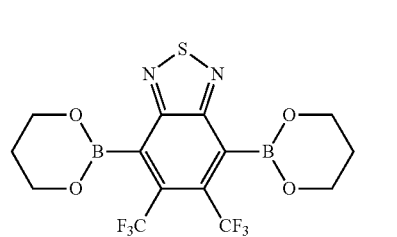
532 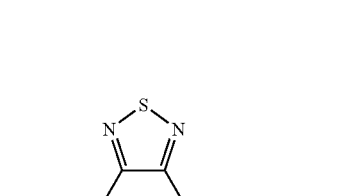
533 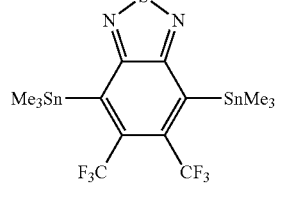
534
535
536
537
538
539
540
-continued
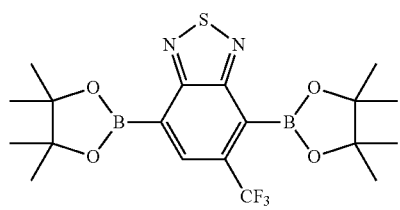
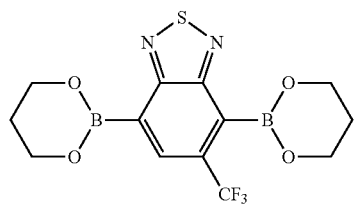
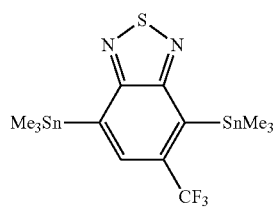
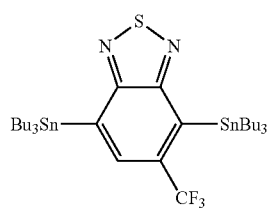
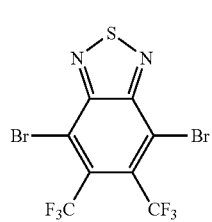
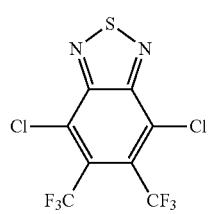
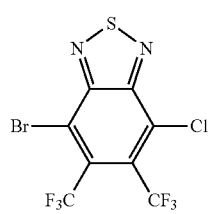

541 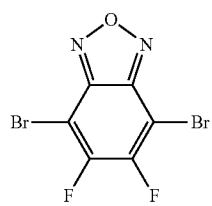
542 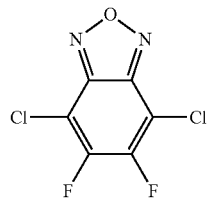
543 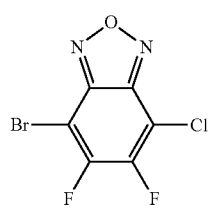
544 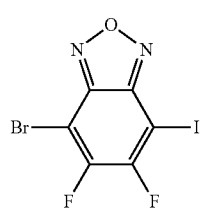
545 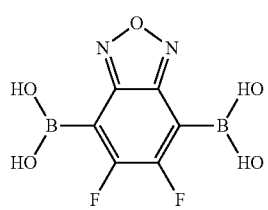
546 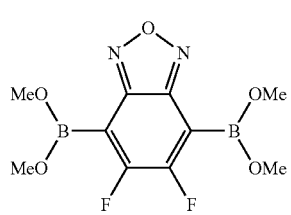
547 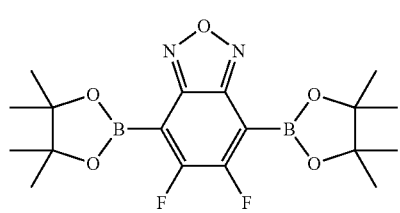
548 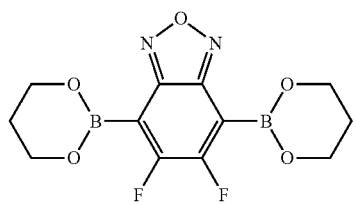
549 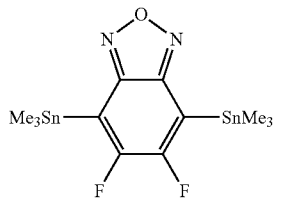
550 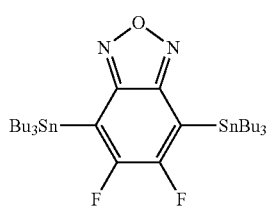
551 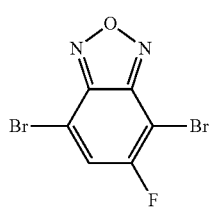
552 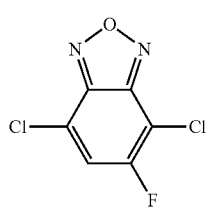
553 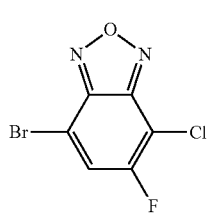
554 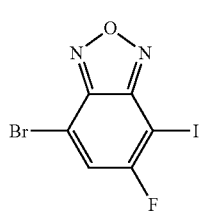

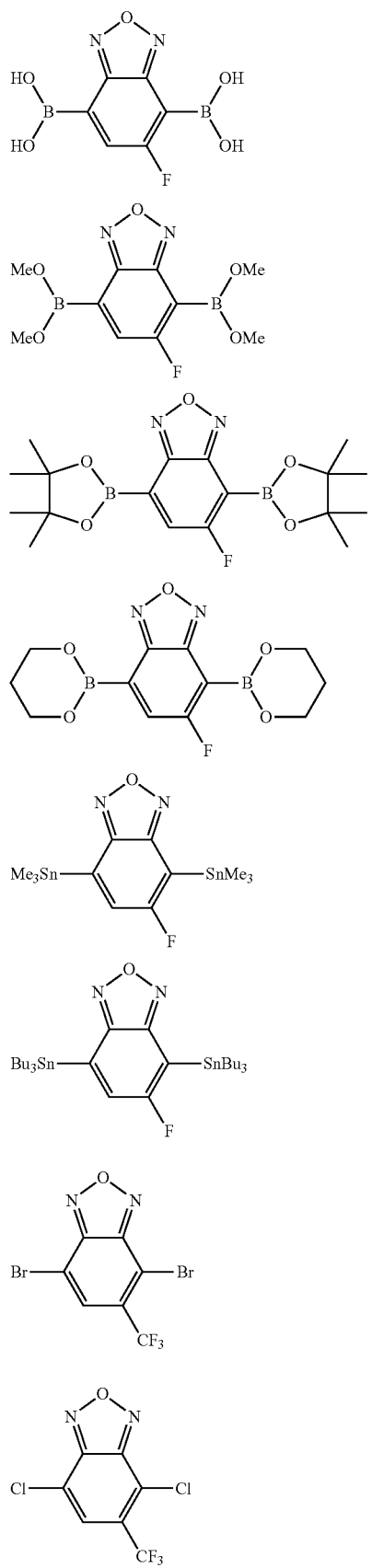
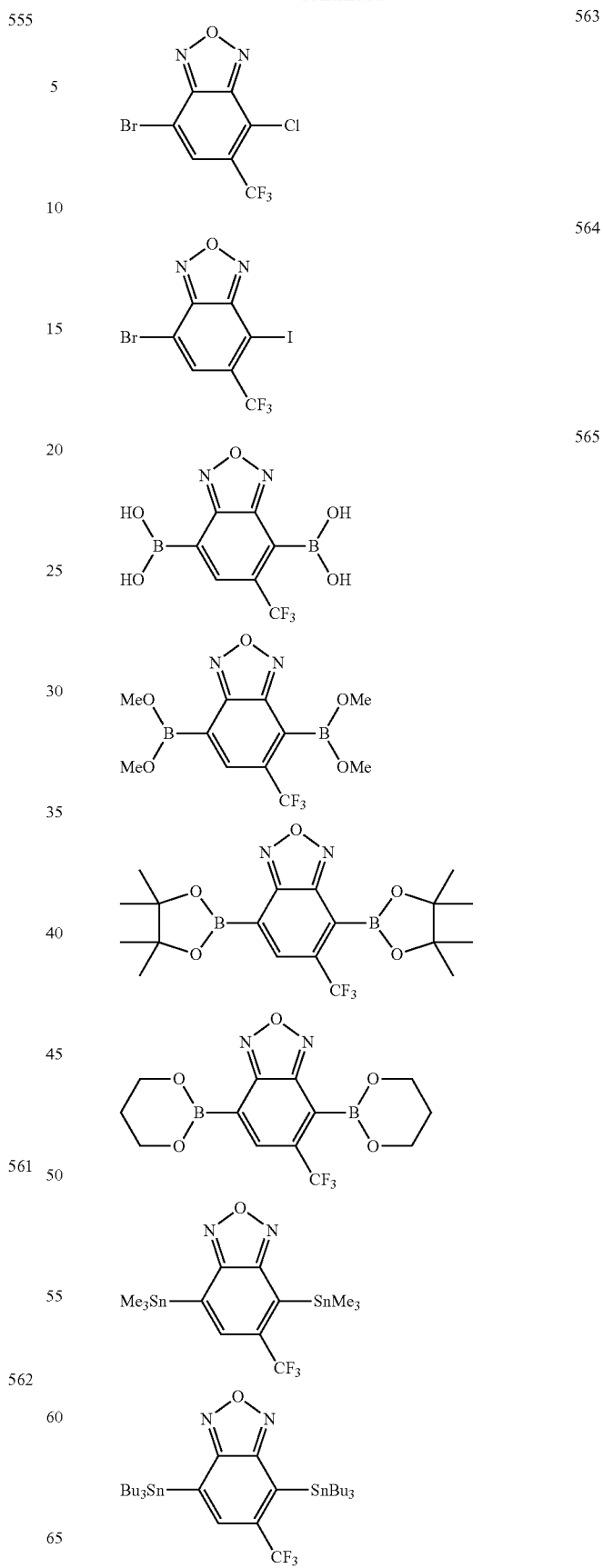

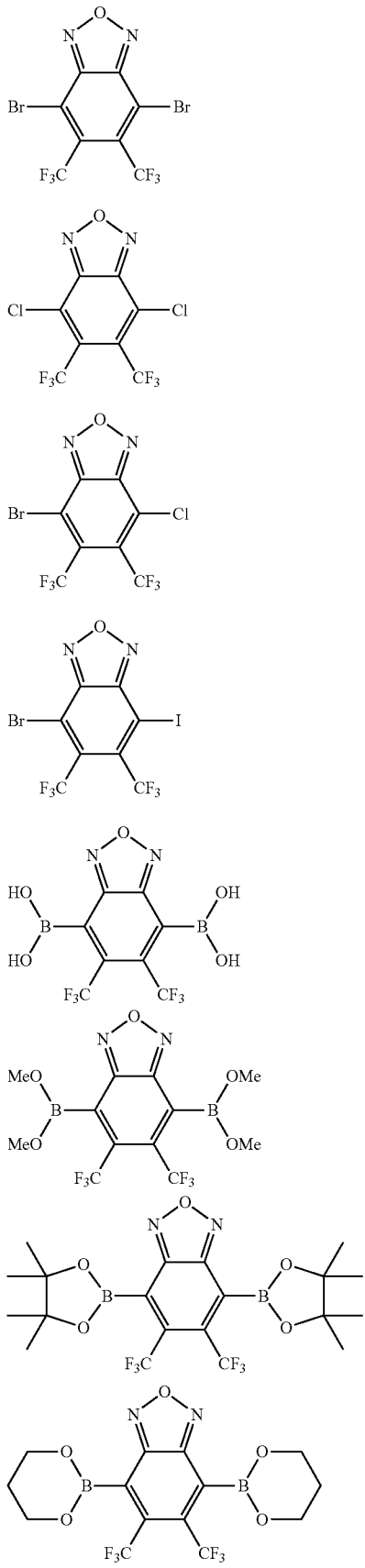
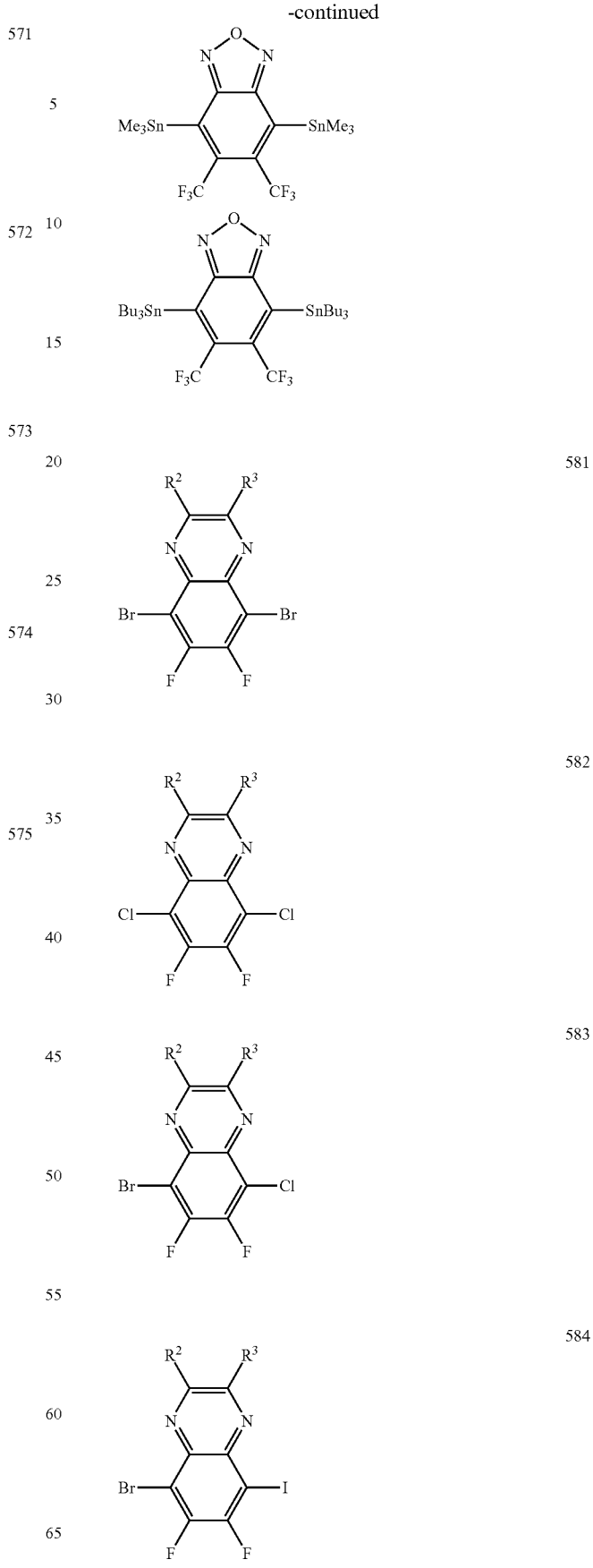

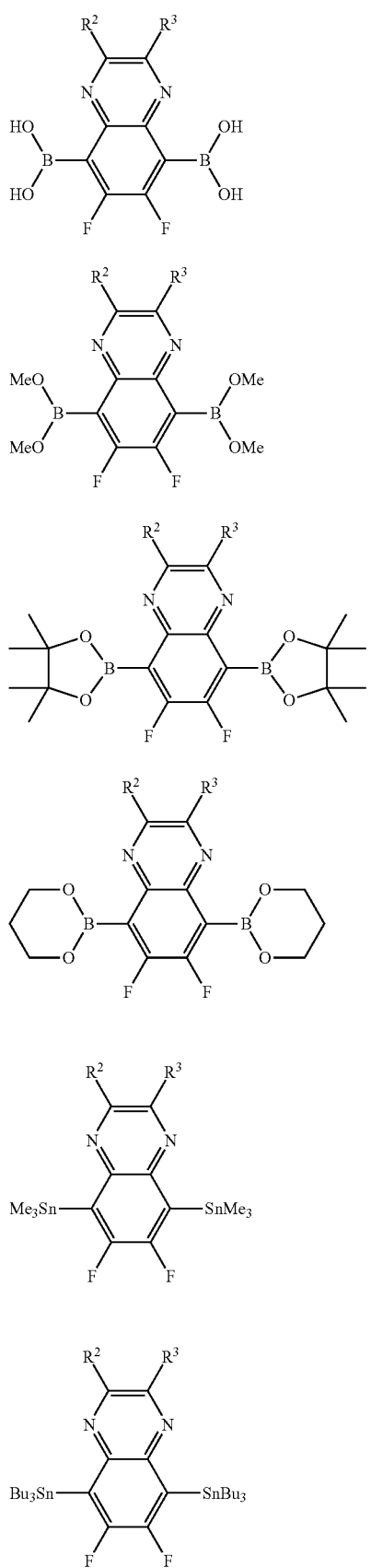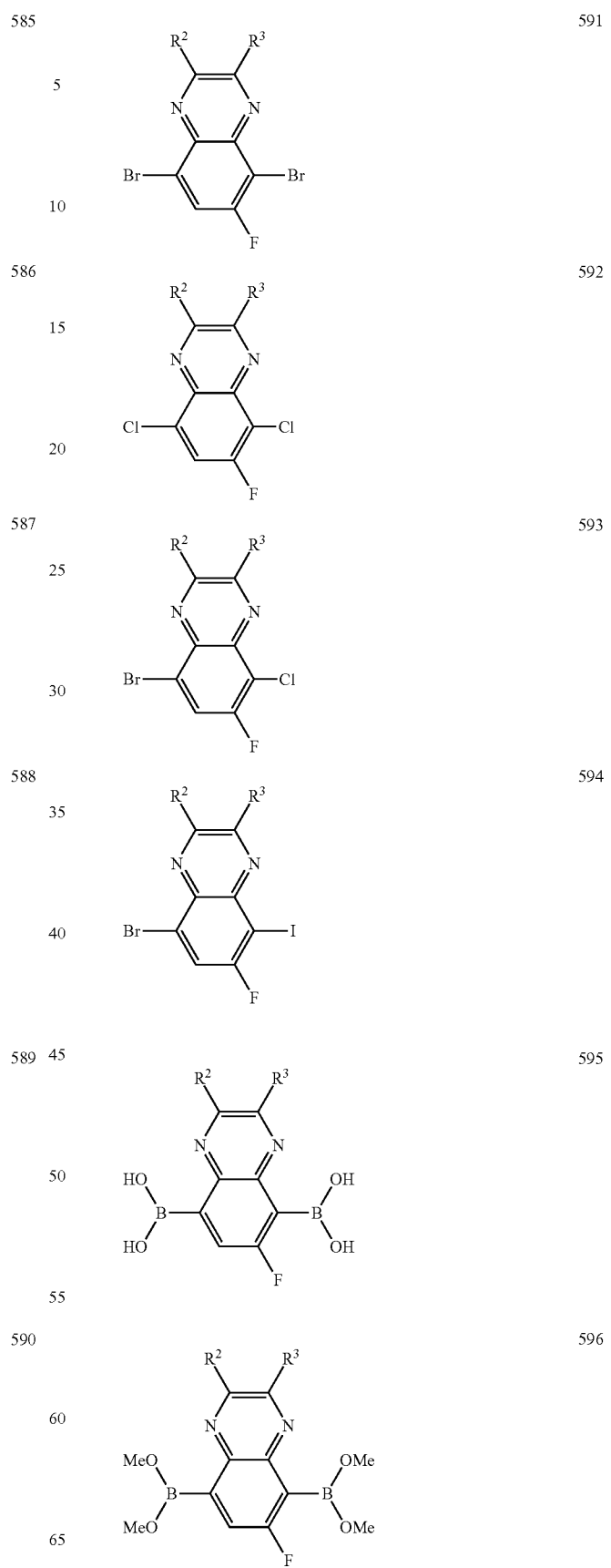

597 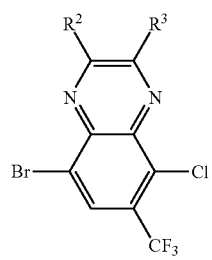
598 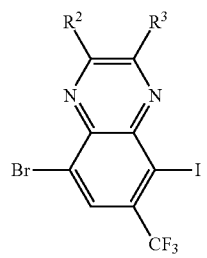
599 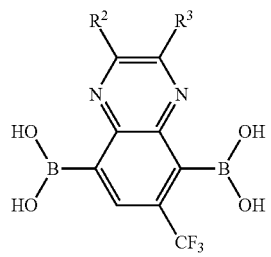
600 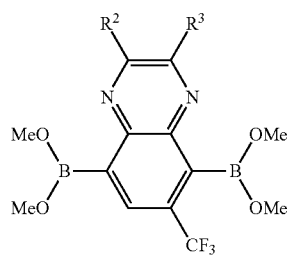
601 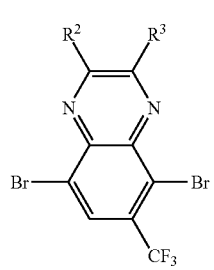
602 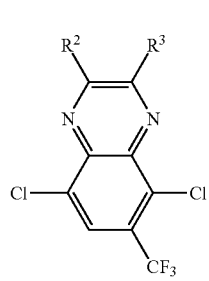
603 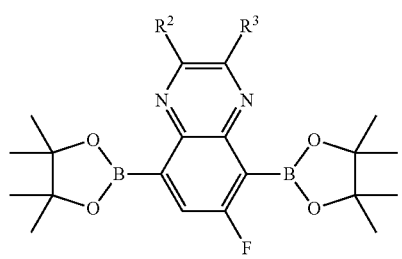
604 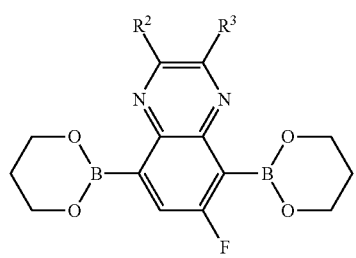
605 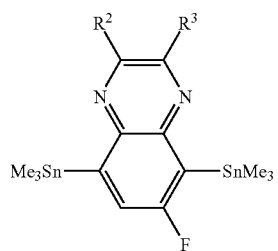
606 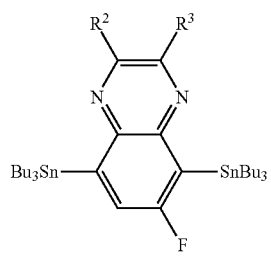
607 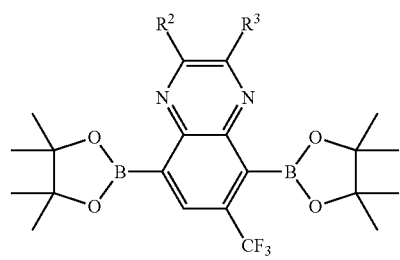
608 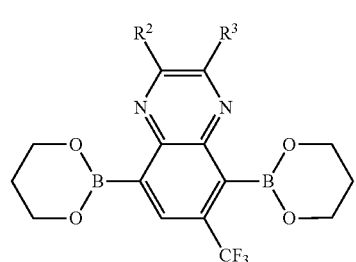

609
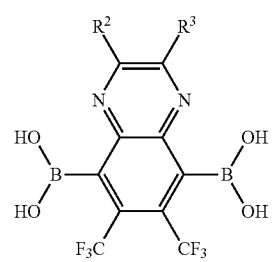
610
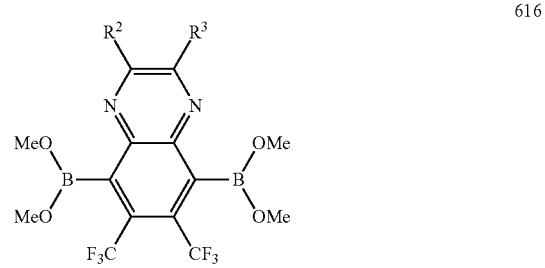
611
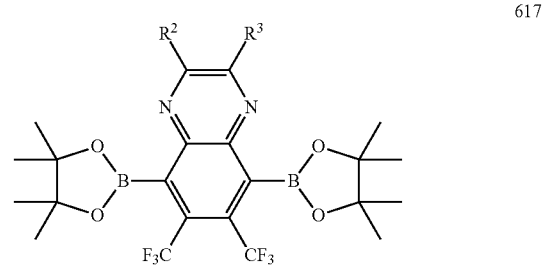
612
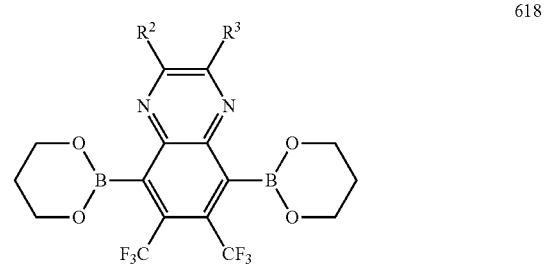
613
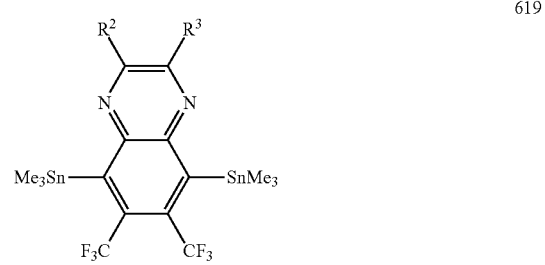
614
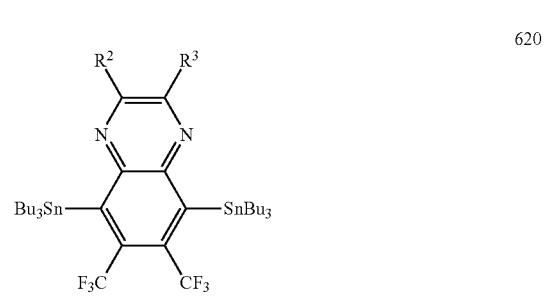
615
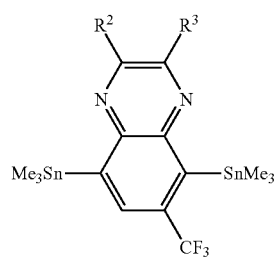
616
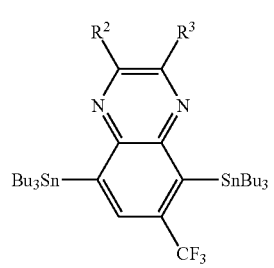
617
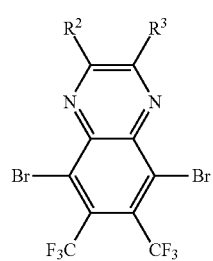
618
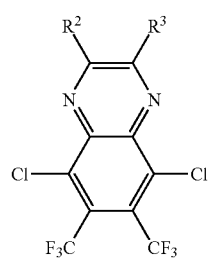
619
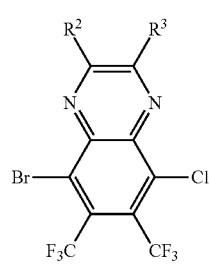
620
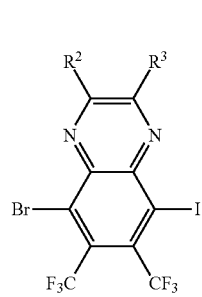

621 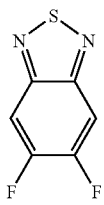
622 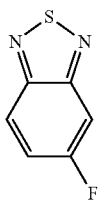
623 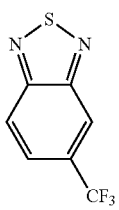
624 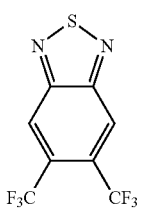
625 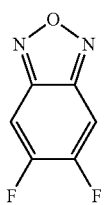
626 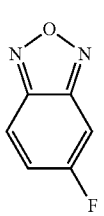
627 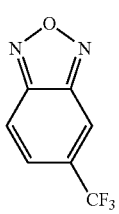
628 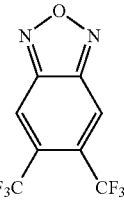
629 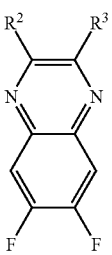
630 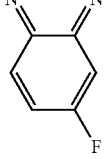
631 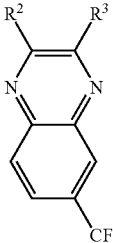
632 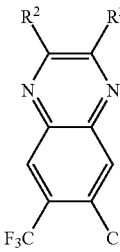
633 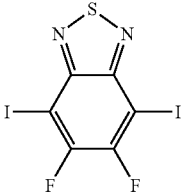

634
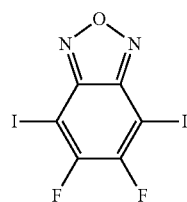
635
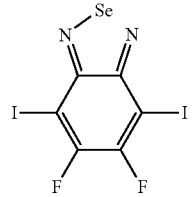
636
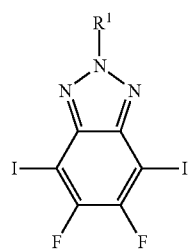
637
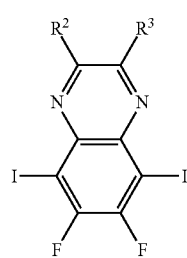
638
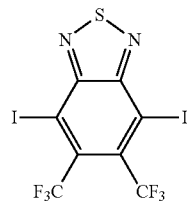
639
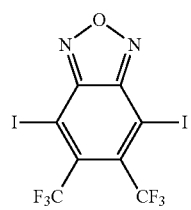
640
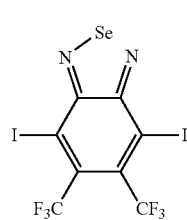
641
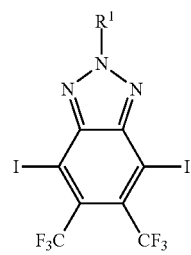
642
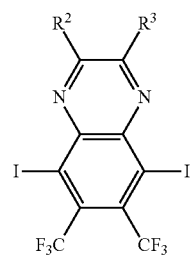
643
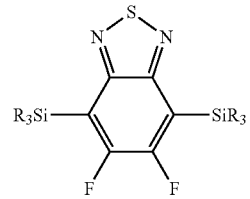
644
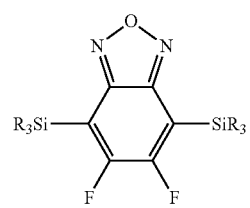
645
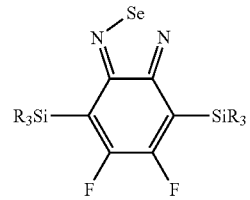
646
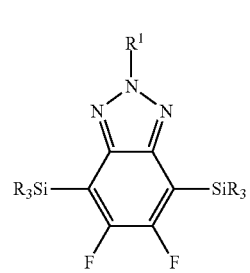

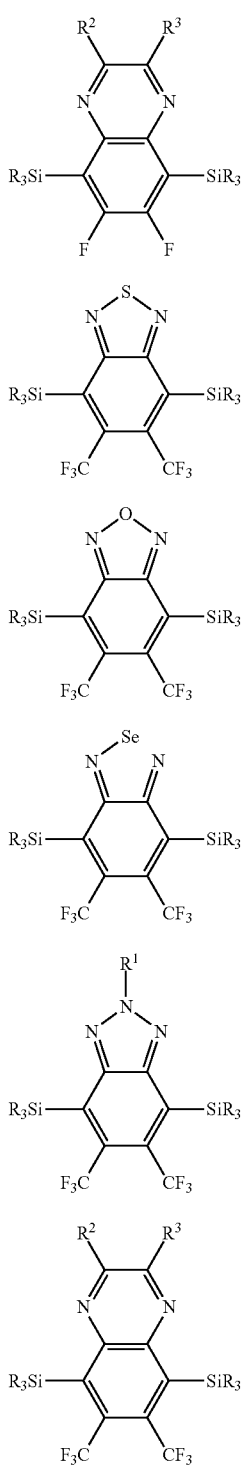

647

648

649

650

651

652

In formula 501 to formula 652, R, $R^1$, $R^2$ and $R^3$ represent the same meanings as described above.

Among the compounds represented by formula 501 to formula 652, from the view point of improving the photoelectric conversion efficiency of a photoelectric conversion device containing a polymerized polymer compound, formula 501 to formula 510, formula 531 to formula 550, formula 571 to formula 590, formula 611 to formula 620, formula 621, formula 624, formula 625, formula 628, formula 629, formula 632, formula 633 to 642, and formula 643 to 652 are preferred. Further preferred are the compounds represented by formula 501 to formula 510, formula 541 to formula 550, formula 581 to formula 590, formula 621, formula 625, formula 629, formula 633 to formula 637, and formulas 643 to 652. Further preferred are the compounds represented by formula 501, formula 507, formula 541, formula 547, formula 581, formula 587, formula 621, formula 634 and formula 643. From the easiness of synthesis, the compounds represented by formula 501, formula 507, formula 541, formula 581, formula 634 and formula 643 are preferred.

Among the compounds represented by formula (3), a compound represented by formula (3C):

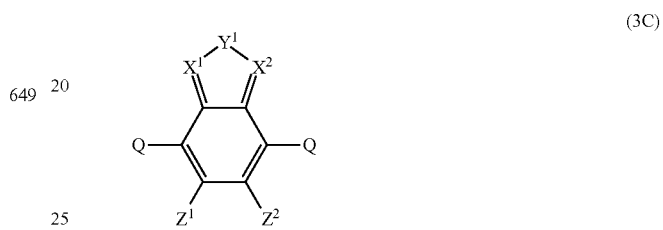

[wherein, $X^1$, $X^2$, $Y^1$ and Q represent the same meanings as described above. $Z^1$ and $Z^2$ are the same or different and represent a monovalent organic group having a fluorine atom or a fluorine atom.]

is more preferred.

In formula (3C), specific examples of monovalent organic group having a fluorine atom represented by $Z^1$ and $Z^2$ are as same as the specific examples of monovalent organic group having a fluorine atom represented by $W^1$.

One aspect of the compound represented by formula (3C) is a compound represented by formula (3a):

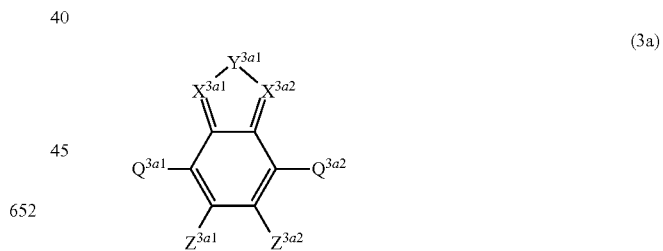

In formula (3a), $X^{3a1}$ and $X^{3a2}$ are the same or different and represent a nitrogen atom or =CH—. $Y^{3a1}$ represents a sulfur atom. $Z^{3a1}$ and $Z^{3a2}$ are the same or different and represent a monovalent organic group having a fluorine atom or a fluorine atom. $Q^{3a1}$ and $Q^{3a2}$ are the same or different and represent a hydrogen atom, a dihydroxyboryl group or a monovalent organic group.

In formula (3a), specific examples of monovalent organic group having a fluorine atom represented by $Z^{3a1}$ and $Z^{3a2}$ are as same the specific examples of monovalent organic group having a fluorine atom represented by $W^1$. Specific examples of monovalent organic group represented by $Q^{3a1}$ and $Q^{3a2}$ are as same as the specific examples of monovalent organic group represented by Q.

One preferred aspect of $Q^{3a1}$ and $Q^{3a2}$ is a hydrogen atom. Other preferred forms of $Q^{3a1}$ and $Q^{3a2}$ are a dihydroxyboryl group, a boric acid ester residue, a substituted stannyl group, and a substituted silyl group. Among these, a boric acid ester residue and a substituted stannyl group are preferred.

Other aspect of compound represented by formula (3C) is a compound represented by formula (3b):

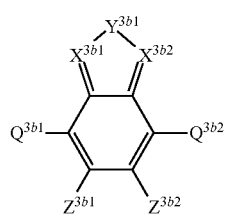

(3b)

In formula (3b), $X^{3b1}$ and $X^{3b2}$ are the same or different and represent a nitrogen atom or =CH—. $Y^{3b1}$ represents an oxygen atom, a selenium atom, —N(R$^1$)— or —CR$^2$=CR$^3$—. $R^1$, $R^2$ and $R^3$ represent the same meanings as described above. $Z^{3b1}$ and $Z^{3b2}$ are the same or different and represent a monovalent organic group having a fluorine atom or a fluorine atom. $Q^{3b1}$ represents a chlorine atom, a bromine atom, an iodine atom, a dihydroxyboryl group or a monovalent organic group. $Q^{3b2}$ represents a halogen atom, a dihydroxyboryl group or a monovalent organic group.

In formula (3b), specific examples of monovalent organic group having a fluorine atom represented by $Z^{3b1}$ and $Z^{3b2}$ are as same as the specific examples of monovalent organic group having a fluorine atom represented by $W^1$. Specific examples of monovalent organic group represented by $Q^{3b1}$ and $Q^{3b2}$ are as same as the specific examples of monovalent organic group represented by Q. As a halogen atom represented by $Q^{3b2}$, a fluorine atom, a chlorine atom, a bromine atom and an iodine atom are recited.

As $Q^{3b1}$ and $Q^{3b2}$, a chlorine atom, a bromine atom, an iodine atom, a dihydroxyboryl group, a boric acid ester residue, a substituted stannyl group and a substituted silyl group are preferred, a bromine atom, an iodine atom, a dihydroxyboryl group, a boric acid ester residue, a substituted stannyl group and a substituted silyl group are more preferred, and a bromine atom, an iodine atom, a boric acid ester residue and a substituted stannyl group are particularly preferred.

AS $Y^{3b1}$, an oxygen atom, a selenium atom and —CR$^2$=CR$^3$— are preferred, and an oxygen atom and —CR$^2$=CR$^3$— are more preferred.

As other aspect of compound represented by formula (3), a compound represented by formula (3D):

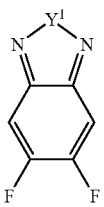

(3D)

[wherein, $X^1$, $X^2$, $Y^1$, $Z^1$ and $Z^2$ represent the same meanings as described above. $Q^1$ represents a hydrogen atom, a chlorine atom, a bromine atom, an iodine atom, a dihydroxyboryl group or a monovalent organic group. $Q^2$ represents a hydrogen atom, a halogen atom or a monovalent organic group.] is recited.

In formula (3D), specific examples of monovalent organic group represented by $Q^1$ and $Q^2$ are as same as the specific examples of monovalent organic group represented by Q. As a halogen atom represented by $Q^2$, a fluorine atom, a chlorine atom, a bromine atom and an iodine atom are recited.

A compound represented by formula (3-1):

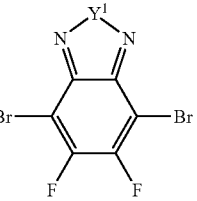

(3-1)

(wherein, $Y^1$ represents the same meaning as described above.) which is one aspect of the compound represented by formula (3) can be produced by brominating a compound represented by formula (3-2):

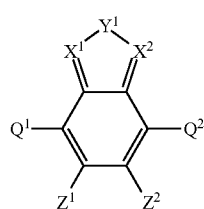

(3-2)

(wherein, $Y^1$ represents the same meaning as described above.).

For bromination, a known method may be used, and for example, a method of brominating in the absence of a solvent or in a solvent by using a brominating agent is recited.

When a solvent is used, as the solvent used in reaction, saturated hydrocarbons such as pentane, hexane, heptane, octane and cyclohexane, unsaturated hydrocarbons such as benzene, toluene, ethylbenzene and xylene, halogenated saturated hydrocarbons such as carbon tetrachloride, chloroform, dichloromethane, chlorobutane, bromobutane, chloropentane, bromopeptane, chlorohexane, bromohexane, chlorocyclohexane and bromocyclohexane, and halogenated unsaturated hydrocarbons such as chlorobenzene, dichlorobenzene and trichlorobenzene are recited.

As a brominating agent, bromine, N-bromosuccinimide (hereinafter, also referred to as NBS), carbon tetrachloride, hydrobromic acid and the like are recited. A plurality of these brominating agents may be used in combination. A use amount of the brominating agent is typically 2 to 100000 equivalents based on the number of moles of the compound represented by formula (3-2).

It is also possible to make a catalyst for promoting bromination coexist at the time of bromination. As a catalyst, metals such as iron, nickel and copper, metal halides such as iron halide, cobalt halide, nickel halide and copper halide, and radical generating agents such as benzoylperoxide and azoisobutyronitrile are recited. As a catalyst, metal and metal halide are preferred, and iron and iron bromide are more preferred. A use amount of the catalyst is typically 0.001 to 10 equivalents, and preferably 0.01 to 1 equivalent based on the number of moles of the compound represented by formula (3-2). Reaction temperature is typically −50 to 200° C., and preferably 0 to 150° C.

After reaction, the reaction is stopped, for example, by adding water and the product is extracted with an organic solvent, then an ordinary post treatment such as distilling off the solvent is conducted, and thus the compound represented by formula (3-1) can be obtained. Isolation and purification of product may be conducted by methods such as separation by chromatography or recrystallization.

Among the compound represented by formula (3-2), the compound wherein $Y^1$ is a sulfur atom can be produced, for example, by letting a compound represented by formula (3-3):

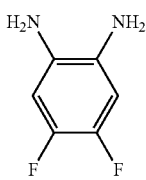

(3-3)

and thionyl chloride react.

A use amount of thionyl chloride is typically 1 to 100000 equivalents based on the number of moles of the compound represented by formula (3-3). Reaction temperature is typically −50 to 200° C., and preferably 0 to 150° C.

Reaction between thionyl chloride and the compound represented by formula (3-3) may be conducted in the absence of a solvent or in a solvent. When a solvent is used, as the solvent used in reaction, saturated hydrocarbons such as pentane, hexane, heptane, octane and cyclohexane, unsaturated hydrocarbons such as benzene, toluene, ethylbenzene and xylene, halogenated saturated hydrocarbons such as carbon tetrachloride, chloroform, dichloromethane, chlorobutane, bromobutane, chloropentane, bromopeptane, chlorohexane, bromohexane, chlorocyclohexane and bromocyclohexane, and halogenated unsaturated hydrocarbons such as chlorobenzene, dichlorobenzene and trichlorobenzene are recited.

In reacting the compound represented by formula (3-3) with thionyl chloride react, the reaction can be promoted by coexisting a basic compound coexist in the reaction. As a basic compound, trimethylamine, triethylamine, tributylamine, pyridine, quinoline, pyrazine and the like are recited. A use amount of the basic compound is typically 1 to 100000 equivalents, and preferably 2 to 10000 equivalents based on the number of moles of the compound represented by formula (3-3).

After reaction, the reaction is stopped, for example, by adding water and the product is extracted with an organic solvent, then an ordinary post treatment such as distilling off the solvent is conducted, and thus the compound represented by formula (3-2) can be obtained. Isolation and purification of product may be conducted by methods such as separation by chromatography or recrystallization.

Since the polymer compound of the present invention is able to exert high electron and/or hole transport performance, when an organic thin film containing the polymer compound is used in a device, it is possible to transport an electron or a hole injected from an electrode, or an electric charge generated by light absorption. Making use of these characteristics, it can be suitably used in various devices including a photoelectric conversion device, an organic thin film transistor, an organic electroluminescence device and so on. In the following, description will be made for each of these devices.

Preferably, the polymer compound of the present invention has a long optical absorption edge wavelength. The optical absorption edge wavelength can be determined in the following method.

For measurement, a spectrophotometer that operates in ultraviolet, visible and near-infrared wavelength regions (for example, a ultraviolet-visible-near-infrared spectrophotometer JASCO-V670 manufacture by JASCO Corporation) is used. When JASCO-V670 is used, since a measurable wavelength range is 200 to 1500 nm, measurement is conducted within the wavelength range. First, absorption spectrum of a substrate for use in measurement is measured. As the substrate, a quartz substrate, a glass substrate or the like is used. Then, on the substrate, a thin film containing a first compound is formed from a solution containing the first compound or a melt containing the first compound. In film formation from a solution, drying is conducted after film formation. Then absorption spectrum of a laminate of the thin film and the substrate is obtained. Difference between the absorption spectrum of the laminate of the thin film and the substrate, and the absorption spectrum of the substrate is obtained as absorption spectrum of the thin film.

In the absorption spectrum of the thin film, the vertical axis represents absorbance of the first compound, and the horizontal axis represents wavelength. It is desired to adjust the film thickness of the thin film so that absorbance of the maximum absorption peak is about 0.5 to 2. Among the absorption peaks, taking absorbance of the absorption peak of the longest wavelength as 100%, an intersection between the straight line parallel with the horizontal axis (wavelength axis) including 50% of the absorbance and the absorption peak, having a longer wavelength than the peak wavelength of the absorption peak is called a first point. An intersection between the straight line parallel with the wavelength axis including 25% of the absorbance and the absorption peak, having a longer wavelength than the peak wavelength of the absorption peak is called a second point. An intersect between the straight line connecting the first point and the second point, and a reference line is defined as optical absorption edge wavelength. Here, the reference line refers to a straight line connecting a third point on the absorption spectrum having a longer wavelength by 100 nm than a reference wavelength and a fourth point on the absorption spectrum having a longer wavelength by 150 nm than a reference wavelength, the reference wavelength being a wavelength at an intersect between a straight line parallel with the wavelength axis including 10% of the absorbance, and the absorption peak, having a longer wavelength than the peak wavelength of the absorption peak, when absorbance in an absorption peak at the longest wavelength is taken as 100%.

A photoelectric conversion device having the polymer compound of the present invention has one or more layer of active layer containing the polymer compound of the present invention between a first electrode and a second electrode.

One preferred embodiment of the photoelectric conversion device having the polymer compound of the present invention has a pair of electrodes at least one of which is transparent or translucent, and an active layer formed of an organic composition of a p-type organic semiconductor and a n-type organic semiconductor. Preferably, the polymer compound of the present invention is used as a p-type organic semiconductor. Operation mechanism of the photoelectric conversion device in this aspect will be described.

Light energy entered from the transparent or translucent electrode is absorbed in an electron accepting compound such as a fullerene derivative (n-type organic semiconductor) and/or an electron donating compound such as a polymer compound of the present invention (p-type organic semiconductor), to generate an exciton wherein an electron and a hole are combined. When the generated exciton moves to reach a hetero junction interface where the electron accepting compound and the electron donating compound neighbor, the electron and the hole separate from each other due to the difference in respective HOMO energy and LUMO energy at the interface, and generate charges (electron and hole) capable of independently moving. The generated charges move to respective electrodes, and thus can be taken up externally as electric energy (current).

A photoelectric conversion device produced by using the polymer compound of the present invention is typically formed on a substrate. As the substrate, the one that forms an electrode and does not change chemically in forming a layer of an organic substance may be used. As a material for the substrate, for example, glass, plastic, polymer film, silicon and the like are recited. In the case of an opaque substrate, it is preferred that the opposite electrode (namely, the electrode far from the substrate) is transparent or translucent.

Other aspect of a photoelectric conversion device having the polymer compound of the present invention is a photoelectric conversion device including a first active layer containing the polymer compound of the present invention, and a second active layer disposed adjacently to the first active layer, containing an electron accepting compound such as a fullerene derivative, between a pair of electrodes at least one of which is transparent or translucent.

The photoelectric conversion device of the present invention may have an active layer containing the compound represented by formula (3) in place of the active layer containing the aforementioned polymer compound.

Preferably, the photoelectric conversion device of the present invention has an active layer containing the aforementioned polymer compound.

As the aforementioned transparent or translucent electrode material, a conductive metal oxide film, a translucent metal thin film and the like are recited. Specifically, films produced by using conductive materials composed of indium oxide, zinc oxide, tin oxide, and complexes thereof such as indium tin oxide (ITO) and indium zinc oxide, and NESA, gold, platinum, silver, copper and the like are used, and ITO, indium zinc oxide and tin oxide are preferred. As a method of producing an electrode, a vacuum vapor deposition method, a sputtering method, an ion plating method, an plating method and the like are recited.

As an electrode material, an organic transparent conductive film of polyaniline and its derivative, polythiophene and its derivative and the like may be used.

One of the electrodes may not be transparent, and as an electrode material of the electrode, metal, conductive polymer and the like may be used. Specific examples of electrode material include metals such as lithium, sodium, potassium, rubidium, cesium, magnesium, calcium, strontium, barium, aluminum, scandium, vanadium, zinc, yttrium, indium, cerium, samarium, europium, terbium and ytterbium, and alloys of two or more of them, or alloys of one or more type of the aforementioned metals, and at least one type of metal selected from the group consisting of gold, silver, platinum, copper, manganese, titanium, cobalt, nickel, tungsten and tin, graphite, a graphite intercalation compound, polyaniline and its derivative, and polythiophene and its derivative. As an alloy, magnesium silver alloy, magnesium indium alloy, magnesium aluminum alloy, indium silver alloy, lithium aluminum alloy, lithium magnesium alloy, lithium indium alloy, calcium aluminum alloy and the like are recited.

As a means for improving the photoelectric conversion efficiency, an additional intermediate layer other than an active layer may be used. As a material used as an intermediate layer, alkaline metals such as lithium fluoride, halides of alkaline earth metal, oxides such as titanium oxide, PEDOT (poly-3,4-ethylenedioxythiophene) and the like are recited.

The aforementioned active layer may contain only one type, or combination of two or more types of polymer compound of the present invention. Also for improving the hole transport performance of the aforementioned active layer, a compound other than the polymer compound of the present invention may be mixed in the aforementioned active layer as an electron donating compound and/or an electron accepting compound. The aforementioned electron donating compound, and the aforementioned electron accepting compound are determined relatively from the energy levels of these compounds.

As the aforementioned electron donating compound, besides the polymer compound of the present invention, for example, a pyrazoline derivative, an arylamine derivative, a stilbene derivative, a triphenyldiamine derivative, oligothiophene and its derivative, polyvinylcarbazole and its derivative, polysilane and its derivative, a polysiloxane'derivative having an aromatic amine residue in a side chain or main chain, polyaniline and its derivative, polythiophene and its derivative, polypyrrole and its derivative, polyphenylenevinylene and its derivative, and polythienylenevinylene and its derivative are recited.

As the aforementioned electron accepting compound, besides the polymer compound of the present invention, for example, carbon materials, metal oxides such as titanium oxide, metal complexes of an oxadiazole derivative, anthraquinodimethane and its derivative, benzoquinone and its derivative, naphthoquinone and its derivative, anthraquinone and its derivative, tetracyanoanthraquinodimethane and its derivative, a fluorenone derivative, diphenyldicyanoethylene and its derivative, a diphenoxy derivative, or 8-hydroxyquinoline and its derivative, polyquinoline and its derivative, polyquinoxaline and its derivative, polyfluorene and its derivative, a phenanthroline derivative such as 2,9-dimethyl-4,7-diphenyl-1,10-phenanthroline (bathocuproin), fullerene, and a fullerene derivative are recited, and titanium oxide, carbon nanotube, fullerene and a fullerene derivative are preferred, and fullerene and a fullerene derivative are particularly preferred.

As fullerene and a fullerene derivative, $C_{60}$, $C_{70}$, $C_{76}$, $C_{78}$, $C_{84}$ and its derivative are recited. A fullerene derivative represents a compound that at least part of fullerene is modified.

As a fullerene derivative, for example, the compound represented by formula (I), the compound represented by formula (II), the compound represented by formula (III), and the compound represented by formula (IV) are recited.

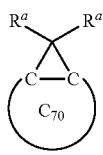
(II)

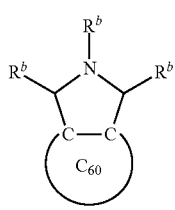
(III)

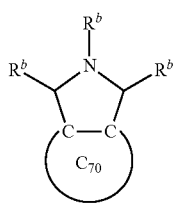
(IV)

[In formulas (I) to (IV), $R^a$ represents an alkyl group, an aryl group, an aromatic heterocyclic group or a group having ester structure. Plural $R^a$s may be the same or different. $R^b$ represents an alkyl group or an aryl group. Plural $R^b$s may be the same or different.]

Definitions and specific examples of alkyl group and aryl group represented by $R^a$ and $R^b$ are as same as the definitions and specific examples of alkyl group and aryl group represented by $R^1$.

As the aromatic heterocyclic group represented by $R^a$, for example, a thienyl group, a pyridyl group, a furyl group and a pyrrolyl group are recited.

As the group having ester structure represented by $R^a$, for example, a group represented by formula (V):

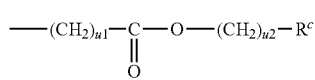
(V)

[wherein, u1 represents an integer of 1 to 6, u2 represents an integer of 0 to 6, and $R^c$ represents an alkyl group, an aryl group or an aromatic heterocyclic group.] is recited.

Definitions and specific examples of alkyl group, aryl group and aromatic heterocyclic group represented by $R^c$ are as same as the definitions and specific examples of alkyl group, aryl group and aromatic heterocyclic group represented by $R^a$.

Specific examples of derivative of $C_{60}$ include the followings.

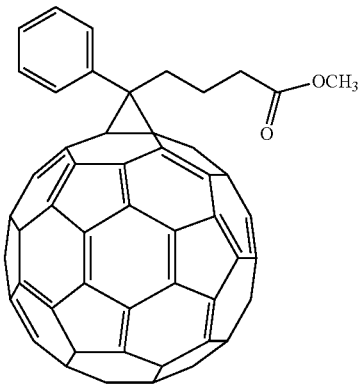

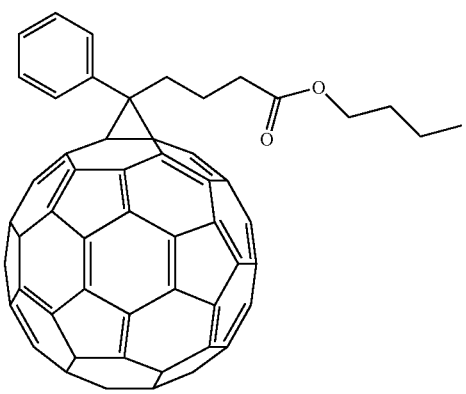

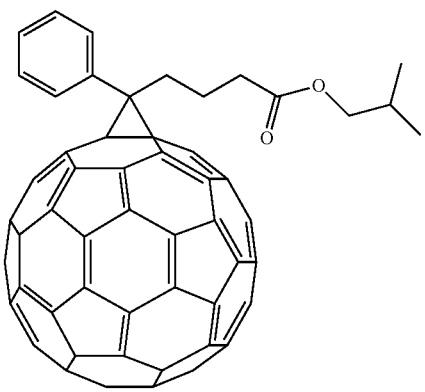

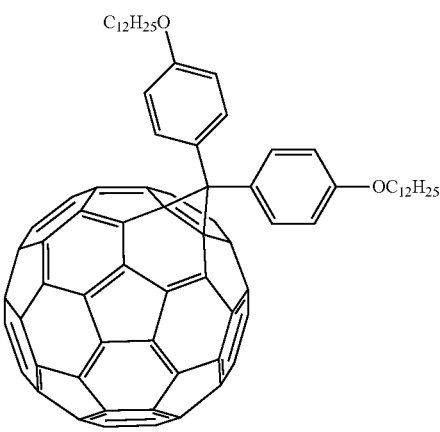

-continued

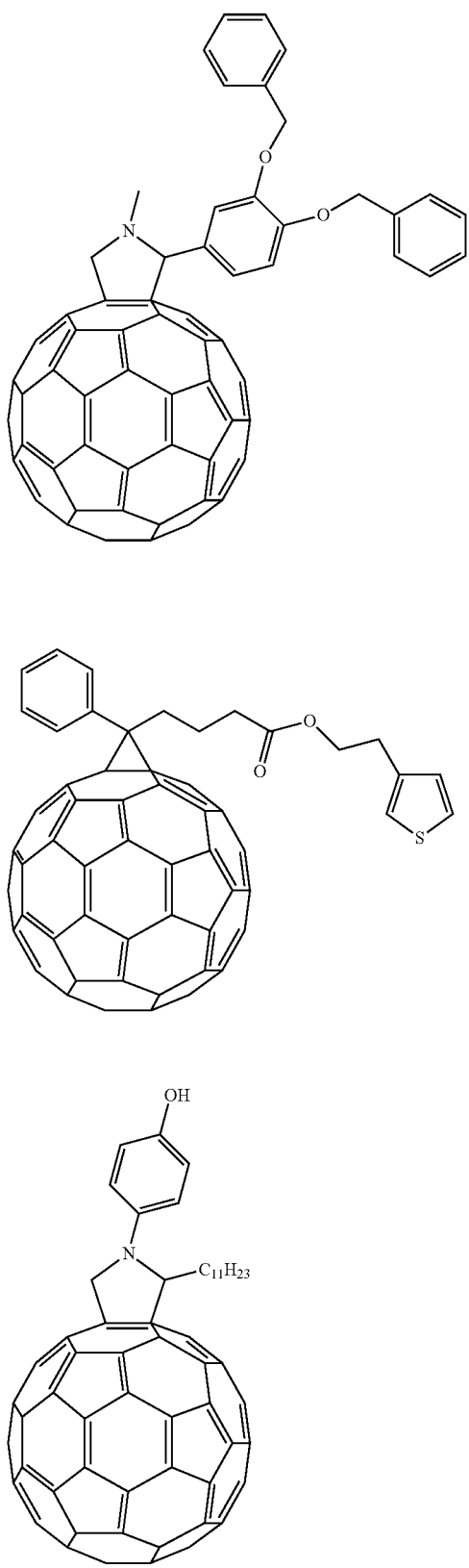

Specific examples of derivative of $C_{70}$ include the followings.

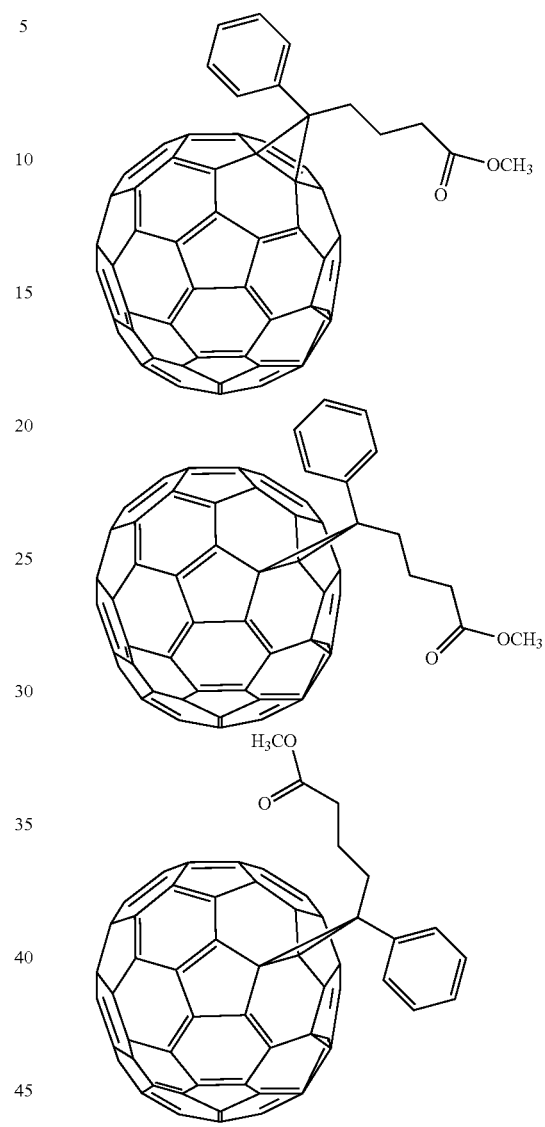

Examples of fullerene derivative include [6, 6]-Phenyl C61 butyric acid methyl ester (C60PCBM), [6,6]-phenyl C71 butyric acid methyl ester (C70PCBM), [6,6]-phenyl C85 butyric acid methyl ester (C84PCBM) and [6, 6]-thienyl C61 butyric acid methyl ester.

When both the polymer compound of the present invention and a fullerene derivative are contained in the active layer, the proportion of fullerene derivative is preferably 10 to 1000 parts by weight, and more preferably 20 to 500 parts by weight based on 100 parts by weight of the polymer compound of the present invention.

Typically, thickness of the active layer is preferably 1 nm to 100 μM, more preferably 2 nm to 1000 nm, further preferably 5 nm to 500 nm, and further preferably 20 nm to 200 nm.

The aforementioned active layer may be produced in any methods, and for example, film formation from a solution containing a polymer compound and a solvent, and a film formation method by a vacuum vapor deposition method are recited.

A preferred production method of a photoelectric conversion device is a method of producing a device having a first electrode and a second electrode, and an active layer between the first electrode and the second electrode, including the step of applying a solution (ink) containing the polymer compound of the present invention and a solvent on the first electrode by coating to aspect an active layer, and the step of forming a second electrode on the active layer.

A solvent used in film formation from a solution may be any solvent that dissolves the polymer compound of the present invention. As the solvent, for example, unsaturated hydrocarbon solvents such as toluene, xylene, mesitylene, tetralin, decalin, bicyclohexyl, n-butylbenzene, sec-butylbenzene and tert-butylbenzene, halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane and bromocyclohexane, halogenated unsaturated hydrocarbon solvents such as chlorobenzene, dichlorobenzene and trichlorobenzene, and ether solvents such as tetrahydrofuran and tetrahydropyran are recited. The polymer compound of the present invention can be dissolved in the aforementioned solvent typically in 0.1% by weight or more.

When the film is formed by using a solution, a slit coating method, a knife coating method, a spin coating method, a casting method, a microgravure coating method, a gravure coating method, a bar coating method, a roll coating method, a wire bar coating method, a dip coating method, a spray coating method, a screen printing method, a gravure printing method, a flexo printing method, an offset printing method, an inkjet coating method, a dispenser printing method, a nozzle coating method, a capillary coating method and the like coating methods can be used, and the slit coating method, the capillary coating method, the gravure coating method, the microgravure coating method, the bar coating method, the knife coating method, the nozzle coating method, the inkjet coating method, and the spin coating method are preferred.

From the view point of film formability, surface tension at 25° C. of the solvent is preferably larger than 15 mN/m, more preferably larger than 15 mN/m and smaller than 100 mN/m, and further preferably larger than 25 mN/m and smaller than 60 mN/m.

The polymer compound of the present invention may be used in an organic thin film transistor. As an organic thin film transistor, the one having such a structure including a source electrode and a drain electrode, an organic semiconductor layer (active layer) serving as a current path between these electrodes, and a gate electrode for controlling an amount of current passing through the current path is recited, and the organic semiconductor layer is formed by the organic thin film as described above. As such an organic thin film transistor, field-effect type, electrostatic induction type and so on are recited.

A field-effect type organic thin film transistor preferably has a source electrode and a drain electrode, an organic semiconductor layer (active layer) serving as a current path between these, a gate electrode for controlling an amount of current passing through the current path, and an insulating layer disposed between the organic semiconductor layer and the gate electrode.

In particular, it is preferred that the source electrode and the drain electrode are disposed while they are in contact with the organic semiconductor layer (active layer), and further the gate electrode is provided with the insulating layer contacting with the organic semiconductor layer interposed therebetween. In the field-effect type organic thin film transistor, the organic semiconductor layer is implemented by an organic thin film containing the polymer compound of the present invention.

An electrostatic induction type organic thin film transistor has a source electrode and a drain electrode, an organic semiconductor layer (active layer) serving as a current path between these, and a gate electrode for controlling an amount of current passing through the current path, and preferably the gate electrode is disposed in the organic semiconductor layer. In particular, it is preferred that the source electrode, the drain electrode and the gate electrode disposed in the organic semiconductor layer are provided while they are in contact with the organic semiconductor layer. Here, as structure of the gate electrode, such a structure is acceptable that a current path flowing from the source electrode to the drain electrode is formed, and an amount of current passing through the current path can be controlled by a voltage applied on the gate electrode, and for example, a comb-shaped electrode is recited. Also in the electrostatic induction type organic thin film transistor, the organic semiconductor layer is implemented by an organic thin film containing the polymer compound of the present invention.

The organic thin film transistor of the present invention may have an active layer containing the compound represented by formula (3) in place of the active layer containing the aforementioned polymer compound.

Preferably, the organic thin film transistor of the present invention has an active layer containing the aforementioned polymer compound.

In the photoelectric conversion device using the polymer compound of the present invention, photovoltaic power arises between electrodes by irradiating with light such as sunlight from the transparent or translucent electrode, and the device can be made to operate as an organic thin film solar cell. By accumulating a plurality of organic thin film solar cells, they may be used as an organic thin film solar cell module.

Also by irradiating with light such as sunlight from the transparent or translucent electrode in the condition that a voltage is applied between the electrodes, or in the condition that voltage is not applied, a photocurrent flows, and it can be made to operate as an organic optical sensor. By accumulating a plurality of organic optical sensors, they may be used as an organic image sensor.

The aforementioned organic thin film transistor may be used, for example, as a pixel driving device or the like used for controlling pixel of an electrophoresis display, a liquid crystal display, an organic electroluminescence display or the like, for controlling evenness of screen luminance and screen rewriting speed.

The organic thin film solar cell can basically assume a similar module structure as that of a conventional solar cell module. A solar cell module generally has such a structure that a cell is formed on a supporting substrate of metal, ceramic or the like, and the top of the same is covered with filled resin, protection glass or the like, and the light is taken up from the side opposite to the supporting substrate, however, such a structure that a transparent material such as tempered glass is used as a supporting substrate, and a cell is formed thereon, and light is taken up from the side of the transparent supporting substrate is also possible. Specifically, module structures of so-called super straight type, sub straight type and potting type, and a substrate-integrated module structure used in an amorphous silicon solar cell are known. As to an organic thin film solar cell produced by using the polymer compound of the present invention, these module structures may be appropriately selected depending on the use purpose, the use site and environment.

In a representative module of super straight type or sub straight type, between supporting substrates either or both of which is/are antireflection finished, cells are arranged at regular intervals, and the neighboring cells are connected by a metal lead or a flexible wiring, and an integrated electrode is arranged in the outer edge part so that generated electric power is taken out externally. Between the substrate and the cells, various plastic materials such as ethylene vinyl acetate (EVA) and the like depending on the purpose may be used in the form of a film or filled resin in order to protect the cells or to improve the power collecting efficiency. For use in a site where impact from outside is little and it is not necessary to cover the surface, the supporting substrate on either side can be omitted by forming a surface protection layer from a transparent plastic film, and providing protection function by hardening the aforementioned filled resin.

The circumference of the support substrate is fixed by a metallic frame in the manner of sandwich so as to ensure the hermetical sealing of the interior and the solidity of the module, and the supporting substrate and the frame are hermetically sealed with a sealing material. Also, by using a flexible material as a cell itself, a supporting substrate, a filling material and a sealing material, a solar cell can be formed on curved surface.

In the case of a solar cell using a flexible supporting member such as a polymer film, cells are sequentially formed while a roll-shaped supporting member is sent out, and cut into a desired size, and then the edge part is sealed with a flexible material having moisture proof property, and thus a cell main body can be fabricated. Also, a module structure called "SCAF" described in Solar Energy Materials and Solar Cells, 48, p383-391 may be employed. Further, a solar cell using a flexible supporting member may be used while it is adhered and fixed to curved glass or the like.

The polymer compound of the present invention may also be used in an organic electroluminescence device (organic EL device). An organic EL device has a light emitting layer between a first electrode and a second electrode. The organic EL device may include a hole transport layer and an electron transport layer besides the light emitting layer. In either of the light emitting layer, hole transport layer and electron transport layer, the polymer compound of the present invention is contained. In the light emitting layer, a charge transport material (collective designation for an electron transport material and a hole transport material) may be contained besides the polymer compound of the present invention. As the organic EL device, a device including a anode, a light emitting layer and a cathode; a device including an anode, a light emitting layer, an electron transport layer and a cathode, further having between the cathode and the light emitting layer, the electron transport layer containing an electron transport material adjacently to the light emitting layer; a device including an anode, a hole transport layer, a light emitting layer and a cathode, further having between the anode and the light emitting layer, the hole transport layer containing a hole transport material adjacently to the light emitting layer; and a device including an anode, a hole transport layer, a light emitting layer, an electron transport layer, and a cathode are recited. Preferably, at least one of the first electrode and the second electrode is transparent or translucent.

The organic EL device of the present invention may have an active layer containing the compound represented by formula (3) in place of the active layer containing the aforementioned polymer compound.

Preferably, the organic EL device of the present invention has an active layer containing the aforementioned polymer compound.

EXAMPLES

Examples will be shown for describing the present invention in more detail below, however, it is to be noted that the present invention is not limited to these examples.

(NMR Measurement)

NMR measurement was conducted for a compound dissolved in deuteriochloroform using a NMR apparatus (manufactured by Varian, INOVA300).

(Measurement of Number Average Molecular Weight and Weight Average Molecular Weight)

As to number average molecular weight and weight average molecular weight, number average molecular weight and weight average molecular weight in terms of polystyrene were determined by a gel permeation chromatography (manufactured by Shimadzu Corporation, trade name: LC-10Avp). A polymer compound to be measured was dissolved in tetrahydrofuran so that the concentration was about 0.5% by weight, and 30 μL was injected into GPC. As a mobile phase of GPC, tetrahydrofuran was caused to flow at a flow rate of 0.6 mL/min. As to the columns, two TSK gel Super HM-H (manufacture by TOSOH CORPORATION) and one TSK gel Super H2000 (manufacture by TOSOH CORPORATION) were connected in series. As a detector, a differential refractive index detector (manufacture by Shimadzu Corporation, product name: RID-10A) was used.

Reference Example 1

Synthesis of Compound 1

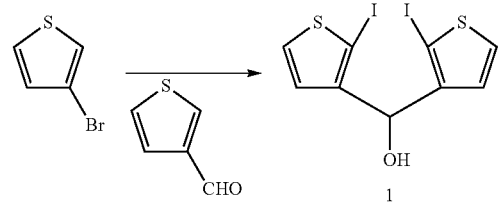

A 1000 mL-four-necked flask containing argon replacing for the interior gas was charged with 13.0 g (80.0 mmol) of 3-bromothiophene and 80 mL diethylether to give a uniform solution. The solution was added dropwise with 31 mL (80.6 mmol) of 2.6M butyl lithium (n-BuLi) solution in hexane while it was kept at −78° C. After letting the reaction liquid react at −78° C. for 2 hours, a solution dissolving 8.96 g (80.0 mmol) of 3-thiophene aldehyde in 20 mL of diethylether was added dropwise. After adding dropwise, the reaction was stirred at −78° C. for 30 minutes, and further stirred at room temperature (25° C.) for 30 minutes. The reaction liquid was again cooled to −78° C., and 62 mL (161 mmol) of 2.6 M n-BuLi solution in hexane was added dropwise over 15 minutes. After adding dropwise, the reaction liquid was stirred at −25° C. for 2 hours, and further stirred at room temperature (25° C.) for 1 hour. Then the reaction liquid was cooled to −25° C., and a solution dissolving 60 g (236 mmol) of iodine in 1000 mL of diethylether was added dropwise over 30 minutes. After adding dropwise, the reaction was stirred at room temperature (25° C.) for 2 hours, and added with 50 mL of 1 N sodium thiosulfate aqueous solution to stop the reaction. After extracting an oil phase containing a reaction product by adding diethylether, the diethylether solution containing the reaction product was dried over magnesium sulfate, and concentrated to obtain 35 g of a crude product. The crude product was purified by recrystallization with chloroform, to obtain 28 g of compound 1.

Reference Example 2

Synthesis of Compound 2

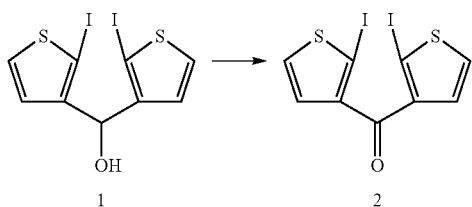 [SMILES: OC(c1ccsc1I)c1ccsc1I ; O=C(c1ccsc1I)c1ccsc1I]

A 300 mL four-necked flask was added with 10.5 g (23.4 mmol) of bisiodethienyl methanol (compound 1) and 150 mL methylene chloride to give a uniform solution. The resultant solution was added with 7.50 g (34.8 mmol) of pyridinium chlorochromate and stirred at room temperature (25° C.) for 10 hours. After removing an insoluble component by filtration of the reaction liquid, the filtrate was concentrated to obtain 10.0 g (22.4 mmol) of compound 2.

Reference Example 3

Synthesis of Compound 3

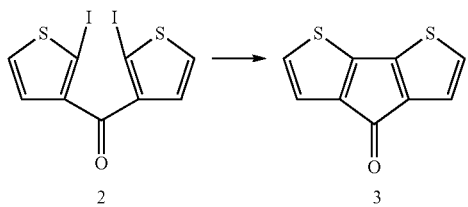 [SMILES: O=C(c1ccsc1I)c1ccsc1I ; O=C1c2ccsc2-c2sccc21]

A 300 mL flask containing argon replacing for the interior gas was added with 10.0 g (22.4 mmol) of compound 2, 6.0 g (94.5 mmol) of copper powder, and 120 mL of dehydrated N,N-dimethylformamide (hereinafter, also called DMF), and stirred at 120° C. for 4 hours. After reaction, the flask was cooled to room temperature (25° C.), and the reaction liquid was filtered through a silica gel column to remove an insoluble component. Then the reaction liquid was added with 500 mL of water, and followed by chloroform to extract an oil layer containing a reaction product. The chloroform solution was dried over magnesium sulfate and concentrated to obtain a crude product. The crude product was purified by a silica gel column using chloroform as a developing liquid, to obtain 3.26 g of compound 3. The foregoing operations were conducted plural times.

Reference Example 4

Synthesis of Compound 4

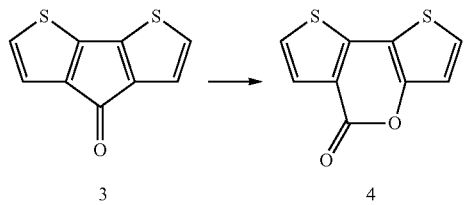 [SMILES: O=C1c2ccsc2-c2sccc21 ; O=c1oc2ccsc2c2sccc12]

A 300 mL four-necked flask equipped with a mechanical stirrer and containing argon replacing for the interior gas was charged with 3.85 g (20.0 mmol) of compound 3, 50 mL of chloroform, and 50 mL of trifluoroacetic acid to give a uniform solution. The resultant solution was added with 5.99 g (60 mmol) of sodium perborate monohydrate and stirred at room temperature (25° C.) for 45 minutes. Then, the reaction liquid was added with 200 mL of water, and an organic layer containing a reaction product was extracted by adding chloroform, and the chloroform solution was caused to flow through a silica gel column, and the solvent was distilled off by an evaporator. The residue was recrystallized by using methanol, to obtain 534 mg of compound 4.

$^1$H NMR in CDCl$_3$ (ppm): 7.64 (d, 1H), 7.43 (d, 1H), 7.27 (d, 1H), 7.10 (d, 1H)

Reference Example 5

Synthesis of Compound 5c

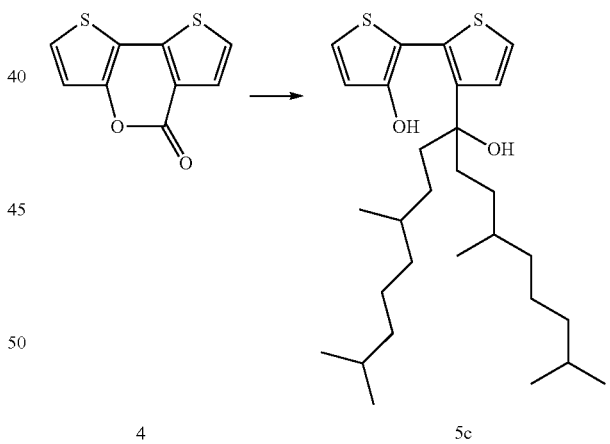

A 100 mL four-necked flask containing argon replacing for the interior gas was charged with 1.00 g (4.80 mmol) of compound 4, and 30 mL of dehydrated tetrahydrofuran (THF) to give a uniform solution. While the flask was kept at −20° C., the reaction liquid was added with 12.7 mL of 1 M 3,7-dimethyloctyl magnesium bromide in diethylether. Then, the temperature was raised to −5° C. over 30 minutes, and the reaction liquid was stirred for 30 minutes in that condition. Then, the temperature was raised to 0° C. over 10 minutes, and the reaction liquid was stirred for 1.5 hours in that condition. Then, the reaction liquid was added with water to stop the reaction, and added with ethyl acetate to extract an organic layer containing a reaction product. The ethyl acetate solution was dried over sodium sulfate, and caused to flow through a silica gel column, and then the solvent was distilled off to obtain 1.50 g of compound 5c.

$^1$H NMR in CDCl$_3$ (ppm): 8.42 (b, 1H), 7.25 (d, 1H), 7.20 (d, 1H), 6.99 (d, 1H), 6.76 (d, 1H), 2.73 (b, 1H), 1.90 (m, 4H), 1.58-1.02 (b, 20H), 0.92 (s, 6H), 0.88 (s, 12H)

Reference Example 6

Synthesis of Compound 6c

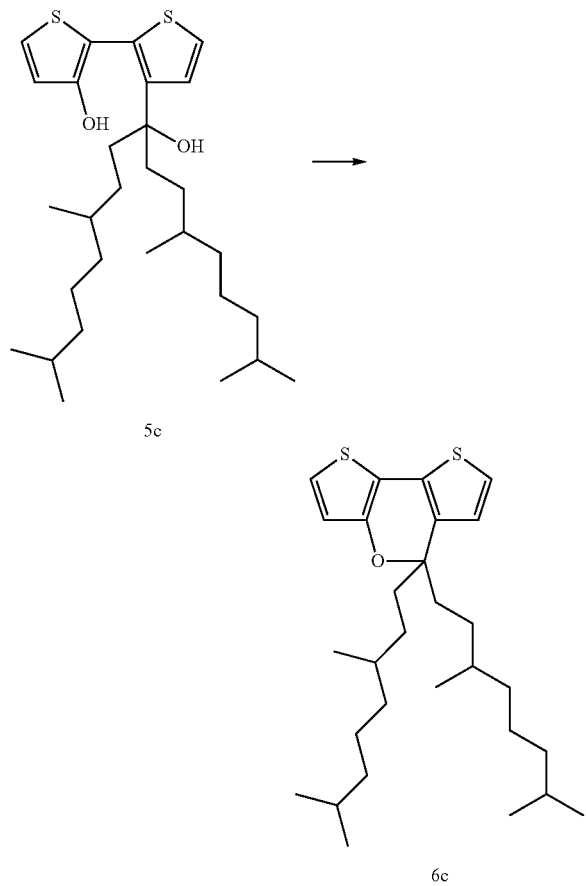

A 200 mL flask containing argon replacing for the interior gas was charged with 1.50 g of compound 5c and 30 mL of toluene to give a uniform solution. The resultant solution was added with 100 mg of sodium p-toluene sulfonate monohydrate, and stirred at 100° C. for 1.5 hours. After cooling the reaction liquid to room temperature (25° C.), 50 mL of water was added, followed by toluene to extract an organic layer containing a reaction product. After drying the toluene solution over sodium sulfate, the solvent was distilled off. The obtained crude product was purified by a silica gel column using hexane as a developing solvent to obtain 1.33 g of compound 6c. These operations were conducted plural times.

$^1$H NMR in CDCl$_3$ (ppm): 6.98 (d, 1H), 6.93 (d, 1H), 6.68 (d, 1H), 6.59 (d, 1H), 1.89 (m, 4H), 1.58-1.00 (b, 20H), 0.87 (s, 6H), 0.86 (s, 12H)

Reference Example 7

Synthesis of Compound 7

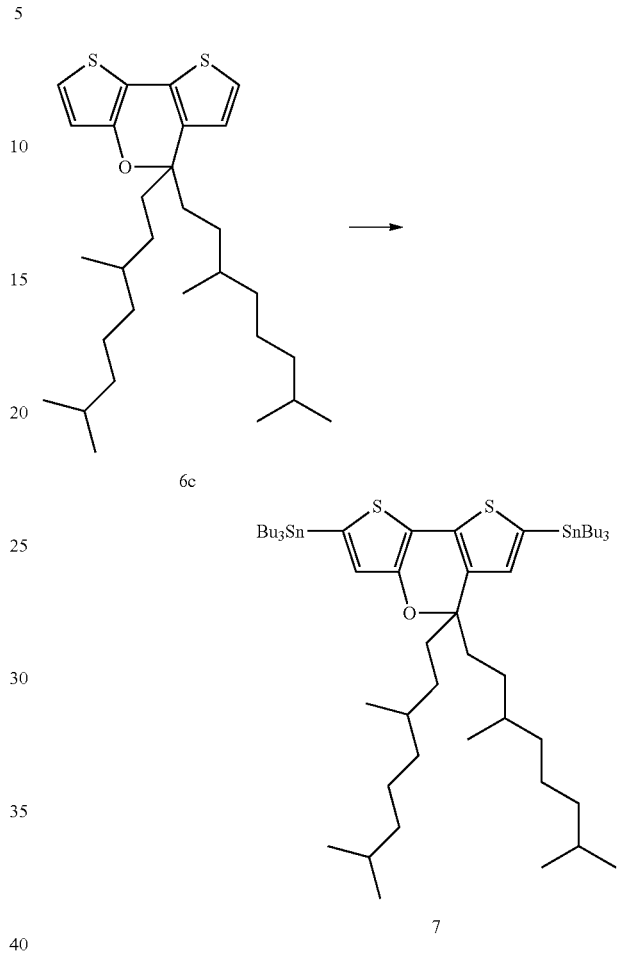

A 200 mL flask containing argon replacing for the interior gas was charged with 2.16 g (4.55 mmol) of compound 6c and 100 mL of dehydrated THF to give a uniform solution. The resultant solution was kept at −78° C., and the solution was added dropwise with 4.37 mL (11.4 mmol) of 2.6 M n-butyl lithium solution in hexane over 10 minutes. After adding dropwise, the reaction liquid was stirred at −78° C. for 30 minutes, and then stirred at room temperature (25° C.) for 2 hours. Then, the flask was cooled to −78° C., and the reaction liquid was added with 4.07 g (12.5 mmol) of tributyl tin chloride. After adding, the reaction liquid was stirred at −78° C. for 30 minutes, and then stirred at room temperature (25° C.) for 3 hours. Then, the reaction liquid was added with 200 mL of water to stop the reaction, and added with ethyl acetate to extract an organic layer containing a reaction product. After drying the ethyl acetate solution over sodium sulfate, the solvent was distilled off. The obtained oily substance was purified by a silica gel column using hexane as a developing solvent. As the silica gel in the silica gel column, silica gel that was immersed with hexane containing 5 weight (wt) % triethylamine for 5 minutes in advance, and then washed with hexane was used. After purification, 3.52 g (3.34 mmol) of compound 7 was obtained.

$^1$H NMR in CDCl$_3$ (ppm): 6.72 (d, 1H), 6.68 (d, 1H), 1.95-1.80 (b, 4H), 1.65-1.00 (b, 56H), 0.90-0.83 (m, 36H)

Example 1

Synthesis of Compound 8

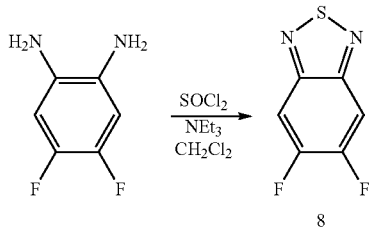

A 100 mL flask was charged with 2.00 g (13.9 mmol) of 4,5-difluoro-1,2-diaminobenzene (manufacture by TOKYO CHEMICAL INDUSTRY CO., LTD.), 10 mL of dichloromethane and 3.84 g (37.9 mmol) of triethylamine to give a uniform solution. While the flask was kept at 0° C., the flask was added dropwise with a solution dissolving 1.82 g (15.3 mmol) of thionyl chloride in 10 mL of dichloromethane. After adding dropwise, the flask was heated to 40° C. and allowed to react for 4 hours. Then the flask was cooled to room temperature (25° C.), added with 50 mL of water, and further added with chloroform, to extract an organic layer containing a reaction product. The chloroform solution was dried over sodium sulfate, and concentrated by an evaporator, and the precipitated solid was purified by a column chromatography (hexane:ethyl acetate=4:1 (volume ratio)) to obtain 0.80 g (4.65 mmol) of compound 8.

$^1$H NMR (CDCl$_3$, ppm): 7.75 (t, 2H)
$^{19}$F NMR (CDCl$_3$, ppm): −128.3 (s, 2F)

Example 2

Synthesis of Compound 8

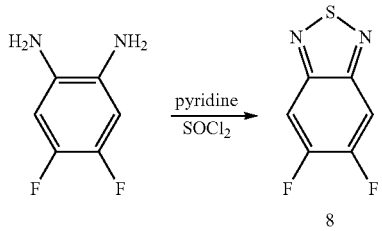

A 500 mL flask was charged with 10.2 g (70.8 mmol) of 4,5-difluoro-1,2-diaminobenzene (manufacture by TOKYO CHEMICAL INDUSTRY CO., LTD.) and 150 mL of pyridine to give a uniform solution. While the flask was kept at 0° C., 16.0 g (134 mmol) of thionyl chloride was added dropwise into the flask. After adding dropwise, the flask was warmed to 25° C., and the reaction was allowed for 6 hours. Then, the reaction liquid was added with 250 mL of water, followed by chloroform to extract an organic layer containing a reaction product. The chloroform solution was dried over sodium sulfate, and concentrated by an evaporator, and the precipitated solid was purified by recrystallization. As a solvent for recrystallization, methanol was used. After purification, 10.5 g (61.0 mmol) of compound 8 was obtained.

$^1$H NMR (CDCl$_3$, ppm): 7.75 (t, 2H)
$^{19}$F NMR (CDCl$_3$, ppm): −128.3 (s, 2F)

Example 3

Synthesis of Compound 9

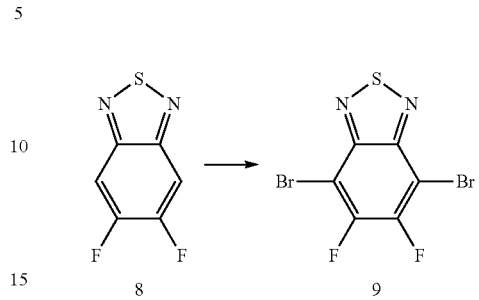

A 100 mL flask was charged with 2.00 g (11.6 mmol) of compound 8 and 0.20 g (3.58 mmol) of iron powder, and the flask was heated to 90° C. This flask was added dropwise with 31 g (194 mmol) of bromine over. 1 hour. After adding dropwise, the reaction liquid was stirred at 90° C. for 38 hours. Then, the flask was cooled to room temperature (25° C.), and added with 100 mL of chloroform to dilute the reaction liquid. The obtained solution was poured into 300 mL of 5 wt % sodium sulfite aqueous solution, and stirred for 1 hour. An organic layer of the obtained mixed liquid was separated by a separating funnel, and an aqueous layer was extracted three times with chloroform. The obtained extracted liquid was combined with the organic layer, and the mixed solution was dried over sodium sulfate, and the solvent was distilled off by an evaporator. The obtained yellow solid was dissolved in 90 mL of methanol heated to 55° C., and then cooled to 25° C. The precipitated crystal was collected by filtration, and then dried under reduced pressure at room temperature (25° C.) to obtain 1.50 g of compound 9.

$^{19}$F NMR (CDCl$_3$, ppm): −118.9 (s, 2F)

Example 4

Synthesis of Polymer Compound A

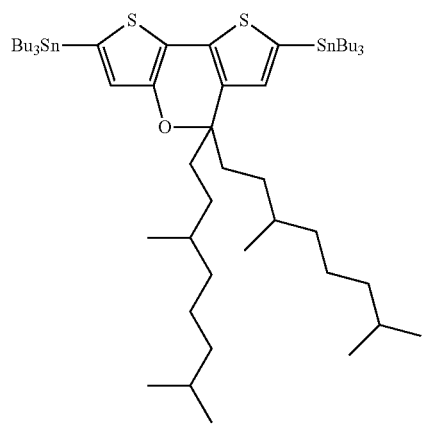

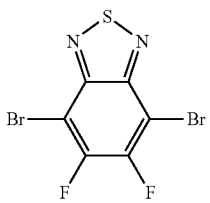

9

A 200 mL flask containing argon replacing for the interior gas was charged with 500 mg (0.475 mmol) of compound 7, 141 mg (0.427 mmol) of compound 9 and 32 mL of toluene to give a uniform solution. The obtained toluene solution was bubbled with argon for 30 minutes. Then the toluene solution was added with 6.52 mg (0.007 mmol) of tris (dibenzylideneacetone)dipalladium and 13.0 mg of tris(2-toluoyl)phosphine, and stirred at 100° C. for 6 hours. Then the reaction liquid was added with 500 mg of phenylbromide, and further stirred for 5 hours. Then the flask was cooled to 25° C., and the reaction liquid was poured into 300 mL of methanol. The precipitated polymer was collected by filtration, and the obtained polymer was put into cylindrical filter paper, and extracted with methanol, acetone and hexane for respectively 5 hours by using a Soxhlet extraction apparatus. The polymer remaining in the cylindrical filter paper was dissolved in 100 mL of toluene, and added with 2 g of sodium diethyldithiocarbamate and 40 mL of water, and stirred for 8 hours under reflux. After removing the aqueous layer, the organic layer was washed twice with 50 mL of water, then washed twice with 50 mL of 3 wt % acetic acid aqueous solution, then washed twice with 50 mL of water, then washed twice with 50 mL of 5% potassium fluoride, and then washed twice with 50 mL of water, and the obtained solution was poured into methanol to make polymer precipitate. After filtering the polymer, it was dried, and the obtained polymer was redissolved in 50 mL of o-dichlorobenzene, and caused to pass through an alumina/silica gel column. The obtained solution was poured into methanol to make polymer precipitate, and the polymer was filtered and dried, to obtain 185 mg of purified polymer. In the following, this polymer is called polymer compound A. Molecular weights in terms of polystyrene of polymer compound A measured by GPC were 29000 of weight average molecular weight (Mw), and 14000 of number average molecular weight (Mn).

Example 5

Production and Evaluation of Ink and Organic Thin Film Solar Cell

A glass substrate with a 150 nm-thick ITO film formed by sputtering was surface-finished by an ozone UV treatment. Then polymer compound A and fullerene C60PCBM (phenyl C61-methyl butyrate ester) (phenyl C61-butyric acid methyl ester, manufacture by Frontier Carbon Corporation) were dissolved in ortho dichlorobenzene so that a weight ratio of C60PCBM to polymer compound A was 3, to produce ink 1. In ink 1, a total of the weight of polymer compound A and the weight of C60PCBM was 2.0% by weight based on the weight of ink 1. Ink 1 was applied on the substrate by spin coating, to produce an organic film containing polymer compound A. Film thickness of the organic film was about 100 nm. Measured optical absorption edge wavelength of the organic film was 890 nm. Then on the organic film, lithium fluoride was vapor-deposited into a thickness of 2 nm by a vacuum vapor deposition machine, and then Al was vapor-deposited into a thickness of 100 nm, to produce an organic thin film solar cell. The shape of the obtained organic thin film solar cell was a 2 mm×2 mm square. The obtained organic thin film solar cell was irradiated with constant light using a solar simulator (manufacture by BUNKOUKEIKI, product name OTENTO-SUNII: AM1.5G filter, radiation illuminance 100 mW/cm$^2$), and generated current and voltage were measured, and photoelectric conversion efficiency, short-circuit current density, open end voltage, and fill factor were determined. Jsc (short-circuit current density) was 12.2 mA/cm$^2$, Voc (open end voltage) was 0.71V, ff (fill factor) was 0.64, and photoelectric conversion efficiency (η) was 5.54%.

Example 6

Production and Evaluation of Organic Thin Film Solar Cell

An organic thin film solar cell was produced in a similar manner except that fullerene C70PCBM ([6,6]phenyl-C71 methyl butyrate ester ([6,6]-Phenyl C71 butyric acid methyl ester), manufacture by Frontier Carbon Corporation) was used in place of fullerene C60PCBM in Example 5, and photoelectric conversion efficiency, short-circuit current density, open end voltage, and fill factor were determined. Optical absorption edge wavelength of the organic film was 890 nm. Jsc (short-circuit current density) was 15.9 mA/cm$^2$, Voc (open end voltage) was 0.72 V, ff (fill factor) was 0.59, and photoelectric conversion efficiency (ii) was 6.72%.

Reference Example 8

Synthesis of Compound 16

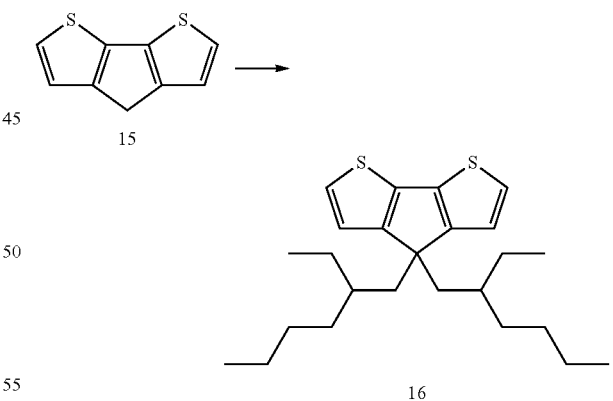

In a 200 mL flask containing argon replacing for the interior gas, 1.78 g (10.0 mmol) of compound 15, 5.83 g (25.0 mmol) of 2-ethylhexylbromide, 41.5 mg (0.25 mmol) of potassium iodide, and 1.68 g (30.0 mmol) of potassium hydroxide were introduced and dissolved in 35 mL of dimethylsulfoxide, and stirred at room temperature (25° C.) for 24 hours. The reaction liquid was added with 100 mL of water, and a product was extracted with hexane, and purified by a silica gel column using hexane as a developing solvent, to obtain 2.61 g of compound 16.

Reference Example 9

Synthesis of Compound 17

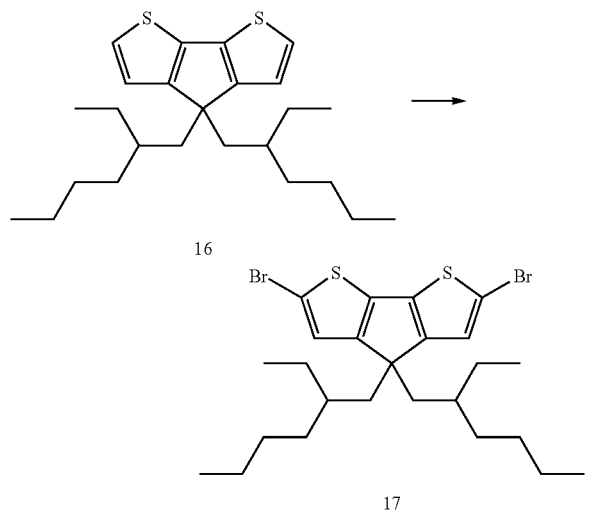

A 200 mL flask containing argon replacing for the interior gas was added with 1.31 g (3.25 mmol) of compound 16 and 25 mL of DMF, and the flask was cooled to 0° C., added with 1.21 g of NBS, and stirred for 12 hours. The reaction was stopped by introducing 100 mL of water into the reaction liquid, and a product was extracted with diethylether. Purification by a silica gel column using hexane as a developing solvent was conducted to obtain 1.70 g of compound 17.

Reference Example 10

Synthesis of Polymer Compound E

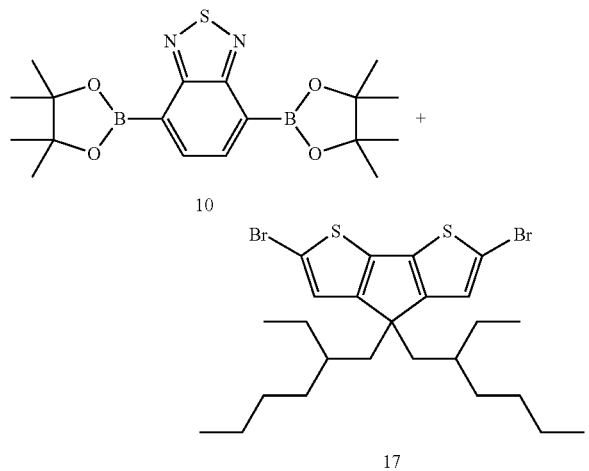

In a 200 mL flask containing argon replacing for the interior gas, 561 mg (1.00 mmol) of compound 17, 388.1 mg (1.00 mmol) of compound 10 (4,7-bis(4,4,5,5-tetramethyl-1,3,2-dioxaborolan-2-yl)-2,1,3-benzothiadiazole) (manufacture by Aldrich), and 202 mg of methyltrialkylammonium chloride (product name Aliquat336 (registered trade mark), manufacture by Aldrich) were added, and dissolved in 20 mL of toluene, and the obtained toluene solution was bubbled with argon for 30 minutes. Then the reaction liquid was added with 2.25 mg of palladium acetate, 12.3 mg of tris(2-methoxyphenyl) phosphine and 6.5 mL of 16.7 wt % sodium carbonate aqueous solution, and stirred at 100° C. for 5 hours. Then the reaction liquid was added with 50 mg of phenylboric acid, and allowed to react at 70° C. for 2 hours. Then the reaction liquid was added with 2 g of sodium diethyldithiocarbamate and 20 mL of water, and stirred for 2 hours under reflux. After removing the aqueous layer, the organic layer was washed twice with 20 mL of water, then washed twice with 20 mL of 3 wt % acetic acid aqueous solution, and further washed twice with 20 mL of water, and the obtained solution was poured into methanol to make polymer precipitate. After filtering the polymer, it was dried and the obtained polymer was redissolved in 30 mL of o-dichlorobenzene, and caused to pass through an alumina/silica gel column, and the obtained solution was poured into methanol to make polymer precipitate. After filtering the polymer, it was dried, to obtain 280 mg of purified polymer. Hereinafter, this polymer is called polymer compound E. Molecular weights in terms of polystyrene of polymer compound E measured by GPC were Mw of 30000 and Mn of 14000.

Comparative Example 1

Production and Evaluation of Organic Thin Film Solar Cell

An organic thin film solar cell was produced in a similar manner except that polymer compound E was used in place of polymer compound A in Example 5, and photoelectric conversion efficiency, short-circuit current density, open end voltage, and fill factor were determined. Also, optical absorption edge wavelength of an organic film composed of polymer compound E and C60PCBM was measured. The result is shown in Table 1.

TABLE 1

| | | Short-circuit current density (mA/cm$^2$) | Open end voltage (V) | fill factor | photo-electric conversion efficiency (%) | optical absorption edge wave-length (nm) |
|---|---|---|---|---|---|---|
| Example 5 | Polymer compound A | 12.2 | 0.71 | 0.64 | 5.54 | 890 |
| Example 6 | Polymer compound A | 15.9 | 0.72 | 0.59 | 6.72 | 890 |
| Comparative Example 1 | Polymer compound E | 4.61 | 0.60 | 0.33 | 0.91 | 870 |

Example 7

Synthesis of Compound 18

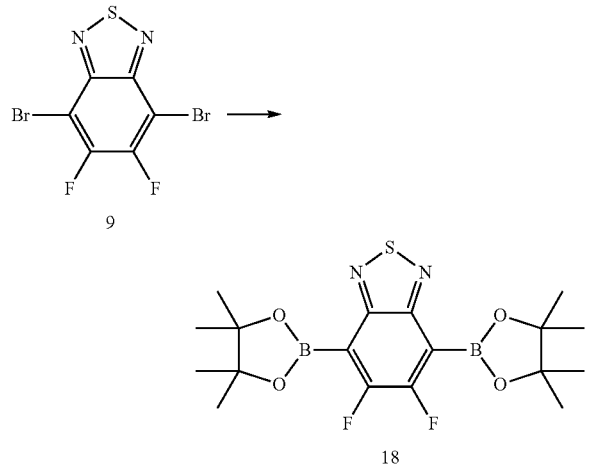

A four-necked flask was added with 12.30 g (37.28 mmol) of compound 9, 23.67 g (93.20 mmol) of bis(pinacolato)diboron, 9.15 g (93.20 mmol) of potassium acetate, and 500 mL of dioxane and bubbled with argon at room temperature (25° C.) for 30 minutes. After adding 1.52 g (1.86 mmol) of diphenylphosphinoferrocene palladium dichloride and 1.03 mg (1.86 mmol) of diphenylphosphinoferrocene to the reaction solution, heating was conducted under reflux for 60 hours. After reflux, disappearance of starting materials was confirmed by liquid chromatography. After filtering the reaction solution through Celite to remove an insoluble component, the filtrate was dried to remove the solvent, and a brown solid was obtained. The obtained brown solid was added with 200 mL of hot hexane and filtered, and the filtrate was dried to remove the solvent, and a crude crystal was obtained. Subsequently, the crude crystal was recrystallized in hexane. Recrystallization was conducted twice and 3.12 g of compound 18 was obtained.

$^1$H-NMR (CDCl$_3$, δ (ppm)): 1.45 (s, 24H)
$^{19}$F-NMR (CDCl$_3$, δ (ppm)): −117 (s, 2F)

Reference Example 11

Synthesis of Compound 19

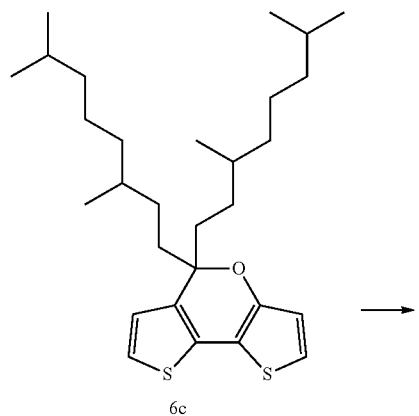

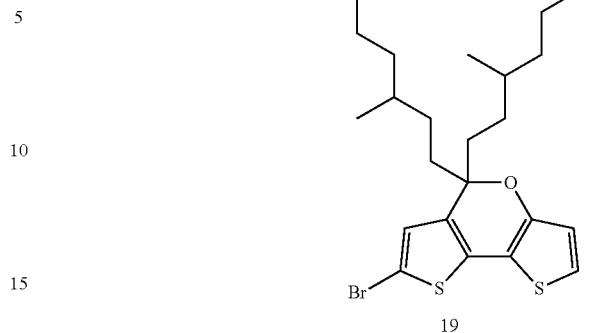

A four-necked flask was added with 3.00 g (6.32 mmol) of compound 6c, and 60 mL of tetrahydrofuran, and argon bubbling was conducted at room temperature (25° C.) for 30 minutes. After cooling the reaction solution to −30° C., 1.01 g (5.69 mmol) of N-bromosuccinimide was added, and stirred at −10° C. for 2 hours. After stirring, disappearance of 90% of starting material was confirmed by liquid chromatography, and the reaction was stopped. The reaction solution was added with water and diethylether, and the organic layer was extracted, and the organic layer was purified by a column using hexane as a developing solvent. The purified organic layer was dried to remove the solvent, and 2.84 g of compound 19 was obtained.

$^1$H-NMR (CDCl$_3$, δ (ppm)): 0.83 (m, 18H), 1.08-1.47 (m, 20H), 1.95 (q, 4H), 6.65 (s, 1H), 6.66 (s, 1H), 6.98 (s, 1H)

Example 8

Synthesis of Compound 20

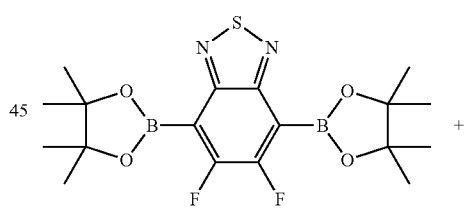

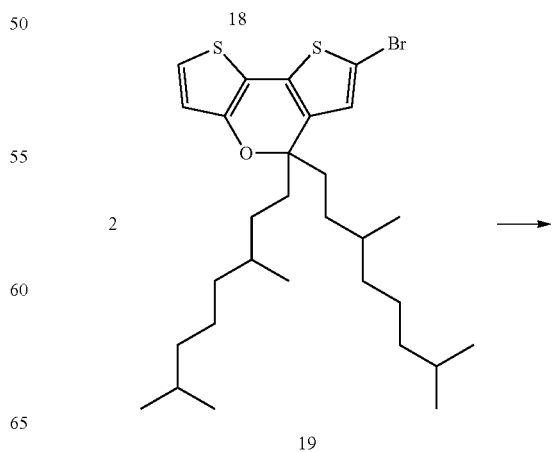

Example 9

Synthesis of Compound 21

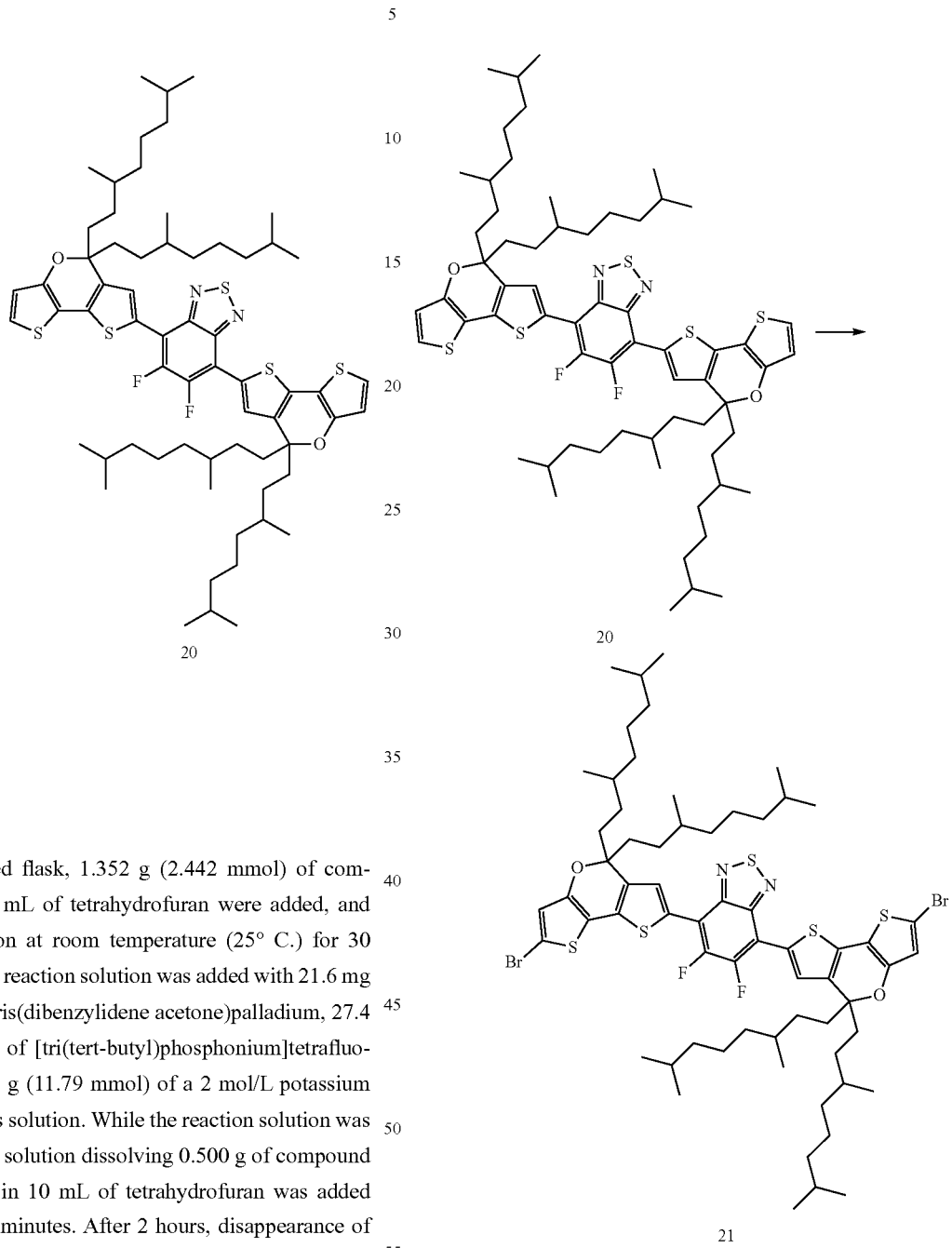

In a four-necked flask, 1.352 g (2.442 mmol) of compound 19 and 25 mL of tetrahydrofuran were added, and bubbled with argon at room temperature (25° C.) for 30 minutes. Then, the reaction solution was added with 21.6 mg (0.024 mmol) of tris(dibenzylidene acetone)palladium, 27.4 mg (0.094 mmol) of [tri(tert-butyl)phosphonium]tetrafluoroborate, and 5.90 g (11.79 mmol) of a 2 mol/L potassium phosphate aqueous solution. While the reaction solution was stirred at 80° C., a solution dissolving 0.500 g of compound 18 (1.179 mmol) in 10 mL of tetrahydrofuran was added dropwise over 20 minutes. After 2 hours, disappearance of starting materials was confirmed by liquid chromatography. The reaction solution was added with water and hexane to extract an organic layer, and the organic layer was purified by a column using hexane as a developing solvent, and then the purified organic layer was dried to remove the solvent, and 665 mg of compound 20 was obtained.

$^1$H-NMR (CDCl$_3$, δ (ppm)): 0.82 (m, 36H), 1.08-1.47 (m, 40H), 1.95 (m, 8H), 6.71 (d, 2H), 7.07 (d, 2H), 7.92 (d, 2H)

$^{19}$F-NMR (CDCl$_3$, δ (ppm)): −125 (s, 2F)

In a four-necked flask, 657 mg (0.588 mmol) of compound 20 and 10 mL of tetrahydrofuran (THF) were added, and bubbled with argon at room temperature (25° C.) for 30 minutes. After cooling the reaction solution to 0° C., 230 mg (1.30 mmol) of NBS was added, and the temperature was raised to 40° C. After 1 hour, disappearance of starting materials was confirmed by liquid chromatography. Then, the reaction solution was added with a sodium thiosulfate aqueous solution, followed by hexane, to extract an organic layer. Then, the organic layer was separated by a column using hexane as a developing solvent, and the component

141 obtained by separation was dried to remove the solvent, and 685 mg of compound 21 was obtained.

¹H-NMR (CDCl₃, δ (ppm)): 0.82 (m, 36H), 1.08-1.47 (m, 40H), 1.95 (m, 8H), 6.73 (s, 2H), 7.90 (s, 2H)

¹⁹F-NMR (CDCl₃, δ (ppm)): −129 (s, 2F)

Reference Example 12

Synthesis of Compound 22

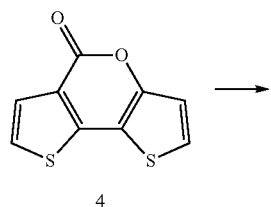

4

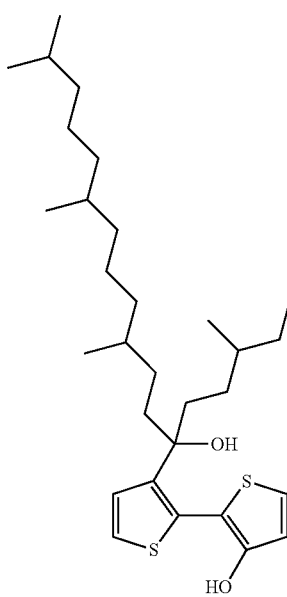

22

In a four-necked flask, 3.50 g (144.1 mmol) of magnesium, 72 mL of tetrahydrofuran, and 20.98 g (72.03 mmol) of 3,7,11-trimethyldodecyl bromide were added, to prepare a 1 mol/L Grignard reagent. In another four-necked flask, 5.00 g (24.01 mmol) of compound 4 and 200 mL of tetrahydrofuran were added, and bubbled with argon at room temperature (25° C.) for 30 minutes. After cooling the reaction solution to −40° C., the prepared Grignard reagent was added, and stirred while the temperature was raised to 0° C. After 3 hours, disappearance of starting materials was confirmed by liquid chromatography.

The reaction solution was added with water and chloroform, to extract an organic layer, and the obtained chloroform solution was caused to pass through a column using chloroform as a developing solvent, to obtain mixed oil containing compound 22.

142

Reference Example 13

Synthesis of Compound 23

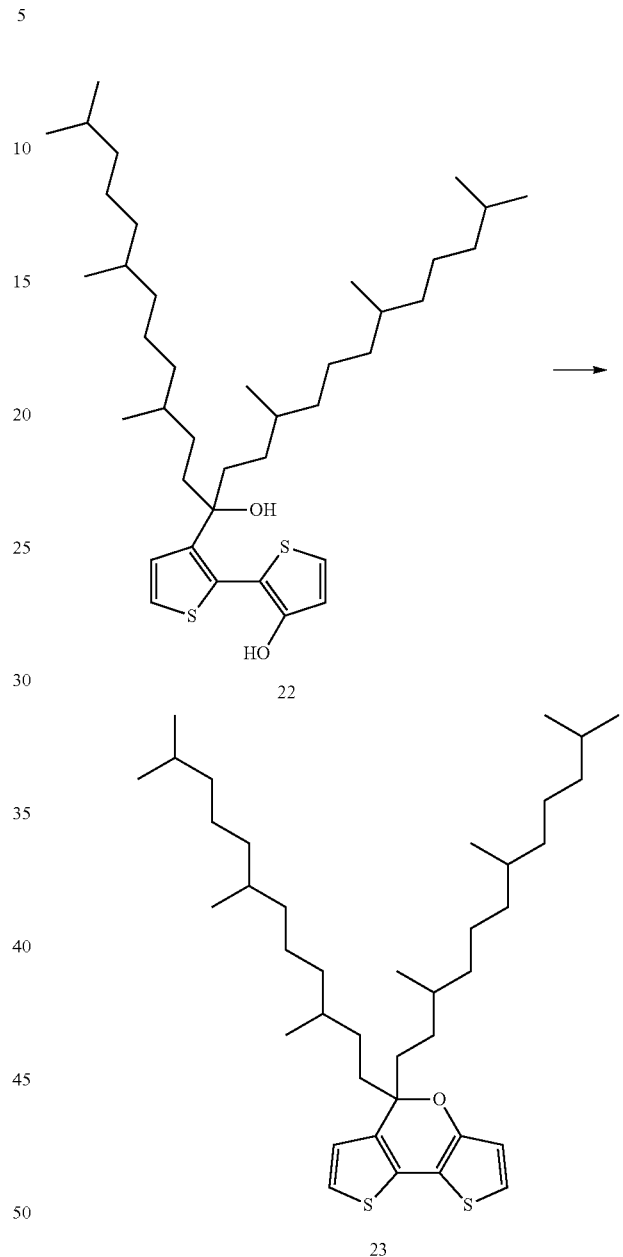

In a four-necked flask, the total mixed oil containing compound 22 synthesized in Reference example 12, and 100 mL of toluene were added, and bubbled with argon at room temperature (25° C.) for 30 minutes. Then, after adding 500 mg of para-toluene sulfonic acid monohydrate to the reaction solution, the temperature was raised to 120° C. and stirred, and after 1 hour, disappearance of starting materials was confirmed by liquid chromatography. The reaction solution was added with water and ethyl acetate, to extract an organic layer. The obtained ethyl acetate solution was caused to pass through a column using chloroform as a developing solvent, and then the solvent was removed to obtain 15.6 g of compound 23.

$^1$H-NMR (CDCl$_3$, δ (ppm)): 0.80-0.88 (m, 24H), 0.97-1.62 (m, 34H), 1.87 (q, 4H), 6.67 (d, 1H), 6.69 (d, 1H), 6.96 (d, 1H), 7.03 (d, 1H)

$^1$H-NMR (CDCl$_3$, δ (ppm)): 0.82-0.88 (m, 24H), 0.95-1.60 (m, 34H), 1.82 (q, 4H), 6.64 (s, 1H), 6.65 (s, 1H), 6.98 (d, 1H)

Reference Example 14

Synthesis of Compound 24

Example 10

Synthesis of Compound 25

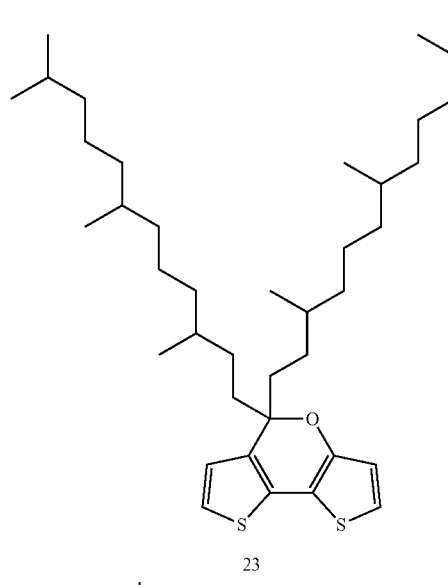

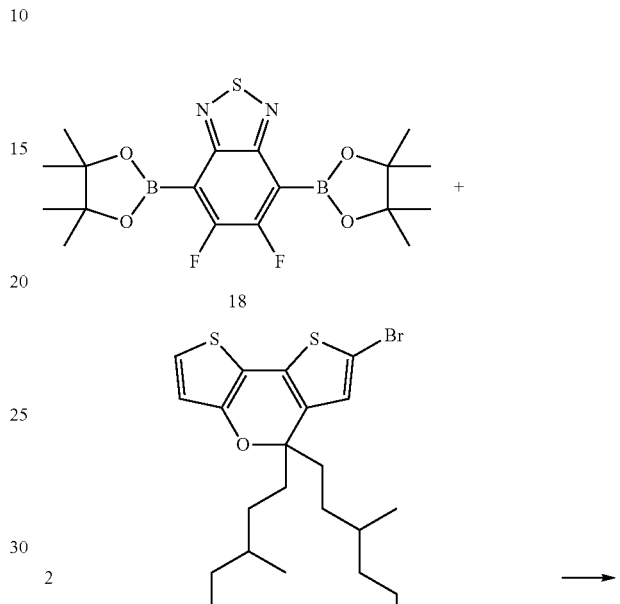

In a four-necked flask, 7.995 g (13.00 mmol) of compound 23 and 160 mL of tetrahydrofuran were added and bubbled with argon at room temperature (25° C.) for 30 minutes. After cooling the reaction solution to −30° C., 1.85 g (10.4 mmol) of N-bromosuccinimide was added, and stirred at −10° C. for 2 hours. Disappearance of 90% of starting material was confirmed by liquid chromatography, and the reaction was stopped. The reaction solution was added with water and diethylether, to extract an organic layer, and the diethylether solution was caused to pass through a column using hexane as a developing solvent, and then the solvent was removed to obtain 7.47 g of compound 24.

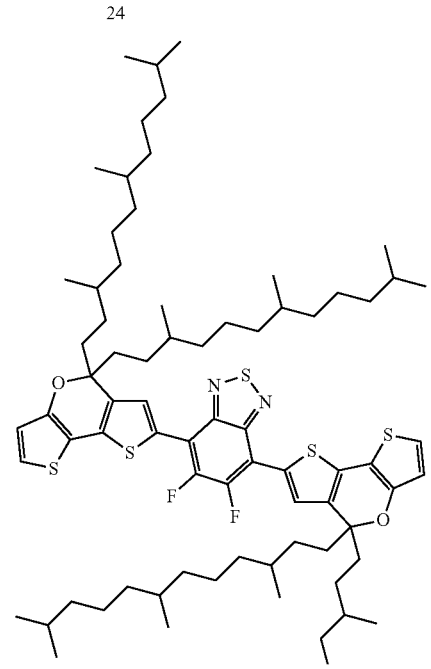

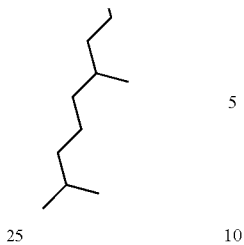

25

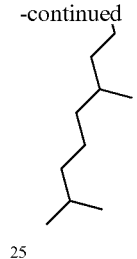

25

In a four-necked flask, 1.729 g (2.491 mmol) of compound 24 and 25 mL of methylene chloride were added, and bubbled with argon at room temperature (25° C.) for 30 minutes. Then the reaction solution was added with 21.6 mg (0.024 mmol) of tris(dibenzylideneacetone) palladium, 27.4 mg (0.094 mmol) of [tri(tert-butyl)phosphonium]tetrafluoroborate and 5.90 g (11.79 mmol) of 2 mol/L potassium phosphate aqueous solution. While the reaction solution was stirred at 45° C., a solution dissolving 0.500 g of compound 18 (1.179 mmol) in 20 mL of methylene chloride was added dropwise over 20 minutes. After 2 hours, disappearance of starting materials was confirmed by liquid chromatography. The reaction solution was added with water and hexane, to extract an organic layer, and the obtained hexane solution was caused to pass through a column using hexane as a developing solvent, and then the solvent was removed to obtain 1.21 g of compound 25.

$^1$H-NMR (CDCl$_3$, δ (ppm)): 0.70-0.95 (m, 48H), 0.96-1.60 (m, 68H), 1.97 (m, 8H), 6.72 (d, 2H), 7.08 (d, 2H), 7.93 (d, 2H)

$^{19}$F-NMR (CDCl$_3$, δ (ppm)): −125 (s, 2F)

Example 11

Synthesis of Compound 26

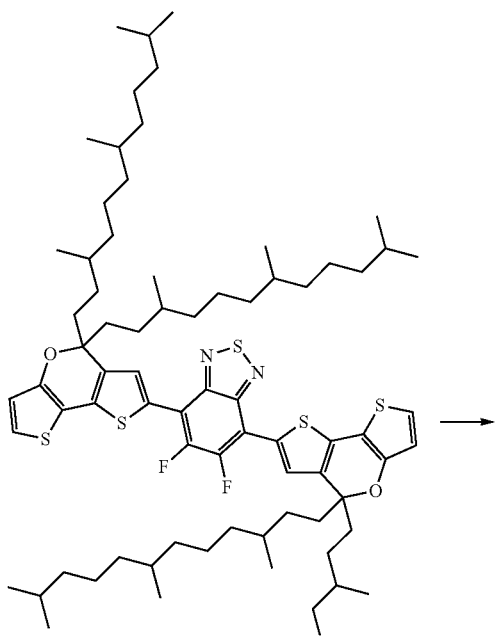

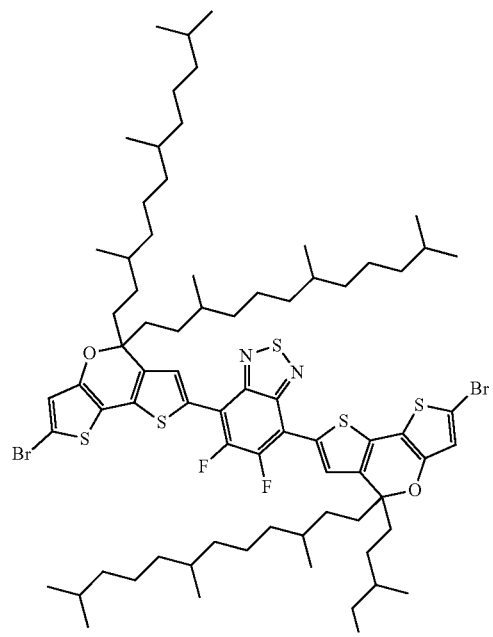

26

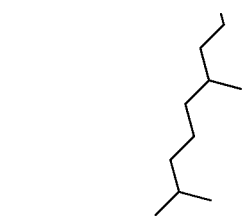

In a four-necked flask, 1.214 g (0.868 mmol) of compound 25 and 40 mL of tetrahydrofuran (THF) were added, and bubbled with argon at room temperature (25° C.) for 30 minutes. After cooling the reaction solution to 0° C., 340 mg (1.91 mmol) of NBS was added, and the temperature was raised to 40° C. After 1 hour, disappearance of starting materials was confirmed by liquid chromatography. Then the reaction solution was added with a sodium thiosulfate aqueous solution, followed by hexane to extract an organic layer. The hexane solution was caused to pass through a column using hexane as a developing solvent, and the solvent was removed to obtain 1.23 g of compound 26.

$^1$H-NMR (CDCl$_3$, δ (ppm)): 0.65-0.96 (m, 48H), 0.98-1.62 (m, 68H), 1.95 (m, 8H), 6.73 (s, 2H), 7.90 (s, 2H)

$^{19}$F-NMR (CDCl$_3$, δ (ppm)): −129 (s, 2F)

Reference Example 15

Synthesis of Compound 27

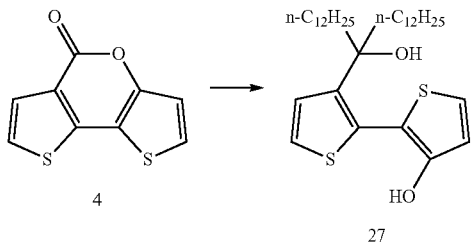

In a four-necked flask, 10.00 g (48.02 mmol) of compound 4 and 400 mL of tetrahydrofuran were added, and bubbled with argon at room temperature (25° C.) for 30 minutes. After cooling the reaction solution to −40° C., 144 mL of a diethylether solution containing 1.0 mol/L of dodecyl magnesium bromide was added, and stirred while the temperature was raised to 0° C. After 3 hours, disappearance of starting materials was confirmed by liquid chromatography.

The reaction solution was added with water and chloroform, to extract an organic layer, and the chloroform solution was caused to pass through a column using chloroform as a developing solvent, and the solvent was removed to obtain mixed oil containing compound 27.

Reference Example 16

Synthesis of Compound 28

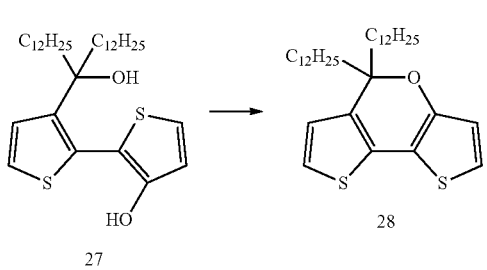

In a four-necked flask, the total mixed oil containing compound 27 synthesized in Reference example 15 and 200 mL of toluene were added, and bubbled with argon at room temperature (25° C.) for 30 minutes. Then after adding 1000 mg of para-toluenesulfonic acid monohydrate to the reaction solution, the temperature was raised to 120° C. and stirred, and after 1 hour, disappearance of starting materials was confirmed by liquid chromatography. The reaction solution was added with water and ethyl acetate, to extract an organic layer. The ethyl acetate solution was caused to pass through a column using hexane as a developing solvent, and then the solvent was removed to obtain 21.1 g of compound 28.

$^1$H-NMR (CDCl$_3$, δ (ppm)): 0.83 (t, 6H), 1.21 (m, 36H), 1.43 (m, 4H), 1.96 (t, 4H), 6.67 (d, 1H), 6.69 (d, 1H), 6.96 (d, 1H), 7.03 (d, 1H)

Reference Example 17

Synthesis of Compound 29

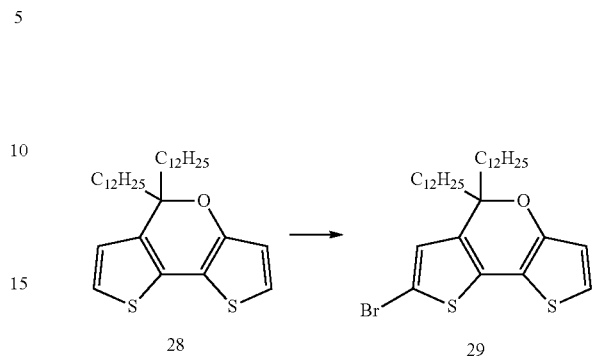

In a four-necked flask, 21.1 g (39.8 mmol) of compound 28 and 420 mL of tetrahydrofuran were added, and bubbled with argon at room temperature (25° C.) for 30 minutes. After cooling the reaction solution to −30° C., 6.38 g (35.8 mmol) of N-bromosuccinimide was added, and stirred at −10° C. for 2 hours. Disappearance of 90% of starting material was confirmed by liquid chromatography, and the reaction was stopped. The reaction solution was added with water and diethylether, to extract an organic layer, and the diethylether solution was caused to pass through a column using hexane, and then the solvent was removed to obtain 23.0 g of compound 29.

$^1$H-NMR (CDCl$_3$, δ (ppm)): 0.83 (t, 6H), 1.21 (m, 36H), 1.43 (m, 4H), 1.96 (t, 4H), 6.65 (d, 1H), 6.66 (s, 1H), 6.98 (s, 1H)

Example 12

Synthesis of Compound 30

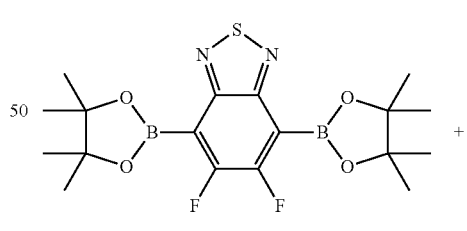

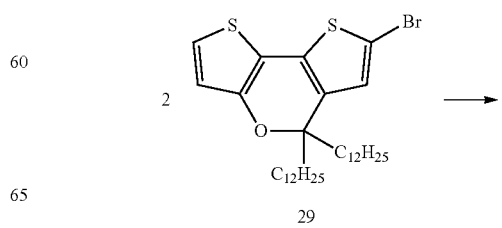

149

-continued

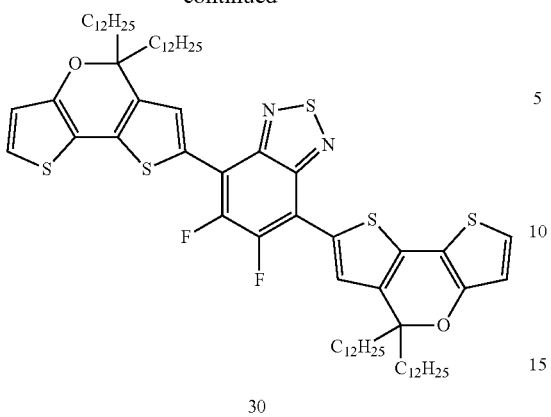

30

In a four-necked flask, 3.388 g (5.556 mmol) of compound 29 and 50 mL of methylene chloride were added, and bubbled with argon at room temperature (25° C.) for 30 minutes. Then the reaction solution was added with 86.4 mg (0.094 mmol) of tris(dibenzylideneacetone) palladium, 109.5 mg (0.377 mmol) of [tri(ter-butyl)phosphonium]tetrafluoroborate and 11.79 g (23.58 mmol) of a 2 mol/L potassium phosphate aqueous solution. While the reaction solution was stirred at 45° C., a solution dissolving 1.000 g of compound 18 (2.358 mmol) in 50 mL of methylene chloride was added dropwise over 20 minutes. After 2 hours, disappearance of starting materials was confirmed by liquid chromatography. The reaction solution was added with water and hexane, to extract an organic layer, and the hexane solution was caused to pass through a column using hexane as a developing solvent, and then the solvent was removed to obtain 1.88 g of compound 30.

$^1$H-NMR (CDCl$_3$, δ (ppm)): 0.86 (t, 12H), 0.95-1.50 (m, 80H), 1.97 (m, 8H), 6.71 (d, 2H), 7.07 (d, 2H), 7.92 (d, 2H)

$^{19}$F-NMR (CDCl$_3$, δ (ppm)): −125 (s, 2F)

Example 13

Synthesis of Compound 31

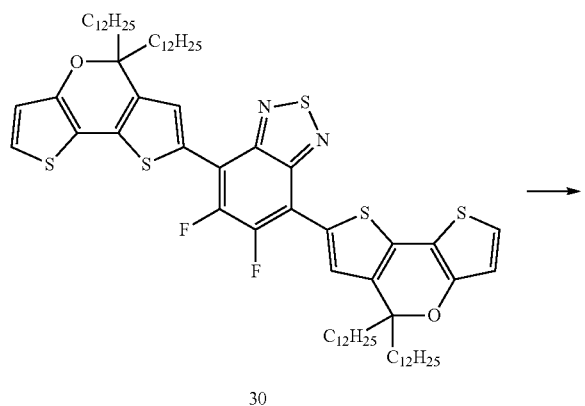

30

150

-continued

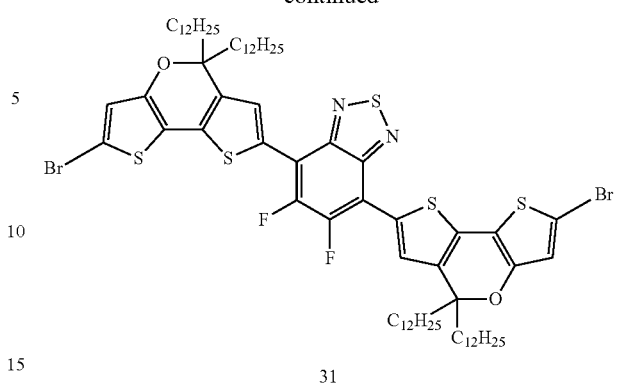

31

In a four-necked flask, 1.884 g (1.532 mmol) of compound 30 and 60 mL of tetrahydrofuran (THF) were added, and bubbled with argon at room temperature (25° C.) for 30 minutes. After cooling the reaction solution to 0° C., 600 mg (3.37 mmol) of NBS was added, and the temperature was raised to 40° C. After 1 hour, disappearance of starting materials was confirmed by liquid chromatography. Then, the reaction solution was added with a sodium thiosulfate aqueous solution, followed by hexane to extract an organic layer. Then, the hexane solution was caused to pass through a column using hexane as a developing solvent, and then the solvent was removed to obtain 1.88 g of compound 31.

$^1$H-NMR (CDCl$_3$, δ (ppm)): 0.86 (t, 12H), 1.18-1.50 (m, 80H), 1.95 (m, 8H), 6.72 (s, 2H), 7.90 (s, 2H)

$^{19}$F-NMR (CDCl$_3$, δ (ppm)): −129 (s, 2F)

Reference Example 18

Synthesis of Compound 32

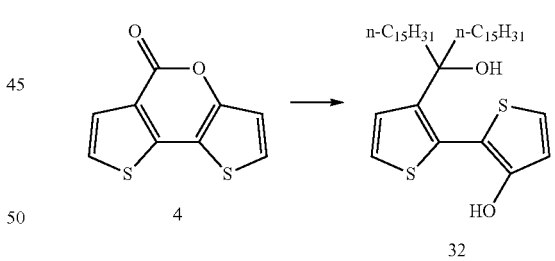

In a four-necked flask, 6.00 g (28.81 mmol) of compound 4 and 240 mL of tetrahydrofuran were added, and bubbled with argon at room temperature (25° C.) for 30 minutes. After cooling the reaction solution to −40° C., 173 mL of a tetrahydrofuran solution containing 0.5 mol/L pentadecyl magnesium bromide was added and stirred while the temperature was raised to 0° C. After 3 hours, disappearance of starting materials was confirmed by liquid chromatography.

The reaction solution was added with water and chloroform, to extract an organic layer, and the chloroform solution was caused to pass through a column using chloroform as a developing solvent, and then the solvent was removed to obtain mixed oil containing compound 32.

Reference Example 19

Synthesis of Compound 33

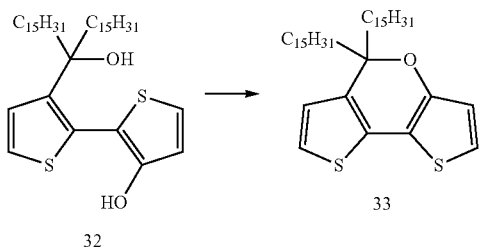

In a four-necked flask, the total mixed oil containing compound 32 synthesized in Reference example 18 and 120 mL of toluene were added, and bubbled with argon at room temperature (25° C.) for 30 minutes. The reaction solution was added with 600 mg of para-toluenesulfonic acid monohydrate, and then the temperature was raised to 120° C. and stirred, and after 1 hour, disappearance of starting materials was confirmed by liquid chromatography. The reaction solution was added with water and ethyl acetate, to extract an organic layer. The ethyl acetate solution was caused to pass through a column using hexane as a developing solvent, and then the solvent was removed to obtain 18.4 g of compound 33.

$^1$H-NMR (CDCl$_3$, δ (ppm)): 0.82 (t, 6H), 1.21 (m, 48H), 1.43 (m, 4H), 1.96 (t, 4H), 6.67 (d, 1H), 6.69 (d, 1H), 6.96 (d, 1H), 7.03 (d, 1H)

Reference Example 20

Synthesis of Compound 34

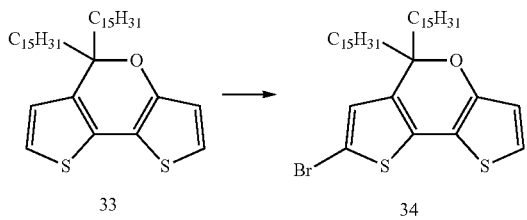

In a four-necked flask, 23.2 g (37.8 mmol) of compound 33 and 340 mL of tetrahydrofuran were added, and bubbled with argon at room temperature (25° C.) for 30 minutes. After cooling the reaction solution to −30° C., 6.05 g (34.0 mmol) of N-bromosuccinimide was added, and stirred at −10° C. for 2 hours. Disappearance of 90% of starting material was confirmed by liquid chromatography, and the reaction was stopped. The reaction solution was added with water and diethylether, to extract an organic layer, and the diethylether solution was caused to pass through a column using hexane as a developing solvent. The solvent was removed, to obtain 23.3 g of compound 34.

$^1$H-NMR (CDCl$_3$, δ (ppm)): 0.83 (t, 6H), 1.23 (m, 48H), 1.44 (m, 4H), 1.98 (t, 4H), 6.65 (d, 1H), 6.66 (s, 1H), 6.98 (s, 1H)

Example 14

Synthesis of Compound 35

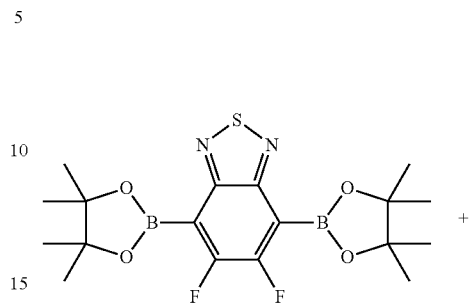

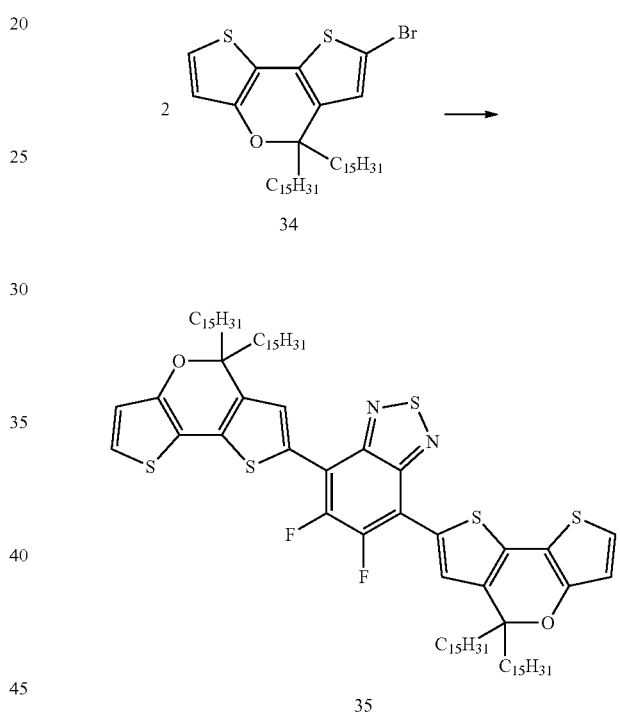

In a four-necked flask, 1.695 g (2.442 mmol) of compound 34 and 50 mL of methylene chloride were added, and bubbled with argon at room temperature (25° C.) for 30 minutes. Then the reaction solution was added with 21.6 mg (0.024 mmol) of tris(dibenzylideneacetone) palladium, 27.4 mg (0.094 mmol) of [tri(ter-butyl)phosphonium]tetrafluoroborate, and 5.90 g (11.79 mmol) of a 2 mol/L potassium phosphate aqueous solution. While the reaction solution was stirred at 45° C., a solution dissolving 0.500 g of compound 18 (1.179 mmol) in 10 mL of methylene chloride was added dropwise over 20 minutes. After 2 hours, disappearance of starting materials was confirmed by liquid chromatography. The reaction solution was added with water and hexane, to extract an organic layer, and the hexane solution was caused to pass through a column using hexane as a developing solvent, and then the solvent was removed to obtain 1.00 g of compound 35.

$^1$H-NMR (CDCl$_3$, δ (ppm)): 0.87 (t, 12H), 0.90-1.46 (m, 104H), 1.97 (m, 8H), 6.71 (d, 2H), 7.07 (d, 2H), 7.93 (s, 2H)

$^{19}$F-NMR (CDCl$_3$, δ (ppm)): −125 (s, 2F)

Example 15

Synthesis of Compound 36

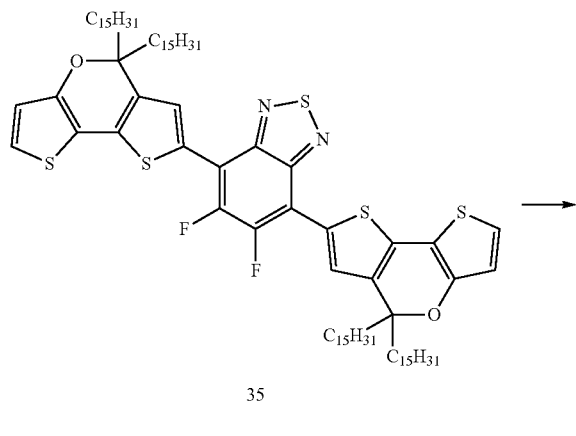

35

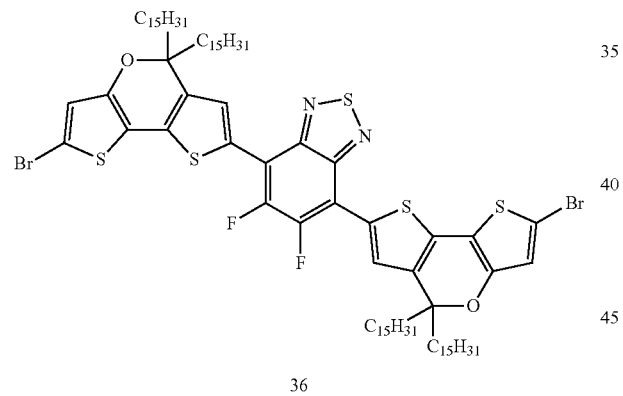

36

In a four-necked flask, 1.001 g (0.716 mmol) of compound 35 and 30 mL of tetrahydrofuran (THF) were added, and bubbled with argon at room temperature (25° C.) for 30 minutes. After cooling the reaction solution to 0° C., 280 mg (1.573 mmol) of NBS was added, and the temperature was raised to 40° C. After 1 hour, disappearance of starting materials was confirmed by liquid chromatography. Then the reaction solution was added with a sodium thiosulfate aqueous solution, followed by hexane, to extract an organic layer. Then the hexane solution was caused to pass through a column using hexane as a developing solvent, and then the solvent was removed to obtain 1.04 g of compound 36.

$^1$H-NMR (CDCl$_3$, δ (ppm)): 0.87 (t, 12H), 0.95-1.50 (m, 104H), 1.95 (m, 8H), 6.72 (s, 2H), 7.90 (s, 2H)

$^{19}$F-NMR (CDCl$_3$, δ (ppm)): −129 (s, 2F)

Reference Example 21

Synthesis of Compound 37

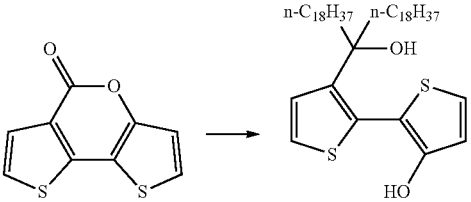

4                37

In a four-necked flask, 3.50 g (144.1 mmol) of magnesium, 72 mL of tetrahydrofuran, and 24.01 g (72.03 mmol) of octadecylbromide were added, to prepare a 1 mol/L Grignard reagent. In another four-necked flask, 5.00 g (24.01 mmol) of compound 4 and 200 mL of tetrahydrofuran were added, and bubbled with argon at room temperature (25° C.) for 30 minutes. After cooling the reaction solution to −40° C., the prepared Grignard reagent was added, and the reaction solution was stirred while the temperature was raised to 0° C. After 3 hours, disappearance of starting materials was confirmed by liquid chromatography.

The reaction solution was added with water and chloroform, to extract an organic layer, and the chloroform solution was caused to pass through a column using chloroform as a developing solvent, and then the solvent was removed to obtain mixed oil containing compound 37.

Reference Example 22

Synthesis of Compound 38

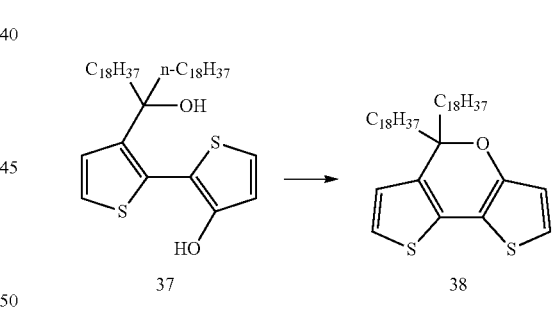

37                38

In a four-necked flask, the total mixed oil containing compound 37 synthesized in Reference example 21 and 200 mL of toluene were added, and bubbled with argon at room temperature (25° C.) for 30 minutes. Then the reaction solution was added with 1000 mg of para-toluenesulfonic acid monohydrate, and the temperature was raised to 120° C. and stirred, and after 1 hour, disappearance of starting materials was confirmed by liquid chromatography. The reaction solution was added with water and ethyl acetate, to extract an organic layer. The ethyl acetate solution was caused to pass through a column using hexane as a developing solvent, and then the solvent was removed to obtain 23.1 g of compound 38.

$^1$H-NMR (CDCl$_3$, δ (ppm)): 0.81 (t, 6H), 1.21 (m, 60H), 1.43 (m, 4H), 1.96 (t, 4H), 6.67 (d, 1H), 6.69 (d, 1H), 6.96 (d, 1H), 7.03 (d, 1H)

Reference Example 23

Synthesis of Compound 39

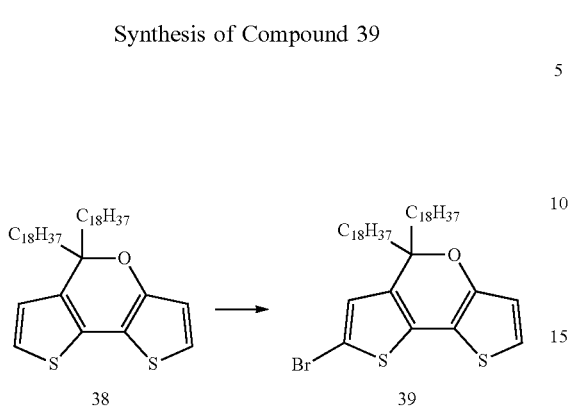

In a four-necked flask, 1.500 g (2.145 mmol) of compound 38 and 150 mL of tetrahydrofuran were added, and bubbled with argon at room temperature (25° C.) for 30 minutes. After cooling the reaction solution to −30° C., 343.3 mg (1.931 mmol) of N-bromosuccinimide was added, and stirred at −10° C. for 2 hours. Disappearance of 90% of starting material was confirmed by liquid chromatography, and the reaction was stopped. The reaction solution was added with water and diethylether, to extract an organic layer, and the diethylether solution was caused to pass through a column using hexane as a developing solvent. The solvent was removed, to obtain 1.657 g of compound 39.

$^1$H-NMR (CDCl$_3$, δ (ppm)): 0.83 (t, 6H), 1.21 (m, 60H), 1.43 (m, 4H), 1.97 (t, 4H), 6.65 (d, 1H), 6.66 (s, 1H), 6.97 (s, 1H)

Example 16

Synthesis of Compound 40

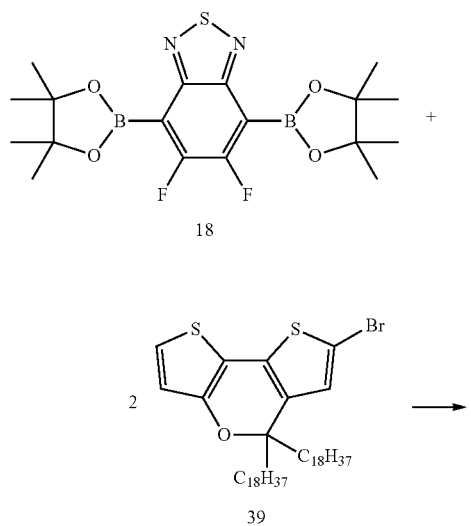

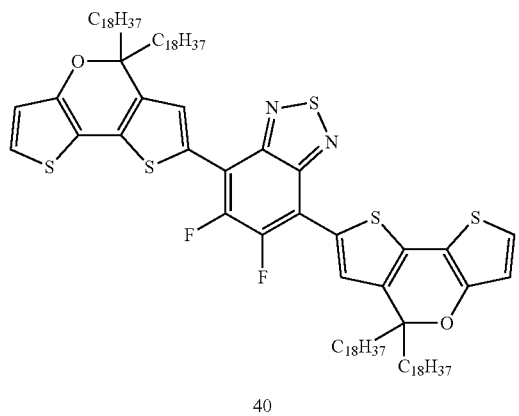

In a four-necked flask, 1.657 g (2.129 mmol) of compound 39 and 22 mL of methylene chloride were added, and bubbled with argon at room temperature (25° C.) for 30 minutes. Then the reaction solution was added with 38.8 mg (0.042 mmol) of tris(dibenzylideneacetone) palladium, 49.2 mg (0.170 mmol) of [tri(ter-butyl)phosphonium]tetrafluoroborate and 5.30 g (10.60 mmol) of a 2 mol/L potassium phosphate aqueous solution. While the reaction solution was stirred at 45° C., a solution dissolving 0.450 g of compound 18 (1.061 mmol) in 20 mL of methylene chloride was added dropwise over 20 minutes. After 2 hours, disappearance of starting materials was confirmed by liquid chromatography. The reaction solution was added with water and hexane, to extract an organic layer, and the hexane solution was caused to pass through a column using hexane as a developing solvent, and then the solvent was removed to obtain 1.657 g of compound 40.

$^1$H-NMR (CDCl$_3$, δ (ppm)): 0.88 (t, 12H), 0.95-1.53 (m, 128H), 1.97 (m, 8H), 6.71 (d, 2H), 7.08 (d, 2H), 7.93 (d, 2H)

$^{19}$F-NMR (CDCl$_3$, δ (ppm)): −125 (s, 2F)

Example 17

Synthesis of Compound 41

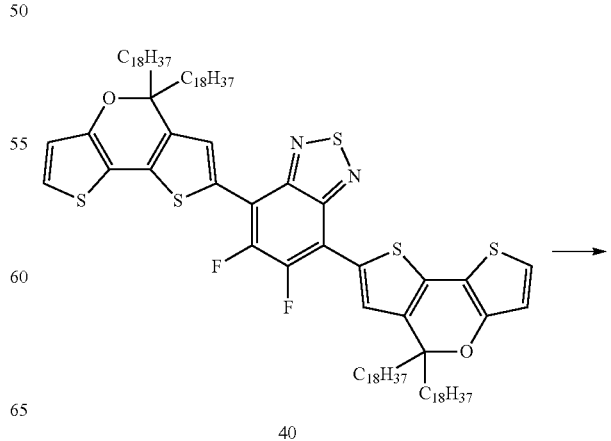

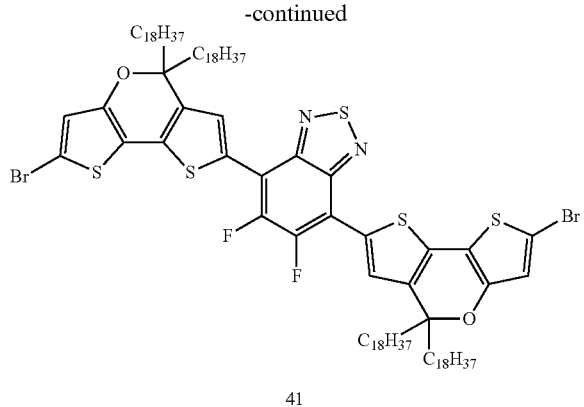

41

In a four-necked flask, 1.166 g (0.744 mmol) of compound 40 and 120 mL of tetrahydrofuran (THF) were added, and bubbled with argon at room temperature (25° C.) for 30 minutes. After cooling the reaction solution to 0° C., 291 mg (1.64 mmol) of NBS was added, and the temperature was raised to 40° C. After 1 hour, disappearance of starting materials was confirmed by liquid chromatography. Then the reaction solution was added with a sodium thiosulfate aqueous solution, followed by hexane, to extract an organic layer. Then the hexane solution was caused to pass through a column using hexane as a developing solvent, and the solvent was removed to obtain 1.18 g of compound 41.

$^1$H-NMR (CDCl$_3$, δ (ppm)): 0.87 (t, 12H), 0.95-1.50 (m, 128H), 1.95 (m, 8H), 6.72 (s, 2H), 7.90 (s, 2H)
$^{19}$F-NMR (CDCl$_3$, δ (ppm)): −129 (s, 2F)

Example 18

Synthesis of Polymer Compound F

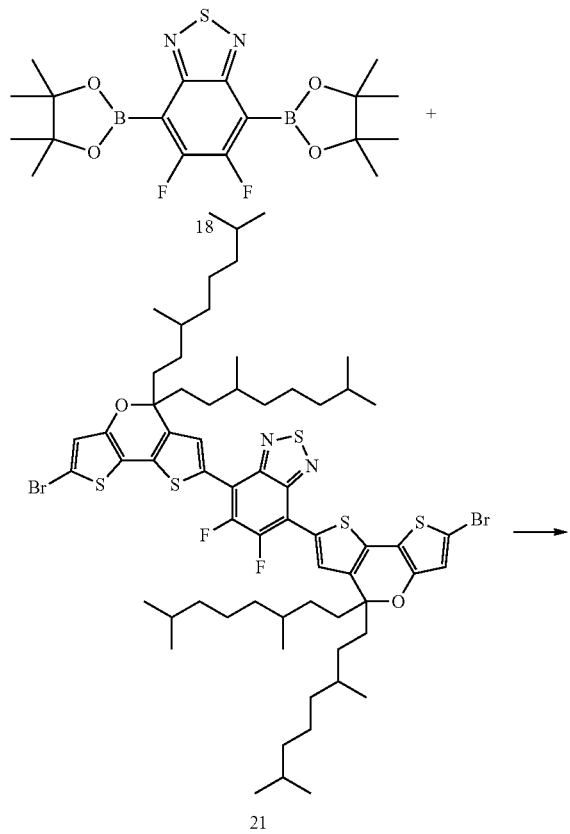

21

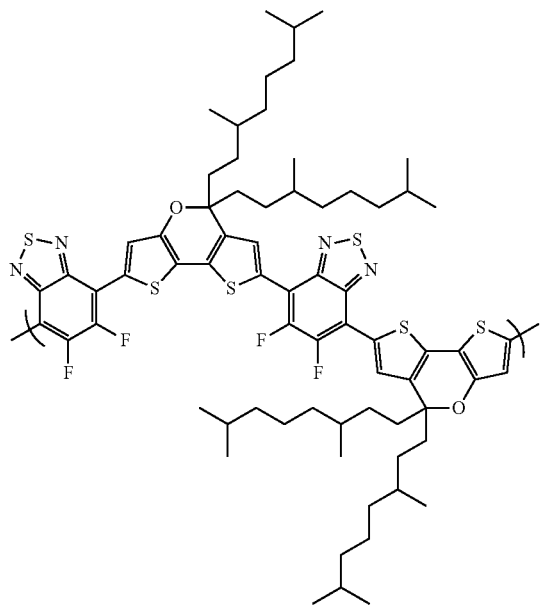

Polymer compound F

In a four-necked flask, 191.3 mg (0.150 mmol) of compound 21 and 24 mL of methylene chloride were added, and bubbled with argon at room temperature (25° C.) for 30 minutes. Then the reaction solution was added with 2.75 mg (0.003 mmol) of tris(dibenzylideneacetone) palladium, 3.48 mg (0.012 mmol) of [tri(ter-butyl)phosphonium]tetrafluoroborate, and 0.8 g (1.6 mmol) of a 2 mol/L potassium phosphate aqueous solution. While the reaction solution was stirred in the condition that the temperature of the oil bath was 40° C., a solution dissolving 63.6 mg of compound 18 (0.150 mmol) in 6 mL of methylene chloride was added dropwise for 10 minutes, and stirred for 30 minutes. Then the reaction solution was added with 15.0 mg (0.123 mmol) of phenylboric acid, and stirred for another 1 hour, and then the reaction was stopped. The reaction was conducted in an argon atmosphere. Then the reaction solution was added with 1 g of sodium diethyldithiocarbamate and 10 mL of pure water, and stirred for 3 hours under reflux. After removing the aqueous layer in the reaction liquid, the organic layer was washed twice with 50 mL of water, twice with 50 mL of 3 weight (wt) % acetic acid aqueous solution, and twice with 50 mL water, and poured into methanol to make polymer precipitate. After filtering the polymer, it was dried, and the obtained polymer was dissolved in toluene. The toluene solution was caused to pass through an alumina/silica gel column, and the obtained solution was poured into methanol to make polymer precipitate. After filtering the polymer, it was dried to obtain 50 mg of polymer compound F.

Molecular weights (in terms of polystyrene) of polymer compound F measured by GPC were 25,000 of weight average molecular weight (Mw) and 10,000 of number average molecular weight (Mn). Absorption edge wavelength of polymer compound F was 940 nm.

Example 19

Synthesis of Polymer Compound G

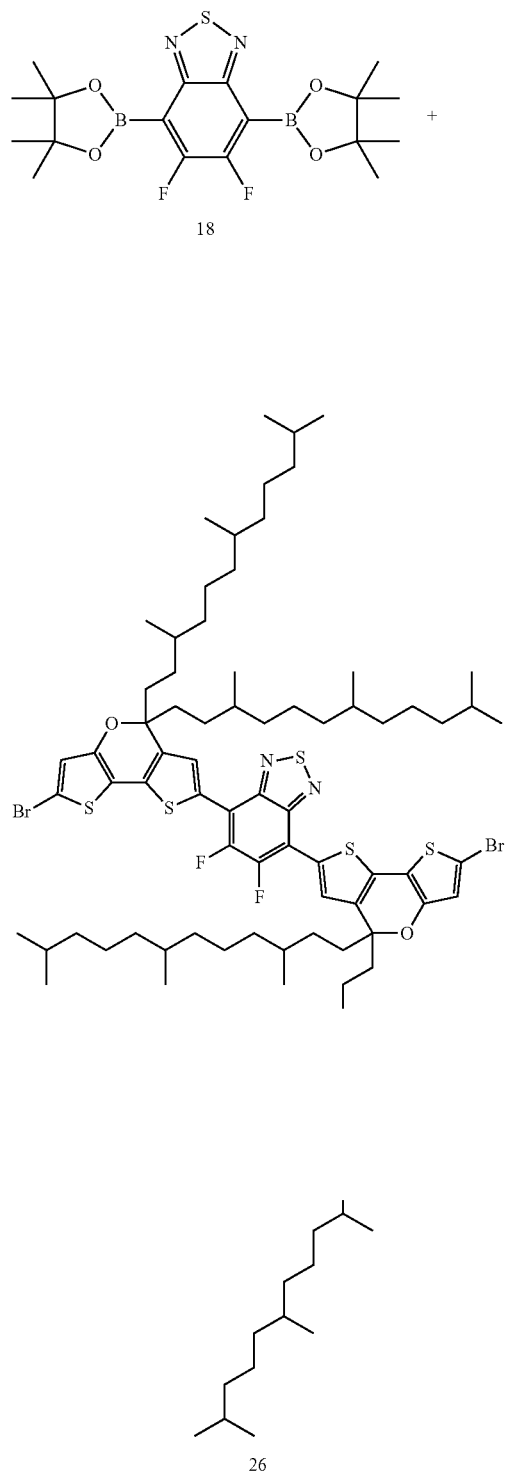

26

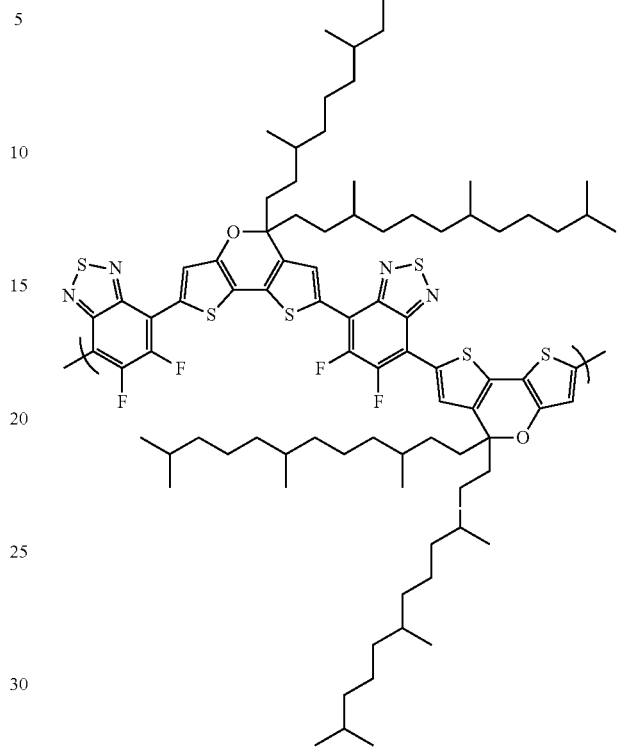

Polymer compound G

In a four-necked flask, 440.0 mg (0.280 mmol) of compound 26 and 50 mL of methylene chloride were added, and bubbled with argon at room temperature (25° C.) for 30 minutes. Then the reaction solution was added with 5.49 mg (0.006 mmol) of tris(dibenzylideneacetone) palladium, 6.96 mg (0.024 mmol) of [tri(ter-butyl)phosphonium]tetrafluoroborate, and 1.5 g (3.0 mmol) of a 2 mol/L potassium phosphate aqueous solution. While the reaction solution was stirred in the condition that the temperature of the oil bath was 40° C., a solution dissolving 120.0 mg of compound 18 (0.280 mmol) in 12 mL of methylene chloride was added dropwise over 10 minutes, and stirred for 30 minutes. Then the reaction solution was added with 150 mg (1.23 mmol) of phenylboric acid, and stirred for another 1 hour, and then the reaction was stopped. The reaction was conducted in an argon atmosphere.

Then the reaction solution was added with 10 g of sodium diethyldithiocarbamate and 100 mL of pure water, and stirred for 3 hours under reflux. After removing the aqueous layer in the reaction liquid, the organic layer was washed twice with 500 mL of water, twice with 200 mL of a 3 weight (wt) % acetic acid aqueous solution, and twice with 200 mL of water, and poured into methanol to make polymer precipitate. After filtering the polymer, it was dried, and the obtained polymer was dissolved in toluene. The toluene solution was caused to pass through an alumina/silica gel column, and the obtained solution was poured into methanol to make polymer precipitate. After filtering the polymer, it was dried to obtain 150 mg of polymer compound G.

Molecular weights (in terms of polystyrene) of polymer compound G measured by GPC were 8,500 of weight average molecular weight (Mw) and 4,000 of number average molecular weight (Mn). Absorption edge wavelength of polymer compound G was 940 nm.

Example 20

Synthesis of Polymer Compound H

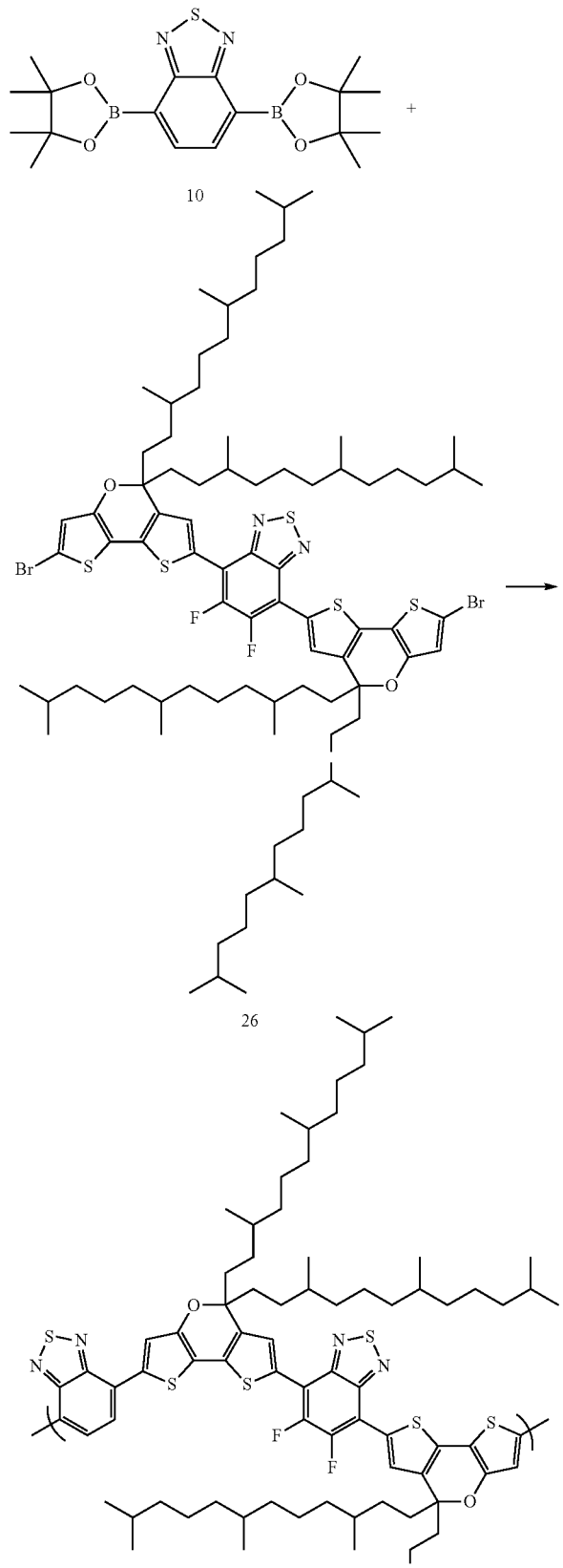

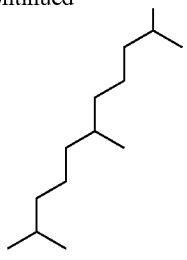

Polymer compound H

In a four-necked flask, 50.5 mg (0.032 mmol) of compound 26 and 10 mL of tetrahydrofuran were added, and bubbled with argon at room temperature (25° C.) for 30 minutes. Then the reaction solution was added with 5.49 mg (0.006 mmol) of tris(dibenzylideneacetone) palladium, 6.96 mg (0.024 mmol) of [tri(ter-butyl)phosphonium]tetrafluoroborate, and 1.5 g (3.0 mmol) of a 2 mol/L potassium phosphate aqueous solution. While the reaction solution was stirred in the condition that the temperature of the oil bath was 40° C., a solution dissolving 12.4 mg of compound 10 (0.032 mmol) in 5 mL of tetrahydrofuran was added dropwise over 10 minutes, and stirred for 30 minutes. The reaction solution was added with 30.0 mg (0.246 mmol) of phenylboric acid, and stirred for another 1 hour, and then the reaction was stopped. The reaction was conducted in an argon atmosphere.

Then the reaction solution was added with 1.5 g of sodium diethyldithiocarbamate and 13.5 mL of pure water, and stirred for 3 hours under reflux. After removing the aqueous layer in the reaction liquid, the organic layer was washed twice with 15 mL of water, twice with 15 mL of a 3 weight (wt) % acetic acid aqueous solution, and twice with 15 mL of water, and poured into methanol to make polymer precipitate. After filtering the polymer, it was dried, and the obtained polymer was dissolved in toluene. The toluene solution was caused to pass through an alumina/silica gel column, and the obtained solution was poured into methanol to make polymer precipitate. After filtering the polymer, it was dried to obtain 24 mg of polymer compound H.

Molecular weights (in terms of polystyrene) of polymer compound H measured by GPC were 25,000 of weight average molecular weight (Mw) and 10,000 of number average molecular weight (Mn). Absorption edge wavelength of polymer compound H was 940 nm.

Example 21

Synthesis of Polymer Compound I

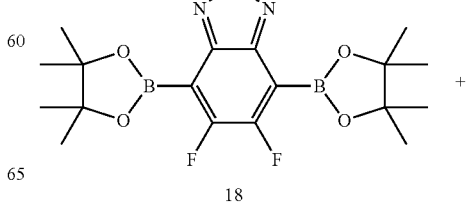

163

-continued

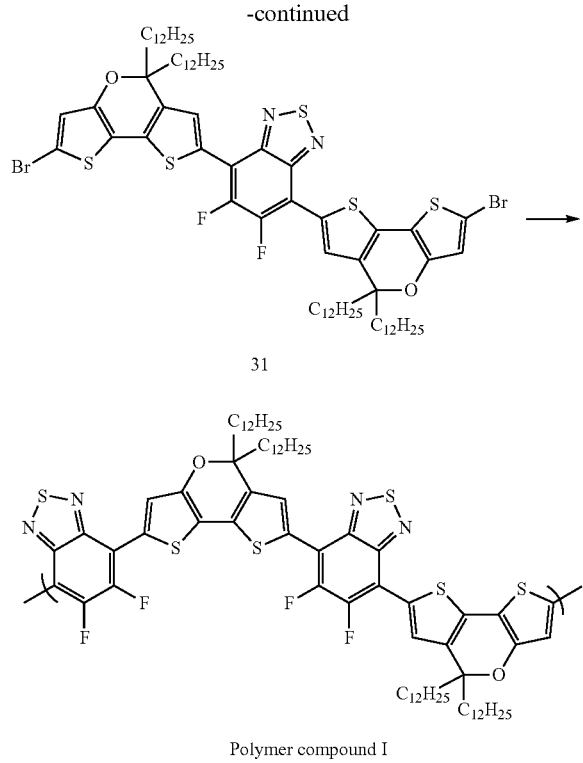

Polymer compound I

In a four-necked flask, 416.3 mg (0.300 mmol) of compound 31 and 10 mL of methylene chloride were added, and bubbled with argon at room temperature (25° C.) for 30 minutes. Then the reaction solution was added with 10.99 mg (0.012 mmol) of tris(dibenzylideneacetone) palladium, 13.93 mg (0.048 mmol) of [tri(ter-butyl)phosphonium]tetrafluoroborate, and 1.5 g (3.0 mmol) of a 2 mol/L potassium phosphate aqueous solution. While the reaction solution was stirred in the condition that the temperature of the oil bath was 40° C., a solution dissolving 127.2 mg of compound 18 (0.300 mmol) in 10 mL of methylene chloride was added dropwise over 10 minutes, and stirred for 30 minutes. Then the reaction solution was added with 30.0 mg (0.246 mmol) of phenylboric acid, and stirred for another 1 hour, and then the reaction was stopped. The reaction was conducted in an argon atmosphere.

Then the reaction solution was added with 2.5 g of sodium diethyldithiocarbamate and 22.5 mL of pure water, and stirred for 3 hours under reflux. After removing the aqueous layer in the reaction liquid, the organic layer was washed twice with 30 mL of water, twice with 30 mL of a 3 weight (wt) % acetic acid aqueous solution, and twice with 30 mL of water, and poured into methanol to make polymer precipitate. After filtering the polymer, it was dried, and the obtained polymer was dissolved in toluene. The toluene solution was caused to pass through an alumina/silica gel column, and the obtained solution was poured into methanol to make polymer precipitate. After filtering the polymer, it was dried to obtain 156 mg of polymer compound I.

Molecular weights (in terms of polystyrene) of polymer compound I measured by GPC were 76,000 of weight average molecular weight (Mw) and 31,000 of number average molecular weight (Mn). Absorption edge wavelength of polymer compound I was 940 nm.

164

Example 22

Synthesis of Polymer Compound J

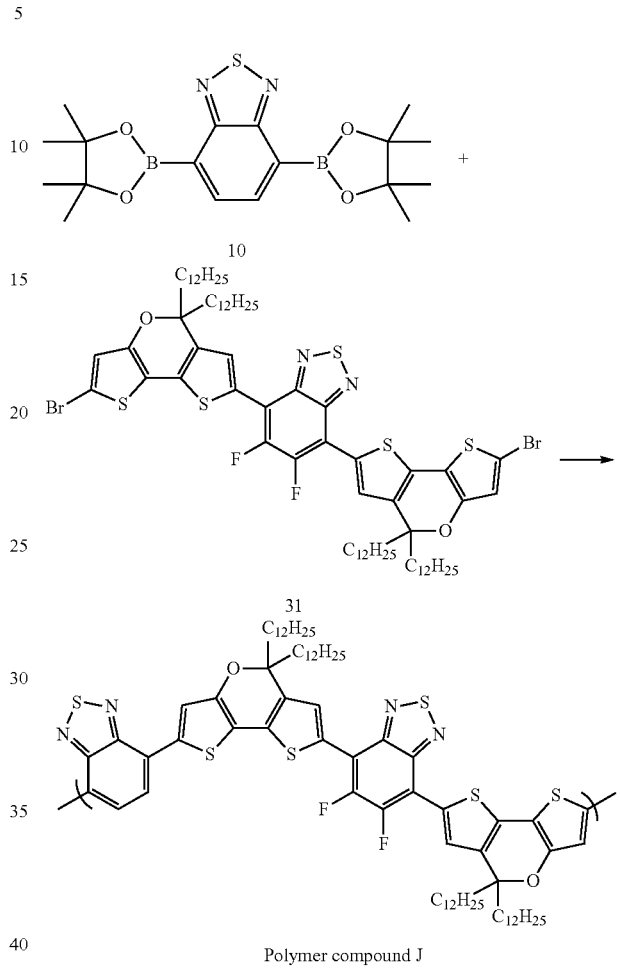

Polymer compound J

In a four-necked flask, 277.5 mg (0.200 mmol) of compound 31 and 40 mL of tetrahydrofuran were added, and bubbled with argon at room temperature (25° C.) for 30 minutes. Then the reaction solution was added with 3.66 mg (0.004 mmol) of tris(dibenzylideneacetone) palladium, 4.64 mg (0.016 mmol) of [tri(ter-butyl)phosphonium]tetrafluoroborate, and 1.0 g (2.0 mmol) of a 2 mol/L potassium phosphate aqueous solution. While the reaction solution was stirred in the condition that the temperature of the oil bath was 40° C., a solution dissolving 77.6 mg of compound 10 (0.200 mmol) in 10 mL of tetrahydrofuran was added dropwise over 10 minutes, and stirred for 30 minutes. Then the reaction solution was added with 20.0 mg (0.164 mmol) of phenylboric acid, and stirred for another 1 hour, and then the reaction was stopped. The reaction was conducted in an argon atmosphere.

Then the reaction solution was added with 1.0 g of sodium diethyldithiocarbamate and 9.0 mL of pure water, and stirred for 3 hours under reflux. After removing the aqueous layer in the reaction liquid, the organic layer was washed twice with 10 mL of water, twice with 10 mL of a 3 weight (wt) % acetic acid aqueous solution, and twice with 10 mL of water, and poured into methanol to make polymer precipitate. After filtering the polymer, it was dried, and the obtained polymer was dissolved in toluene. The toluene solution was caused to pass through an alumina/silica gel column, and the obtained solution was poured into methanol to make polymer precipitate. After filtering the polymer, it was dried to obtain 44 mg of polymer compound J.

Molecular weights (in terms of polystyrene) of polymer compound J measured by GPC were 35,000 of weight average molecular weight (Mw) and 15,000 of number average molecular weight (Mn). Absorption edge wavelength of polymer compound J was 950 nm.

Example 23

Synthesis of Polymer Compound K

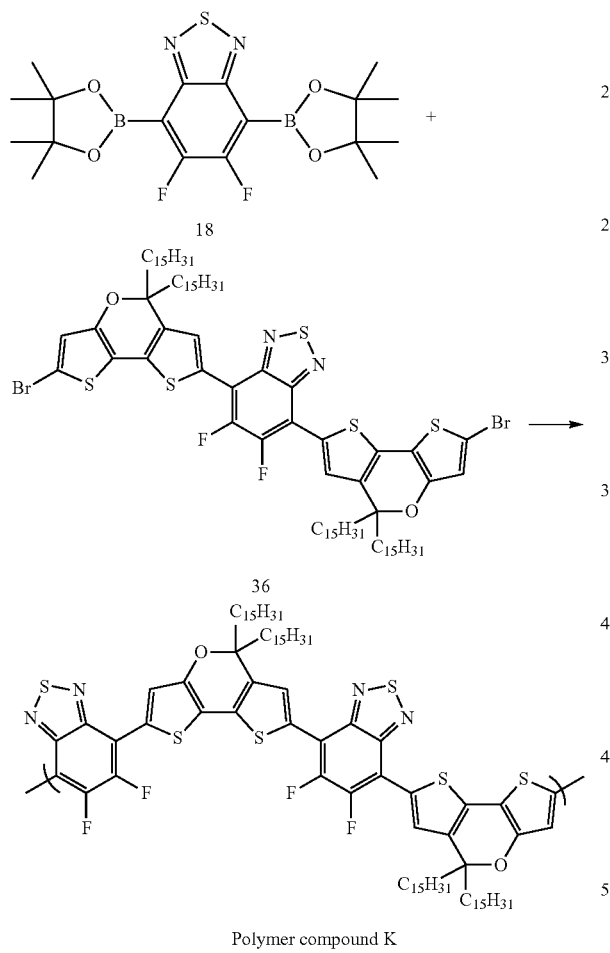

Polymer compound K

In a four-necked flask, 311.2 mg (0.200 mmol) of compound 36 and 10 mL of methylene chloride were added, and bubbled with argon at room temperature (25° C.) for 30 minutes. Then the reaction solution was added with 7.32 mg (0.008 mmol) of tris(dibenzylideneacetone) palladium, 9.28 mg (0.032 mmol) of [tri(ter-butyl)phosphonium]tetrafluoroborate, and 1.0 g (2.0 mmol) of a 2 mol/L potassium phosphate aqueous solution. While the reaction solution was stirred in the condition that the temperature of the oil bath was 40° C., a solution dissolving 84.8 mg of compound 18 (0.200 mmol) in 10 mL of methylene chloride was added dropwise over 10 minutes, and stirred for 30 minutes. Then the reaction solution was added with 20.0 mg (0.164 mmol) of phenylboric acid, and stirred for another 1 hour, and then the reaction was stopped. The reaction was conducted in an argon atmosphere.

Then the reaction solution was added with 1.7 g of sodium diethyldithiocarbamate and 15.0 mL of pure water, and stirred for 3 hours under reflux. After removing the aqueous layer in the reaction liquid, the organic layer was washed twice with 20 mL of water, twice with 20 mL of a 3 weight (wt) % acetic acid aqueous solution, and twice with 20 mL of water, and poured into methanol to make polymer precipitate. After filtering the polymer, it was dried, and the obtained polymer was dissolved in toluene. The toluene solution was caused to pass through an alumina/silica gel column, and the obtained solution was poured into methanol to make polymer precipitate. After filtering the polymer, it was dried to obtain 197 mg of polymer compound K.

Molecular weights (in terms of polystyrene) of polymer compound K measured by GPC were 240,000 of weight average molecular weight (Mw) and 90,000 of number average molecular weight (Mn). Absorption edge wavelength of polymer compound K was 950 nm.

Example 24

Synthesis of Polymer Compound L

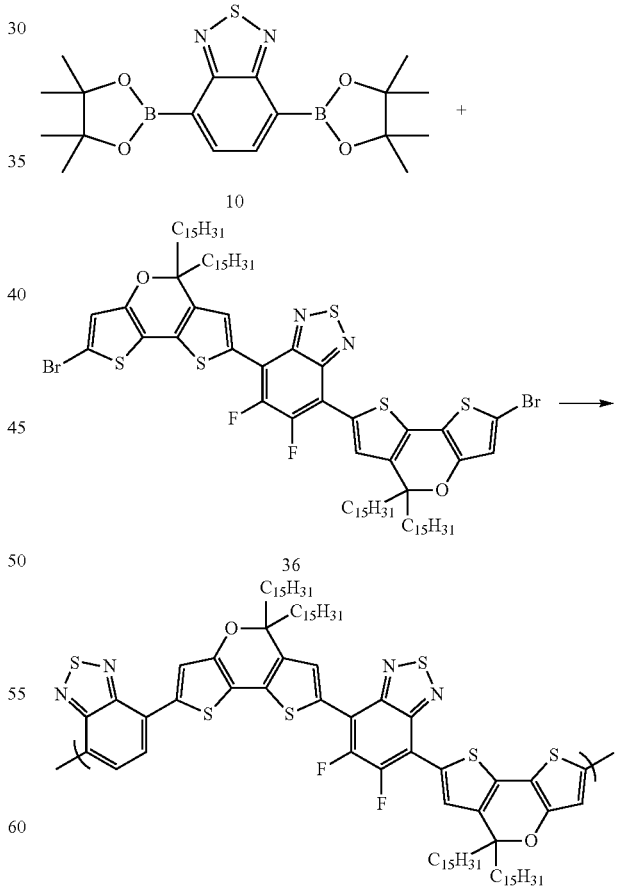

Polymer compound L

In a four-necked flask, 252.2 mg (0.162 mmol) of compound 36 and 20 mL of tetrahydrofuran were added, and bubbled with argon at room temperature (25° C.) for 30 minutes. Then the reaction solution was added with 3.66 mg (0.004 mmol) of tris(dibenzylideneacetone) palladium, 4.64 mg (0.016 mmol) of [tri(ter-butyl)phosphonium]tetrafluoroborate, and 1.0 g (2.0 mmol) of a 2 mol/L potassium phosphate aqueous solution. While the reaction solution was stirred in the condition that the temperature of the oil bath was 40° C., a solution dissolving 62.9 mg of compound 10 (0.162 mmol) in 10 mL of tetrahydrofuran was added dropwise over 10 minutes, and stirred for 30 minutes. Then the reaction solution was added with 20.0 mg (0.164 mmol) of phenylboric acid, and stirred for another 1 hour, and then the reaction was stopped. The reaction was conducted in an argon atmosphere.

Then the reaction solution was added with 1.0 g of sodium diethyldithiocarbamate and 9.0 mL of pure water, and stirred for 3 hours under reflux. After removing the aqueous layer in the reaction liquid, the organic layer was washed twice with 10 mL of water, twice with 10 mL of a 3 weight (wt) % acetic acid aqueous solution, and twice with 10 mL of water, and poured into methanol to make polymer precipitate. After filtering the polymer, it was dried, and the obtained polymer was dissolved in toluene. The toluene solution was caused to pass through an alumina/silica gel column, and the obtained solution was poured into methanol to make polymer precipitate. After filtering the polymer, it was dried to obtain 165 mg of polymer compound L.

Molecular weights (in terms of polystyrene) of polymer compound L measured by GPC were 300,000 of weight average molecular weight (Mw) and 100,000 of number average molecular weight (Mn). Absorption edge wavelength of polymer compound L was 950 nm.

Example 25

Synthesis of Polymer Compound M

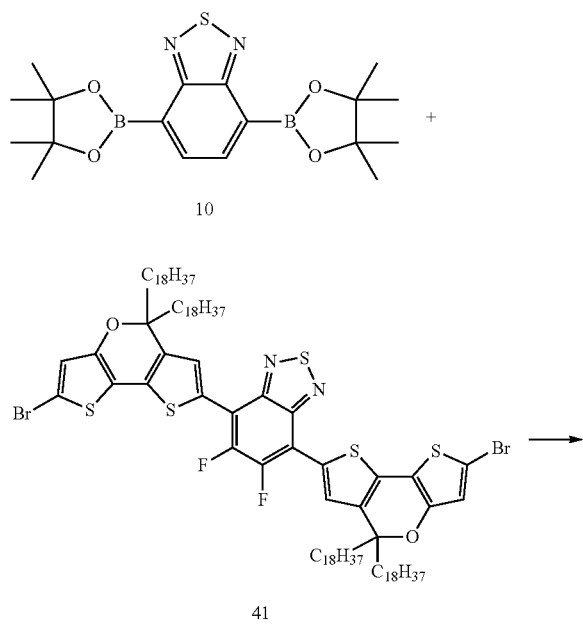

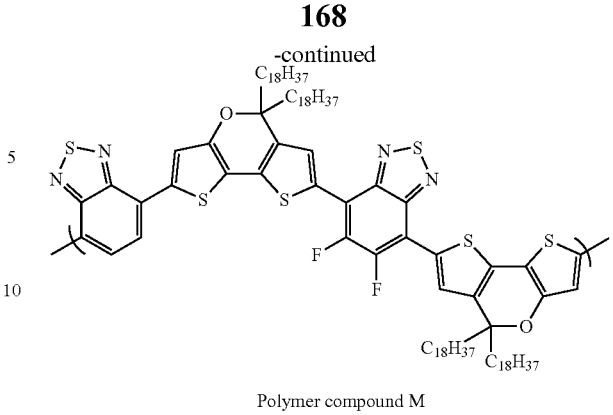

Polymer compound M

In a four-necked flask, 344.9 mg (0.200 mmol) of compound 41 and 12 mL of tetrahydrofuran were added, and bubbled with argon at room temperature (25° C.) for 30 minutes. Then the reaction solution was added with 3.66 mg (0.004 mmol) of tris(dibenzylideneacetone) palladium, 4.64 mg (0.016 mmol) of [tri(ter-butyl)phosphonium]tetrafluoroborate, and 1.0 g (2.0 mmol) of a 2 mol/L potassium phosphate aqueous solution. While the reaction solution was stirred in the condition that the temperature of the oil bath was 40° C., a solution dissolving 77.6 mg of compound 10 (0.200 mmol) in 10 mL of tetrahydrofuran was added dropwise over 10 minutes, and stirred for 30 minutes. Then the reaction solution was added with 20.0 mg (0.164 mmol) of phenylboric acid, and stirred for another 1 hour, and then the reaction was stopped. The reaction was conducted in an argon atmosphere.

Then the reaction solution was added with 1.0 g of sodium diethyldithiocarbamate and 9.0 mL of pure water, and stirred for 3 hours under reflux. After removing the aqueous layer in the reaction liquid, the organic layer was washed twice with 10 mL of water, twice with 10 mL of a 3 weight (wt) % acetic acid aqueous solution, and twice with 10 mL of water, and poured into methanol to make polymer precipitate. After filtering the polymer, it was dried, and the obtained polymer was dissolved in toluene. The toluene solution was caused to pass through an alumina/silica gel column, and the obtained solution was poured into methanol to make polymer precipitate. After filtering the polymer, it was dried to obtain 236 mg of polymer compound M.

Molecular weights (in terms of polystyrene) of polymer compound M measured by GPC were 101,000 of weight average molecular weight (Mw) and 32,000 of number average molecular weight (Mn). Absorption edge wavelength of polymer compound M was 940 nm.

Example 26

Production of Organic Transistor

After ultrasonically washing a highly doped n-type silicon substrate having a heat oxidized film of 300 nm thick in acetone for 10 minutes, the substrate was irradiated with ozone UV for 20 minutes. Then, surface of the heat oxidized film was silane-finished by spin coating with β-phenethyltrichlorosilane diluted in a proportion of 5 drops (dropped with the use of a syringe) per 10 mL of toluene.

Then polymer compound H was dissolved in orthodichlorobenzene, and a solution containing polymer compound H at a concentration of 0.5% by weight was prepared, and the solution was filtered through a membrane filter, to prepare a coating liquid. The coating liquid was applied on the above surface-finished substrate by a spin coating method, to form a coating film of polymer compound H. Thickness of the coating film was about 30 nm. By further heating the coating film in a nitrogen atmosphere at 170° C. for 30 minutes, an organic semiconductor thin film of polymer compound H was formed.

Further, by a vacuum vapor deposition method using a metal mask, a source electrode and a drain electrode having a laminate structure of molybdenum trioxide and gold from the organic semiconductor thin film side were fabricated to produce an organic transistor.

Example 27

Evaluation of Organic Transistor

Electric characteristics of the organic transistor were measured using a semiconductor parameter 4200 (manufacture by KEITHLEY). As a result, the change curve of drain current (Id) to drain voltage (Vd) was excellent, and when the negative voltage applied to the gate electrode was increased, the negative drain current also increased, revealing that the organic transistor was a p-type organic transistor. Field effect mobility μ of carrier in the organic transistor was calculated using the following formula (a) representing drain current Id in a saturated area of electric characteristics of organic transistor.

$$Id = (W/2L)\mu Ci(Vg-Vt)^2 \qquad (a)$$

(wherein, L represents channel length of organic transistor, W represents channel width of organic transistor, Ci represents capacity per unit area of gate insulating film, Vg represents gate voltage, and Vt represents a threshold voltage of gate voltage.)

As a result, field effect mobility of carrier (carrier mobility) was 0.03 cm$^2$/Vs, and ON/OFF current ratio was 10$^5$. The result is shown in Table 2.

Example 28

An organic transistor device was produced in a similar manner to Example 26 except that polymer compound I was used in place of polymer compound H, and transistor characteristics were evaluated in a similar manner to that in Example 27.

Carrier mobility was 0.07 cm$^2$/Vs, and ON/OFF current ratio was 10$^6$. The result is shown in Table 2.

Example 29

An organic transistor device was produced in a similar manner to Example 26 except that polymer compound J was used in place of polymer compound H, and transistor characteristics were evaluated in a similar manner to that in Example 27.

Carrier mobility was 0.06 cm$^2$/Vs, and ON/OFF current ratio was 10$^6$. The result is shown in Table 2.

Example 30

An organic transistor device was produced in a similar manner to Example 26 except that polymer compound K was used in place of polymer compound H, and transistor characteristics were evaluated in a similar manner to that in Example 27.

Carrier mobility was 0.13 cm$^2$/Vs, and ON/OFF current ratio was 10$^6$. The result is shown in Table 2.

Example 31

An organic transistor device was produced in a similar manner to Example 26 except that polymer compound L was used in place of polymer compound H, and transistor characteristics were evaluated in a similar manner to that in Example 27.

Carrier mobility was 0.25 cm$^2$/Vs, and ON/OFF current ratio was 10$^6$. The result is shown in Table 2.

Example 32

An organic transistor device was produced in a similar manner to Example 26 except that polymer compound M was used in place of polymer compound H, and transistor characteristics were evaluated in a similar manner to that in Example 27.

Carrier mobility was 0.12 cm$^2$/Vs, and ON/OFF current ratio was 10$^6$. The result is shown in Table 2.

TABLE 2

Evaluation result of organic transistor device

| | | Carrier mobility (cm$^2$/Vs) | ON/OFF ratio |
|---|---|---|---|
| Example 27 | Polymer compound H | 0.03 | 10$^5$ |
| Example 28 | Polymer compound I | 0.07 | 10$^6$ |
| Example 29 | Polymer compound J | 0.06 | 10$^6$ |
| Example 30 | Polymer compound K | 0.13 | 10$^6$ |
| Example 31 | Polymer compound L | 0.25 | 10$^6$ |
| Example 32 | Polymer compound M | 0.12 | 10$^6$ |

Example 33

Production and Evaluation of Ink and Organic Thin Film Solar Cell

A glass substrate with a 150 nm-thick ITO film formed by sputtering was surface-finished by an ozone UV treatment. Then polymer compound H and fullerene C60PCBM (phenyl C61-methyl butyrate ester) (phenyl C61-butyric acid methyl ester, manufacture by Frontier Carbon Corporation) were dissolved in ortho dichlorobenzene so that a weight ratio of 060PCBM to polymer compound H was 3, to produce ink 2. A total of the weight of polymer compound H and the weight of C60PCBM was 2.0% by weight based on the weight of ink 2. Ink 2 was applied on the glass substrate by spin coating, to produce an organic film containing polymer compound H. Film thickness was about 100 nm. Optical absorption edge wavelength of the organic film thus produced was 940 nm. Then on the organic film, lithium fluoride was vapor-deposited into a thickness of 2 nm by a vacuum vapor deposition machine, and then Al was vapor-deposited into a thickness of 100 nm, to produce an organic thin film solar cell. The shape of the obtained organic thin film solar cell was a 2 mm×2 mm square. The obtained organic thin film solar cell was irradiated with constant light using a solar simulator (manufacture by BUNKOUKEIKI, product name OTENTO-SUNII: AM1.5G filter, radiation illuminance 100 mW/cm$^2$), and generated current and volt age were measured, and photoelectric conversion efficiency, short-circuit current density, open end voltage, and fill factor were determined. Jsc (short-circuit current density) was 11.20 mA/cm$^2$, Voc (open end voltage) was 0.62 V, ff (fill factor) was 0.67, and photoelectric conversion efficiency ($\eta$) was 4.63%. The result is shown in Table 3.

Example 34

Ink and an organic thin film solar cell were produced and evaluated in similar manners to those in Example 33 except that polymer compound I was used in place of polymer compound H. Jsc (short-circuit current density) was 5.00 mA/cm$^2$, Voc (open end voltage) was 0.69V, ff (fill factor) was 0.56, and photoelectric conversion efficiency ($\eta$) was 1.96%. The result is shown in Table 3.

Example 35

Ink and an organic thin film solar cell were produced and evaluated in similar manners to those in Example 33 except that polymer compound K was used in place of polymer compound H. Jsc (short-circuit current density) was 6.67 mA/cm$^2$, Voc (open end voltage) was 0.71V, ff (fill factor) was 0.66, and photoelectric conversion efficiency ($\eta$) was 3.11%. The result is shown in Table 3.

Example 36

Ink and an organic thin film solar cell were produced and evaluated in similar manners to those in Example 33 except that polymer compound L was used in place of polymer compound H. Jsc (short-circuit current density) was 10.73 mA/cm$^2$, Voc (open end voltage) was 0.58V, ff (fill factor) was 0.65, and photoelectric conversion efficiency ($\eta$) was 4.02%. The result is shown in Table 3.

TABLE 3

Evaluation result of photoelectric conversion device

| | Short-circuit current density (mA/cm$^2$) | Open end voltage (V) | Fill factor | Photo-electric conversion efficiency (%) |
|---|---|---|---|---|
| Example 33 Polymer compound H | 11.20 | 0.62 | 0.67 | 4.63 |
| Example 34 Polymer compound I | 5.00 | 0.69 | 0.56 | 1.96 |
| Example 35 Polymer compound K | 6.67 | 0.71 | 0.66 | 3.11 |
| Example 36 Polymer compound L | 10.73 | 0.58 | 0.65 | 4.02 |

Example 37

Synthesis of Polymer Compound N

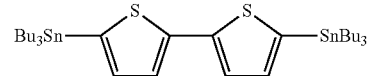

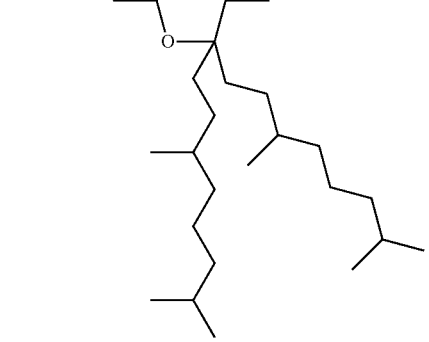

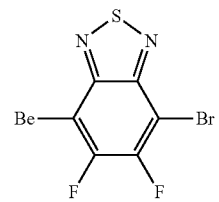

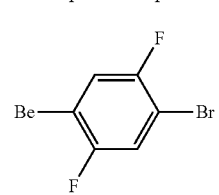

In a 100 mL flask containing argon replacing for the interior gas, 500 mg (0.475 mmol) of compound 7, 123 mg (0.373 mmol) of compound 9, 24 mg (0.088 mmol) of compound 42, and 32 mL toluene to give a uniform solution. The obtained toluene solution was bubbled with argon for 30 minutes. Then the toluene solution was added with 6.33 mg (0.007 mmol) of tris(dibenzylideneacetone)dipalladium and 12.6 mg of tris(2-toluoyl)phosphine, and stirred at 100° C. for 6 hours. Then the reaction liquid was added with 500 mg of phenyl bromide, and further stirred for 5 hours. Then the flask was cooled to 25° C., and the reaction liquid was poured into 300 mL of methanol. The precipitated polymer was collected by filtration, and the obtained polymer was put into cylindrical filter paper, and extracted with methanol, acetone and hexane for respectively 5 hours by using a Soxhlet extraction apparatus. The polymer remaining in the cylindrical filter paper was dissolved in 100 mL of o-dichlorobenzene, and added with 2 g of sodium diethyldithiocarbamate and 40 mL of water, and stirred for 8 hours under reflux. After removing the aqueous layer, the organic layer was washed twice with 50 mL of water, then washed twice with 50 mL of 3 wt % acetic acid aqueous solution, then washed twice with 50 mL of water, then washed twice with 50 mL of water, and the obtained solution was poured into methanol to make polymer precipitate. After filtering the polymer, it was dried, and the obtained polymer was redissolved in 30 mL of o-dichlorobenzene, and caused to pass through an alumina/silica gel column. The obtained solution was poured into methanol to make polymer precipitate, and the polymer was filtered and dried, to obtain 40 mg of purified polymer. In the following, this polymer is called polymer compound N.

Example 38

Synthesis of Polymer Compound P 62 mg of polymer was obtained in a similar manner to Example 37 except that 500 mg (0.475 mmol) of compound 7, 101 mg (0.306 mmol) of compound 9, and 45 mg (0.166 mmol) of compound 42 were used. This polymer is called polymer compound P.

Example 39

Production and Evaluation of Ink and Organic Thin Film Solar Cell

Ink and an organic thin film solar cell were produced and evaluated in similar manners to those in Example 33 except that polymer compound N was used in place of polymer compound H. Jsc (short-circuit current density) was 12.64 mA/cm$^2$, Voc (open end voltage) was 0.58V, ff (fill factor) was 0.61, and photoelectric conversion efficiency ($\eta$) was 5.74%.

Example 40

Production and Evaluation of Ink and Organic Thin Film Solar Cell

Ink and an organic thin film solar cell were produced and evaluated in similar manners to those in Example 33 except that polymer compound P was used in place of polymer compound H. Jsc (short-circuit current density) was 11.30 mA/cm$^2$, Voc (open end voltage) was 0.76V, ff (fill factor) was 0.62, and photoelectric conversion efficiency ($\eta$) was 5.28%%.

Reference Example 24

Synthesis of Compound 43

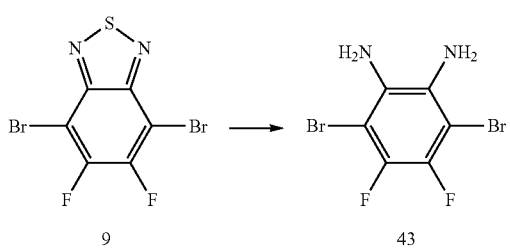 [SMILES: Fc1c(F)c(Br)c2nsnc2c1Br ; Nc1c(N)c(Br)c(F)c(F)c1Br]

In a 200 mL three-necked flask containing argon replacing for the interior gas, 5.00 g (15.2 mmol) of compound 9, 991 mg (152 mmol) of powder zinc, 60 mL of acetic acid, and 30 mL of water were added, and stirred at 80° C. for 2 hours. After stirring, the reaction liquid was cooled to room temperature, and filtered using Cellite as a filter aid. The filtrate was neutralized with sodium bicarbonate, and the precipitated solid was filtered and collected. The obtained solid was suspended in chloroform, and an insoluble substance was filtered off through a polytetrafluoroethylene filter having a pore size of 0.45 and the solvent of the filtrate was distilled off by an evaporator, to obtain 2.86 g of compound 43 as a pale brown solid.

Example 41

Synthesis of Compound 44

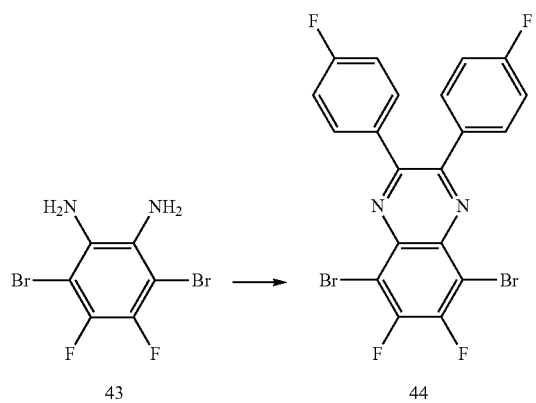 [SMILES: Nc1c(N)c(Br)c(F)c(F)c1Br ; Fc1ccc(-c2nc3c(Br)c(F)c(F)c(Br)c3nc2-c2ccc(F)cc2)cc1]

In a 100 mL three-necked flask containing argon replacing for the interior gas, 816 mg of 4,4'-difluorobenzyl, 1000 mg of compound 43, and 25 mL of ethanol were added, and stirred at a temperature at which ethanol is refluxed for 40 hours. The reaction liquid was cooled to room temperature, and the solvent was distilled off. The precipitated solid was eluted by a silica gel column using a mixed solvent of hexane and ethyl acetate mixed so that a ratio of volume of hexane to volume of ethyl acetate was 5, as a developing solvent. The eluate was dried to solid by an evaporator, to obtain 2.32 g of a crude product. Then, the crude product was recrystallized by using 80 mL of 2-propanol, to obtain 816 mg of compound 44.

$^1$H NMR in CDCl$_3$ (ppm): 7.64 (t, 4H), 7.09 (t, 4H)
$^{19}$F NMR in CDCl$_3$ (ppm): −110.5, −118.7

Example 42

Synthesis of Polymer Compound Q

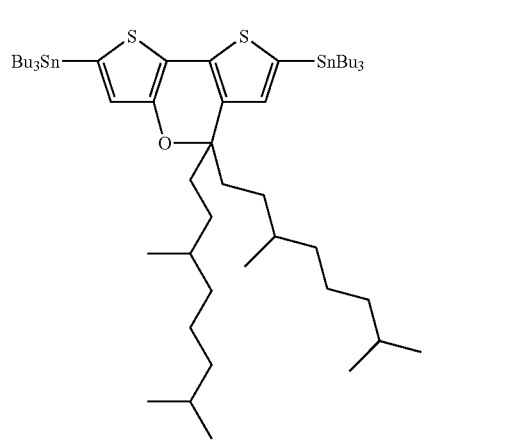

-continued

44

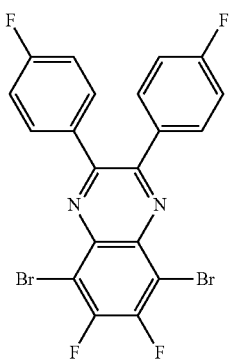

In a 100 mL flask containing argon replacing for the interior gas, 300 mg (0.285 mmol) of compound 7, 145 mg (0.283 mmol) of compound 44, and 23 mL of toluene were added to give a uniform solution. The obtained toluene solution was bubbled with argon for 30 minutes. Then the toluene solution was added with 3.89 mg (0.0042 mmol) of tris(dibenzylideneacetone)dipalladium and 7.76 mg (0.025 mmol) of tris(2-toluoyl)phosphine, and stirred at 100° C. for 6 hours. Then the reaction liquid was added with 100 mg of phenyl bromide, and further stirred for 5 hours. Then the flask was cooled to 25° C., and the reaction liquid was poured into 200 mL of methanol. The precipitated polymer was collected by filtration, and the obtained polymer was put into cylindrical filter paper, and extracted with methanol, acetone and hexane for respectively 5 hours by using a Soxhlet extraction apparatus. The polymer remaining in the cylindrical filter paper was dissolved in 12 mL of o-dichlorobenzene, and added with 2 g of sodium diethyldithiocarbamate and 40 mL of water, and stirred for 8 hours under reflux. After removing the aqueous layer, the organic layer was washed twice with 50 mL of water, then washed twice with 50 mL of 3 wt % acetic acid aqueous solution, then washed twice with 50 mL of water, then washed twice with 50 mL of water, and the obtained solution was poured into methanol to make polymer precipitate. After filtering the polymer, it was dried, and the obtained polymer was redissolved in 12 mL of o-dichlorobenzene, and caused to pass through an alumina/silica gel column. The obtained solution was poured into methanol to make polymer precipitate, and the polymer was filtered and dried, to obtain 159 mg of purified polymer. In the following, this polymer is called polymer compound Q.

Example 43

Production and Evaluation of Ink and Organic Thin Film Solar Cell

Ink and an organic thin film solar cell were produced and evaluated in similar manners to those in Example 33 except that polymer compound Q was used in place of polymer compound H. Jsc (short-circuit current density) was 5.20 mA/cm², Voc (open end voltage) was 0.90 V, ff (fill factor) was 0.40, and photoelectric conversion efficiency (η) was 1.84%.

Example 44

Synthesis of Polymer Compound R

7

9

44

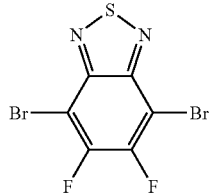

In a 100 mL flask containing argon replacing for the interior gas, 208.3 mg (0.198 mmol) of compound 7, 52.1 mg (0.158 mmol) of compound 9, 20 mg (0.039 mmol) of compound 44, and 14 mL of toluene were added to give a uniform solution. The obtained toluene solution was bubbled with argon for 30 minutes. Then the toluene solution was added with 2.70 mg (0.00295 mmol) of tris(dibenzylideneacetone)dipalladium and 5.40 mg (0.0177 mmol) of tris(2-toluoyl)phosphine, and stirred at 100° C. for 6 hours. Then the reaction liquid was added with 100 mg of phenyl bromide, and further stirred for 5 hours. Then the flask was cooled to 25° C., and the reaction liquid was poured into 200 mL of methanol. The precipitated polymer was collected by filtration, and the obtained polymer was put into cylindrical filter paper, and extracted with methanol, acetone and hexane for respectively 5 hours by using a Soxhlet extraction apparatus. The polymer remaining in the cylindrical filter paper was dissolved in 10 mL of o-dichlorobenzene, and added with 0.5 g of sodium diethyldithiocarbamate and 20 mL of water, and stirred for 8 hours under reflux. After removing the aqueous layer, the organic layer was washed twice with 50 mL of water, then washed twice with 50 mL of 3 wt % acetic acid aqueous solution, then washed twice with 50 mL of water, then washed twice with 50 mL of water, and the obtained solution was poured into methanol to make polymer precipitate. After filtering the polymer, it was dried, and the obtained polymer was redissolved in 10 mL of o-dichlorobenzene, and caused to pass through an alumina/silica gel column. The obtained solution was poured into methanol to make polymer precipitate, and the polymer was filtered and dried, to obtain 75 mg of purified polymer. In the following, this polymer is called polymer compound R.

Example 45

Production and Evaluation of Ink and Organic Thin Film Solar Cell

Ink and an organic thin film solar cell were produced and evaluated in similar manners to those in Example 33 except that polymer compound R was used in place of polymer compound H. Jsc (short-circuit current density) was 8.84 mA/cm$^2$, Voc (open end voltage) was 0.75V, ff (fill factor) was 0.48, and photoelectric conversion efficiency ($\eta$) was 3.15%.

Example 46

Synthesis of Compound 46

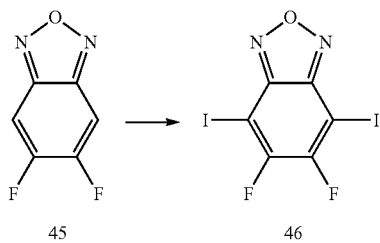 [SMILES: Fc1cc2nonc2cc1F ; Fc1c(F)c(I)c2nonc2c1I]

In a 200 mL flask, 2.00 g of compound 45 (manufacture by CHEMSTEP), 5.00 g of iodine, and 20 mL of fuming sulfuric acid containing 30% by weight of sulfur trioxide, to give a uniform solution. The obtained solution was dipped in an oil bath at 60° C. and stirred for 12 hours under heating. Thereafter, the reaction liquid was cooled to 25° C., and gradually poured into 1 Kg of crushed ice. The obtained suspension was added with 100 mL of chloroform, and the chloroform layer was separated by a separating funnel and collected. The obtained chloroform layer was dried over sodium sulfate, and filtered. The obtained filtrate was concentrated by an evaporator. The obtained crude product was purified by chromatography equipped with a silica gel column using a mixed solvent of hexane and ethyl acetate mixed so that a ratio of volume of hexane to volume of ethyl acetate was 4, as a developing solvent, to obtain 1.23 g of compound 46.

$^{19}$F NMR in CDCl$_3$ (ppm): −112.0

Example 47

Synthesis of Polymer Compound S

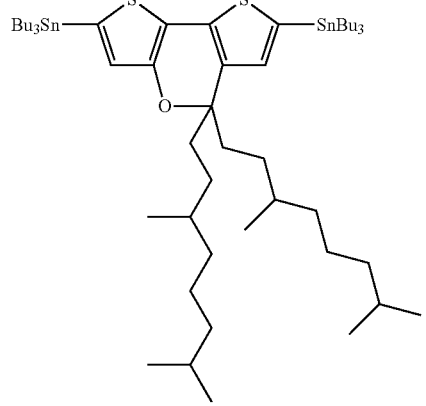

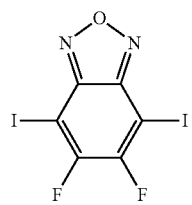

In a 100 mL flask containing argon replacing for the interior gas, 500 mg (0.475 mmol) of compound 7, 190 mg (0.466 mmol) of compound 46, and 36 mL of toluene were added, to give a uniform solution. The obtained toluene solution was bubbled with argon for 30 minutes. Then the toluene solution was added with 6.40 mg (0.00700 mmol) of tris(dibenzylideneacetone)dipalladium and 12.8 mg (0.042 mmol) of tris(2-toluoyl)phosphine, and stirred at 100° C. for 18 hours. Thereafter, the reaction liquid was added with 68 mg of phenyl bromide, and stirred for another 5 hours. Then the flask was cooled to 25° C., and the reaction liquid was poured into 500 mL of methanol. The precipitated polymer was collected by filtration, and the obtained polymer was put into cylindrical filter paper, and extracted with methanol, acetone and hexane for respectively 5 hours by using a Soxhlet extraction apparatus. The polymer remaining in the cylindrical filter paper was dissolved in 34 mL of o-dichlorobenzene, and added with 0.4 g of sodium diethyldithiocarbamate and 50 mL of water, and stirred for 8 hours under reflux. After removing the aqueous layer, the organic layer was washed twice with 100 mL of water, then washed twice with 100 mL of 3 wt % acetic acid aqueous solution, then washed twice with 100 mL of water, then washed twice with 100 mL of water, and the obtained solution was poured into methanol to make polymer precipitate. After filtering the polymer, it was dried, and the obtained polymer was redissolved in 34 mL of o-dichlorobenzene, and caused to pass through an alumina/silica gel column. The obtained solution was poured into methanol to make polymer precipitate, and the polymer was filtered and dried, to obtain 52 mg of purified polymer. In the following, this polymer is called polymer compound S.

Example 48

Production and Evaluation of Ink and Organic Thin Film Solar Cell

Ink and an organic thin film solar cell were produced and evaluated in similar manners to those in Example 33 except that polymer compound S was used in place of polymer compound H. Jsc (short-circuit current density) was 3.20 mA/cm$^2$, Voc (open end voltage) was 0.87 V, ff (fill factor) was 0.45, and photoelectric conversion efficiency ($\eta$) was 1.25%.

Reference Example 25

Synthesis of Compound 48

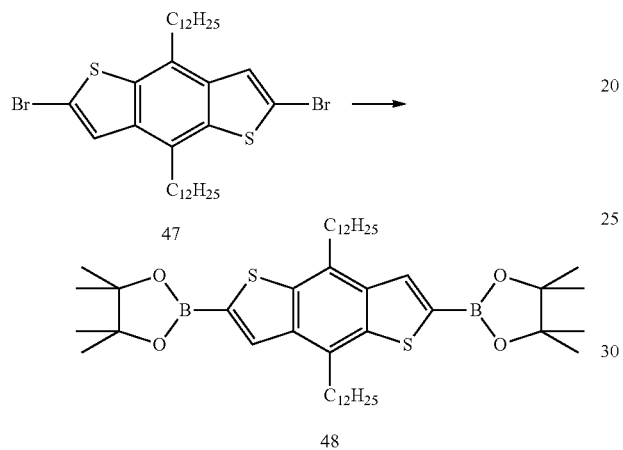

In a four-necked flask, 6.847 g (10.00 mmol) of compound 47, 10.16 g (40.00 mmol) of bis(pinacolato)diboron, and 150 mL of dioxane were added, and bubbled with argon at room temperature (25° C.) for 30 minutes. Then the reaction liquid was added with 408.3 mg of diphenylphosphinoferrocene palladium dichloride, 277.2 mg of diphenylphosphinoferrocene and 3.926 g (40.00 mmol) of potassium acetate, and then refluxed for 10 minutes under heating. After reaction, the reaction liquid was analyzed by high performance liquid chromatography (HPLC), and disappearance of starting materials was confirmed.

Then a base that is difficult to be dissolved in the reaction liquid was separated by using a filter. Then the solution was dried for about 30 minutes by an evaporator, to remove dioxane. Then the reaction product was separated by a column using hexane as a developing solvent, and the component obtained by separation was washed with methanol for 3 hours, to obtain pale brown powder. The powder was dissolved in 100 mL of hexane, and added with 100 mL of ethanol and left still to allow recrystallization, to obtain 1.386 g of compound 48.

$^1$H-NMR (CDCl$_3$, $\delta$ (ppm)): 0.880 (t, 6H), 1.261 (m, 36H), 1.409 (m, 24H), 1.793 (m, 4H), 3.208 (t, 4H), 8.022 (s, 2H)

Example 49

Synthesis of Polymer Compound T

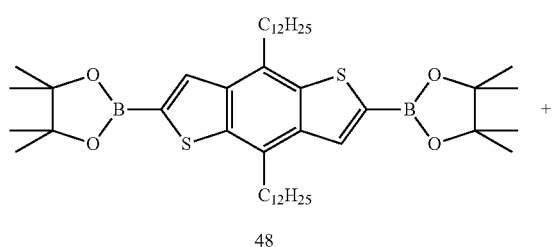

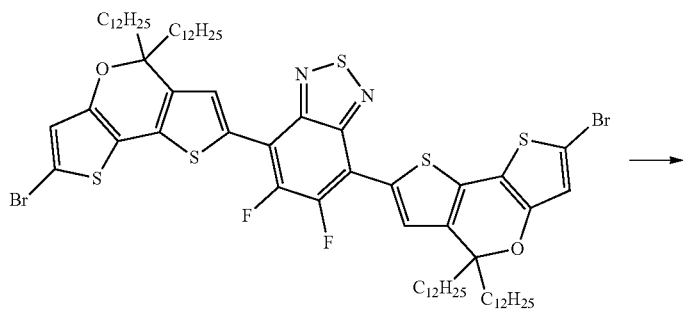

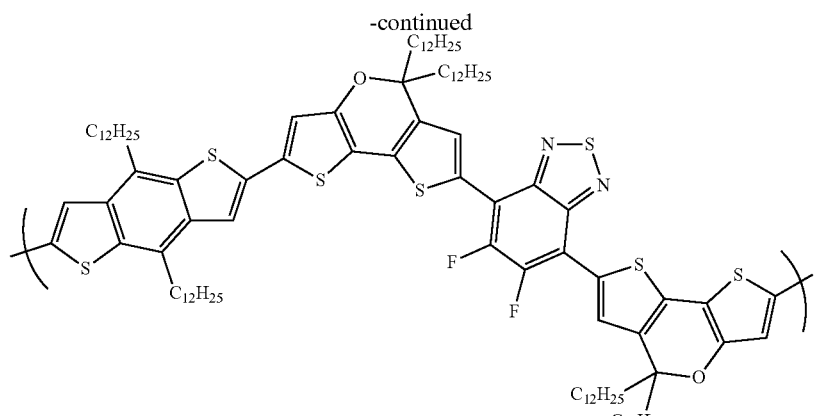

Polymer compound T

In a four-necked flask, 138.8 mg (0.100 mmol) of compound 31 and 7 mL of tetrahydrofuran were added, and bubbled with argon at room temperature (25° C.) for 30 minutes. Then the reaction solution was added with 1.83 mg (0.002 mmol) of tris(dibenzylideneacetone)palladium, 2.32 mg (0.008 mmol) of [tri(ter-butyl)phosphonium]tetrafluoroborate, and 0.5 g (1.0 mmol) of a 2 mol/L potassium phosphate aqueous solution. While the reaction solution was stirred in the condition that the temperature of the oil bath was 40° C., a solution dissolving 77.9 mg of compound 48 (0.100 mmol) in 3 mL of tetrahydrofuran was added dropwise over 10 minutes, and stirred for 30 minutes. Then the reaction solution was added with 10.0 mg (0.082 mmol) of phenylboric acid, and stirred for another 1 hour, and then the reaction was stopped. The reaction was conducted in an argon atmosphere.

Then the reaction solution was added with 0.8 g of sodium diethyldithiocarbamate and 7.5 mL of pure water, and stirred for 3 hours under reflux. After removing the aqueous layer in the reaction liquid, the organic layer was washed twice with 10 mL of water, and twice with 10 mL of a 3 weight (wt) % acetic acid aqueous solution, and further filtered, and dried, and the obtained polymer was dissolved in toluene. The toluene solution was caused to pass through alumina/silica gel column, and the obtained solution was poured into methanol to make polymer precipitate. After filtering the polymer, it was dried, to obtain 160 mg of polymer compound T.

Molecular weights (in terms of polystyrene) of polymer compound T measured by GPC were 125,000 of weight average molecular weight (Mw) and 41,000 of number average molecular weight (Mn). Absorption edge wavelength of polymer compound T was 800 nm.

Example 50

Synthesis of Polymer Compound U

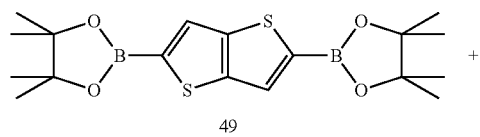

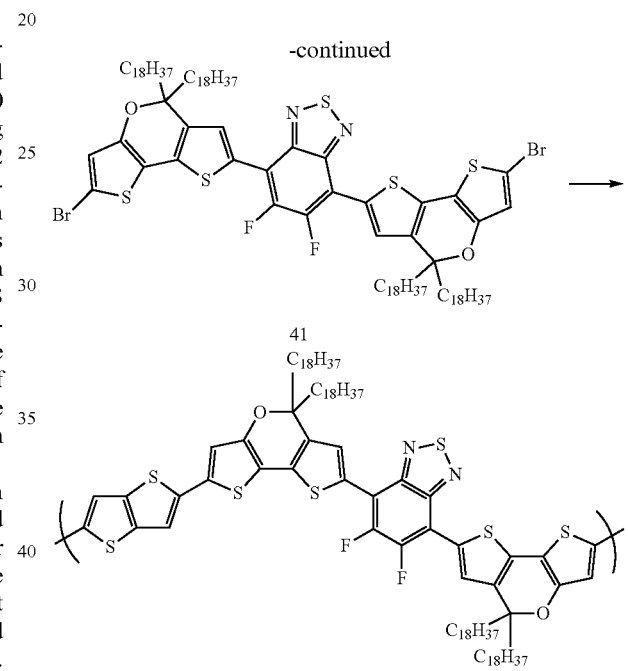

Polymer compound U

In a four-necked flask, 172.4 mg (0.100 mmol) of compound 41 and 7 mL of tetrahydrofuran were added, and bubbled with argon at room temperature (25° C.) for 30 minutes. Then the reaction solution was added with 1.83 mg (0.002 mmol) of tris(dibenzylideneacetone)palladium, 2.32 mg (0.008 mmol) of [tri(ter-butyl)'phosphonium]tetrafluoroborate, and 0.5 g (1.0 mmol) of a 2 mol/L potassium phosphate aqueous solution. While the reaction solution was stirred in the condition that the temperature of the oil bath was 40° C., a solution dissolving 39.2 mg of compound 49 (0.100 mmol) in 3 mL of tetrahydrofuran was added dropwise over 10 minutes, and stirred for 30 minutes. Compound 49 was synthesized by a method described in Tetrahedron, 2005, Vol. 61, pp. 1699. Then the reaction solution was added with 10.0 mg (0.082 mmol) of phenylboric acid, and stirred for another 1 hour, and then the reaction was stopped. The reaction was conducted in an argon atmosphere.

Then the reaction solution was added with 0.8 g of sodium diethyldithiocarbamate and 7.5 mL of pure water, and stirred for 3 hours under reflux. After removing the aqueous layer in the reaction liquid, the organic layer was washed twice with 10 mL of water, twice with 10 mL of a 3 weight (wt) % acetic acid aqueous solution, and twice with 10 mL of water, and poured into methanol to make polymer precipitate. After filtering the polymer, it was dried, and the obtained polymer was dissolved in toluene. The toluene solution was caused to pass through alumina/silica gel column, and the obtained solution was poured into methanol to make polymer precipitate. After filtering the polymer, it was dried, to obtain 150 mg of polymer compound U.

Molecular weights (in terms of polystyrene) of polymer compound U measured by GPC were 226,000 of weight average molecular weight (Mw) and 52,000 of number average molecular weight (Mn). Absorption edge wavelength of polymer compound U was 840 nm.

Example 51

Synthesis of Polymer Compound V mg (0.008 mmol) of [tri(ter-butyl)phosphonium]tetrafluoroborate, and 0.5 g (1.0 mmol) of a 2 mol/L potassium phosphate aqueous solution. While the reaction solution was stirred in the condition that the temperature of the oil bath was 40° C., a solution dissolving 41.8 mg of compound 50 (0.100 mmol) in 3 mL of tetrahydrofuran was added dropwise over 10 minutes, and stirred for 30 minutes. Then the reaction solution was added with 10.0 mg (0.082 mmol) of phenylboric acid, and stirred for another 1 hour, and then the reaction was stopped. The reaction was conducted in an argon atmosphere.

Then the reaction solution was added with 0.8 g of sodium diethyldithiocarbamate and 7.5 mL of pure water, and stirred for 3 hours under reflux. After removing the aqueous layer in the reaction liquid, the organic layer was washed twice with 10 mL of water, twice with 10 mL of a 3 weight (wt) % acetic acid aqueous solution, and twice with 10 mL of water, and poured into methanol to make polymer precipitate. After filtering the polymer, it was dried, and the

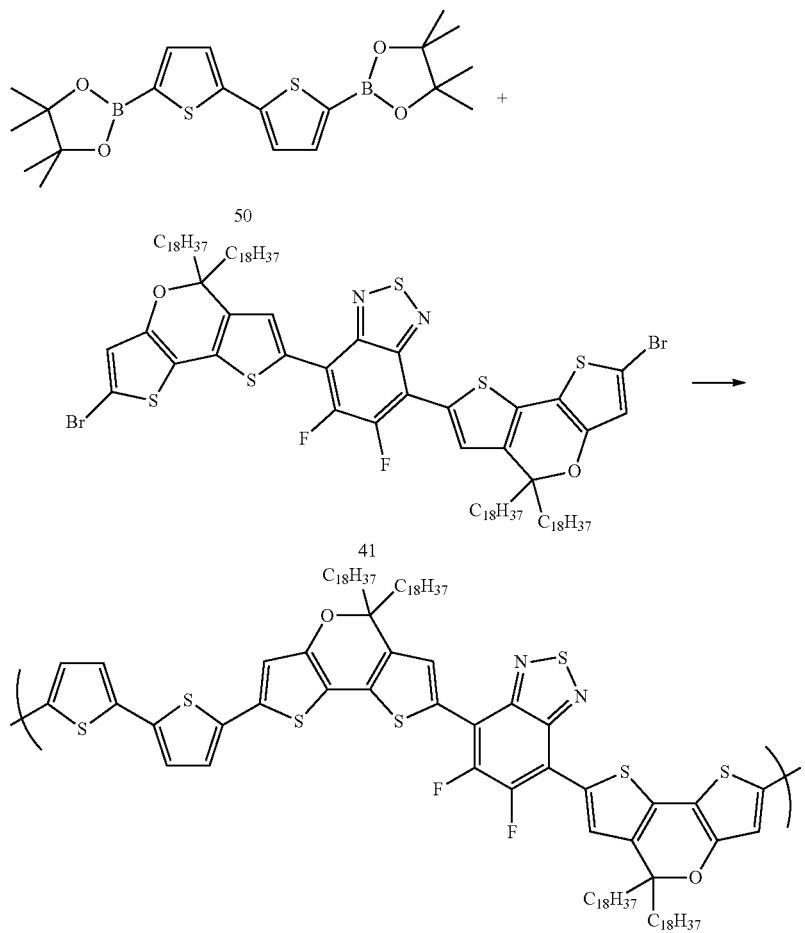

Polymer compound V

In a four-necked flask, 172.4 mg (0.100 mmol) of compound 41 and 7 mL of tetrahydrofuran were added, and bubbled with argon at room temperature (25° C.) for 30 minutes. Then the reaction solution was added with 1.83 mg (0.002 mmol) of tris(dibenzylideneacetone)palladium, 2.32 obtained polymer was dissolved in toluene. The toluene solution was caused to pass through alumina/silica gel column, and the obtained solution was poured into methanol to make polymer precipitate. After filtering the polymer, it was dried, to obtain 130 mg of polymer compound V.

Molecular weights (in terms of polystyrene) of polymer compound V measured by GPC were 42,000 of weight average molecular weight (Mw) and 18,000 of number average molecular weight (Mn). Absorption edge wavelength of polymer compound V was 830 nm.

Example 52

Production and Evaluation of Organic Transistor

An organic transistor device was produced in a similar manner to Example 26 except that polymer compound T was used in place of polymer compound H, and transistor characteristics were evaluated in a similar manner to that in Example 27.
Carrier mobility was $1.2\times10^{-2}$ cm$^2$/Vs, and ON/OFF current ratio was $10^5$. The result is shown in Table 4.

Example 53

Production and Evaluation of Organic Transistor

An organic transistor device was produced in a similar manner to Example 26 except that polymer compound U was used in place of polymer compound H, and transistor characteristics were evaluated in a similar manner to that in Example 27. Carrier mobility was 0.35 cm$^2$/Vs, and ON/OFF current ratio was $10^7$. The result is shown in Table 4.

Example 54

Production and Evaluation of Organic Transistor

An organic transistor device was produced in a similar manner to Example 26 except that polymer compound V was used in place of polymer compound H, and transistor characteristics were evaluated in a similar manner to that in Example 27. Carrier mobility was 0.20 cm$^2$/Vs, and ON/OFF current ratio was $10^7$. The result is shown in Table 4.

TABLE 4

Evaluation result of organic transistor device

|  |  | Carrier mobility (cm$^2$/Vs) | ON/OFF ratio |
|---|---|---|---|
| Example 52 | Polymer compound T | $1.2 \times 10^{-2}$ | $10^5$ |
| Example 53 | Polymer compound U | 0.35 | $10^7$ |
| Example 54 | Polymer compound V | 0.20 | $10^7$ |

Example 55

Production and Evaluation of Ink and Organic Thin Film Solar Cell

A glass substrate with a 150 nm-thick ITO film formed by sputtering was surface-finished by an ozone UV treatment. Then polymer compound U and fullerene C60PCBM (phenyl C61-methyl butyrate ester) (phenyl C61-butyric acid methyl ester, manufacture by Frontier Carbon Corporation) were dissolved in ortho dichlorobenzene so that a weight ratio of C60PCBM to polymer compound U was 3, to produce ink. A total of the weight of polymer compound U and the weight of C60PCBM was 2.0% by weight based on the weight of ink. Ink was applied on the glass substrate by spin coating, to produce an organic film containing polymer compound U. Film thickness was about 100 nm. Optical absorption edge wavelength of the organic film thus produced was 840 nm. Then on the organic film, lithium fluoride was vapor-deposited into a thickness of 2 nm by a vacuum vapor deposition machine, and then Al was vapor-deposited into a thickness of 100 nm, to produce an organic thin film solar cell. The shape of the obtained organic thin film solar cell was a 2 mm×2 mm square. The obtained organic thin film solar cell was irradiated with constant light using a solar simulator (manufacture by BUNKOUKEIKI, product name OTENTO-SUNII: AM1.5G filter, radiation illuminance 100 mW/cm$^2$), and generated current and voltage were measured, and photoelectric conversion efficiency, short-circuit current density, open end voltage, and fill factor were determined. Jsc (short-circuit current density) was 4.72 mA/cm$^2$, Voc (open end voltage) was 0.56 V, ff (fill factor) was 0.61, and photoelectric conversion efficiency (η) was 1.63%. The result is shown in Table 5.

TABLE 5

Evaluation result of organic transistor device

|  |  | Short-circuit current density (mA/cm$^2$) | Open end voltage (V) | Fill factor | Photoelectric conversion efficiency (%) |
|---|---|---|---|---|---|
| Example 55 | Polymer compound U | 4.72 | 0.56 | 0.61 | 1.63 |

Example 56

Synthesis of Compound 51

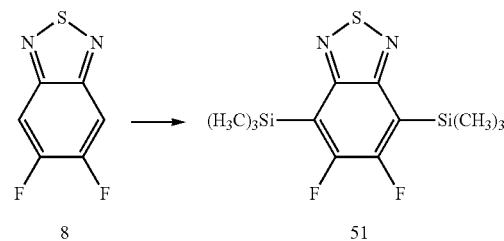

In a four-necked flask, 149.8 mg (1.480 mmol) of diisopropylamine and 10 mL of tetrahydrofuran were added, and bubbled with argon at room temperature (25° C.) for 30 minutes. Then the temperature in the reaction system was cooled to −78° C., and added with 0.82 mL of a hexane solution containing 1.62 mol/L n-butyllithium, and stirred for 20 minutes. The reaction solution was added with 102 mg (0.592 mmol) of compound 8 and stirred at −78° C. for 10 minutes. Then the reaction solution was added with 176.9 mg (1.628 mmol) of trimethylsilyl chloride and stirred at −78° C. for 30 minutes. After stirring, disappearance of starting materials was confirmed by liquid chromatography. The reaction solution was added with water and chloroform, and an organic layer was extracted, and the organic layer was purified by column chromatography using chloroform as a developing solvent. The purified organic layer was dried and the solvent was removed, to obtain 106 mg of compound 51.

$^1$H-NMR (CDCl$_3$, δ (ppm)): 1.45 (s, 24H)
$^{19}$F-NMR (CDCl$_3$, δ (ppm)): −117 (s, 2F)

INDUSTRIAL APPLICABILITY

A photoelectric conversion device having an organic layer containing a polymer compound of the present invention is very useful because it realizes high photoelectric conversion efficiency.

The invention claimed is:

1. A polymer compound having a structural unit represented by formula (1):

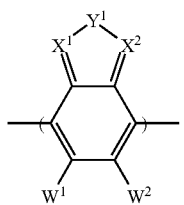

(1)

wherein $X^1$ and $X^2$ are the same or different and represent a nitrogen atom or =CH—; $Y^1$ represents a sulfur atom, an oxygen atom, a selenium atom, —N(R$^1$)— or —CR$^2$=CR$^3$—; $R^1$, $R^2$ and $R^3$ are the same or different and represent a hydrogen atom or a substituent; $W^1$ represents a cyano group, a monovalent organic group having a fluorine atom or a halogen atom; and $W^2$ represents a cyano group, a monovalent organic group having a fluorine atom, a halogen atom or a hydrogen atom;
and a structural unit represented by formula (D-1)

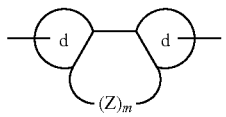

(D-1)

wherein ring d represents an aromatic heterocyclic ring; m represents an integer of 1 or more; Z represents a group represented by formula (z-3), (z-4), (z-5), (z-7) and (z-8); when there are a plurality of rings d, they may be the same or different; when there a plurality of Zs, they may be the same or different:

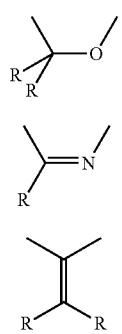

(z-3)

(z-4)

(z-5)

(z-7)

(z-8)

in formula (z-3), (z-4), (z-5), (z-7) and (z-8), R represents a hydrogen atom or a substituent; when there are a plurality of Rs, they may be the same or different; and Rs may bind to each other to aspect cyclic structure.

2. A photoelectric conversion device having a first electrode and a second electrode, and an active layer between the first electrode and the second electrode, and containing a polymer compound having a structural unit represented by formula (1):

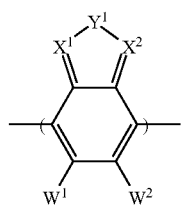

(1)

wherein $X^1$ and $X^2$ are the same or different and represent a nitrogen atom or =CH—; $Y^1$ represents a sulfur atom, an oxygen atom, a selenium atom, —N(R$^1$)— or —CR$^2$=CR$^3$—; $R^1$, $R^2$ and $R^3$ are the same or different and represent a hydrogen atom or a substituent; $W^1$ represents a fluorine atom; and $W^2$ represents a fluorine atom;
and a structural unit represented by formula (D-1)

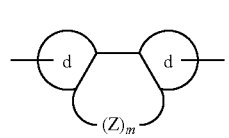

(D-1)

wherein ring d represents an aromatic heterocyclic ring; m represents an integer of 1 or more; Z represents a group represented by formula (z-1) to formula (z-8); when there are a plurality of rings d, they may be the same or different; when there a plurality of Zs, they may be the same or different:

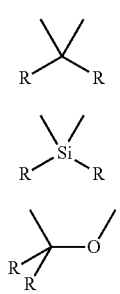

(z-1)

(z-2)

(z-3)

-continued (z-4) 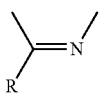

(z-5) 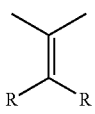

(z-6) 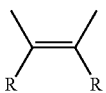

(z-7) 

(z-8) 

in formula (z-1) to formula (z-8), R represents a hydrogen atom or a substituent; when there are a plurality of Rs, they may be the same or different; and Rs may bind to each other to aspect cyclic structure.

3. The photoelectric conversion device according to claim 2, wherein the polymer is a π-conjugated polymer compound.

4. The photoelectric conversion device according to claim 2, wherein at least one of $X^1$ and $X^2$ is a nitrogen atom.

5. The photoelectric conversion device according to claim 4, wherein $X^1$ and $X^2$ are a nitrogen atom.

6. The photoelectric conversion device according to claim 4, wherein $Y^1$ is a sulfur atom or an oxygen atom.

7. The photoelectric conversion device according to claim 2, wherein the polymer includes a structural unit represented by formula (2):

$$-\!\!\!+\!\!Ar^1\!\!+\!\!- \tag{2}$$

wherein $Ar^1$ represents a bivalent aromatic group.

8. The photoelectric conversion device according to claim 7, wherein $Ar^1$ is a bivalent aromatic heterocyclic group.

9. The photoelectric conversion device according to claim 8, wherein the bivalent aromatic heterocyclic group is a group containing a thiophene ring.

* * * * *